United States Patent
Lee et al.

(10) Patent No.: US 9,318,379 B2
(45) Date of Patent: Apr. 19, 2016

(54) METHODS OF MANUFACTURING SEMICONDUCTOR DEVICES INCLUDING AIR GAP SPACERS

(71) Applicants: Eun-Ok Lee, Suwon-si (KR); Nam-Gun Kim, Suwon-si (KR); Gyuhwan Oh, Hwasung-si (KR); Heesook Park, Hwasung-si (KR); Hyun-Jung Lee, Suwon-si (KR); Kyungho Jang, Hwasung-si (KR)

(72) Inventors: Eun-Ok Lee, Suwon-si (KR); Nam-Gun Kim, Suwon-si (KR); Gyuhwan Oh, Hwasung-si (KR); Heesook Park, Hwasung-si (KR); Hyun-Jung Lee, Suwon-si (KR); Kyungho Jang, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/939,439

(22) Filed: Nov. 12, 2015

(65) Prior Publication Data
US 2016/0064270 A1    Mar. 3, 2016

Related U.S. Application Data

(63) Continuation of application No. 14/290,620, filed on May 29, 2014, now Pat. No. 9,214,382.

(30) Foreign Application Priority Data

Aug. 30, 2013  (KR) .......................... 10-2013-0104386

(51) Int. Cl.
*H01L 21/768*    (2006.01)

(52) U.S. Cl.
CPC ...... *H01L 21/7682* (2013.01); *H01L 21/76889* (2013.01); *H01L 21/76895* (2013.01)

(58) Field of Classification Search
None
See application file for complete search history.

(56) References Cited

U.S. PATENT DOCUMENTS

| | | | |
|---|---|---|---|
| 6,881,659 B2 | 4/2005 | Park et al. | |
| 7,704,851 B2 | 4/2010 | Kim | |
| 7,728,375 B2 | 6/2010 | Shin et al. | |
| 7,833,902 B2 * | 11/2010 | Lee | H01L 27/10888 257/755 |
| 8,106,435 B2 | 1/2012 | Kim | |
| 2006/0270151 A1 | 11/2006 | Lee | |
| 2012/0168899 A1 | 7/2012 | Kim et al. | |
| 2012/0276711 A1 | 11/2012 | Yoon et al. | |
| 2013/0292847 A1 * | 11/2013 | Choi | H01L 23/498 257/774 |
| 2014/0264729 A1 | 9/2014 | Lee et al. | |

FOREIGN PATENT DOCUMENTS

| | | |
|---|---|---|
| JP | 2006-344963 A | 12/2006 |
| KR | 10-2007-0015701 A | 2/2007 |
| KR | 10-2009-0070691 A | 7/2009 |

* cited by examiner

*Primary Examiner* — Yasser A Abdelaziez
(74) *Attorney, Agent, or Firm* — Myers Bigel & Sibley, P.A.

(57) ABSTRACT

A spacer covering a sidewall of a contact plug includes a relatively more damaged first portion and a relatively less damaged second portion. An interface of the first and second portions of the spacer is spaced apart from a metal silicide layer of the contact plug. Thus reliability of the semiconductor device may be improved. Related fabrication methods are also described.

14 Claims, 80 Drawing Sheets

METHODS OF MANUFACTURING SEMICONDUCTOR DEVICES INCLUDING AIR GAP SPACERS

CROSS-REFERENCE TO RELATED APPLICATIONS

This U.S. non-provisional patent application is a continuation of U.S. patent application Ser. No. 14/290,620, filed May 29, 2014, which itself claims priority under 35 U.S.C. §119 to Korean Patent Application No. 10-2013-0104386, filed on Aug. 30, 2013, in the Korean Intellectual Property Office, the disclosures of which are hereby incorporated by reference in their entireties.

BACKGROUND

The inventive concepts relate to semiconductor devices and methods of manufacturing the same and, more particularly, to semiconductor devices having air gaps and methods of manufacturing the same.

Semiconductor devices are widely used in an electronic industry because of their small size, multi-function and/or low manufacture costs. Semiconductor devices are categorized as semiconductor devices storing logic data, semiconductor logic devices processing operations of logical data, hybrid semiconductor devices having both the function of the semiconductor memory devices and the function of the semiconductor logic devices and/or other semiconductor devices.

Semiconductor devices may generally include vertically stacked patterns and contact plugs electrically connecting the stacked patterns to each other. As semiconductor devices have been highly integrated, a space between the patterns and/or a space between the pattern and the contact plug have been reduced. Thus, a parasitic capacitance between the patterns and/or between the pattern and the contact plug may be increased. The parasitic capacitance may cause performance deterioration (e.g., reduction of an operating speed) of semiconductor devices.

SUMMARY

Embodiments of the inventive concepts may provide semiconductor devices with improved reliability.

Embodiments of the inventive concepts may also provide methods of manufacturing a semiconductor device capable of preventing failures such as an open fail.

In one aspect, a semiconductor device includes: a line pattern disposed on a substrate; a contact plug adjacent to the line pattern; and a first spacer disposed between the line pattern and the contact plug. An air gap is provided between the line pattern and the first spacer, and the contact plug includes a metal silicide layer. As used herein, an air gap means a void that is not filled with solid material. It may be filled with a liquid and/or a gas such as air. The first spacer includes a first portion and a second portion disposed under the first portion. The second portion of the first spacer has a lateral surface roughness less than a lateral surface roughness of the first portion of the first spacer. An interface between the first portion and the second portion is spaced apart from the metal silicide layer.

In some embodiments, the semiconductor device may further include: a second spacer disposed between the first spacer and the contact plug. A bottom surface of the second spacer may be disposed at a substantially same level as the interface.

In some embodiments, the contact plug may further include: a poly-silicon pattern disposed under the metal silicide layer, and an edge portion of the poly-silicon pattern may extend to contact a sidewall of the second portion and the bottom surface of the second spacer.

In some embodiments, the semiconductor device may further include: a third spacer covering both a sidewall of the second spacer and an inner sidewall of the extending portion of the poly-silicon pattern.

In some embodiments, the semiconductor device may further include: a second spacer disposed between the air gap and the line pattern. The second spacer may have an L-shaped cross section.

In some embodiments, a sidewall of the contact plug may be exposed by the air gap under the second portion, and the metal silicide layer may be spaced apart from the air gap.

In some embodiments, the contact plug may further include: a diffusion barrier layer contacting the interface, a sidewall of the second portion and the metal silicide layer.

In some embodiments, a height difference between the interface and a top surface of the metal silicide layer may be in the range of about 50 Å to about 500 Å.

In some embodiments, the contact plug may further include: a poly-silicon pattern disposed under the metal silicide layer; and a metal-containing pattern disposed on the metal silicide layer. In this case, the semiconductor device may further include: a landing pad extending from a top end of the metal-containing pattern. A portion of the air gap may vertically overlap with the landing pad.

In some embodiments, the metal-containing pattern may be in contact with a sidewall of the first portion, a portion of a sidewall of the second portion and a lateral end of the interface.

In some embodiments, the semiconductor device may further include: an insulating layer overlapping with another portion of the air gap which does not overlap with the landing pad. The insulating layer may be in contact with a sidewall of the landing pad.

In some embodiments, the line pattern may include an interconnection pattern and a hardmask pattern which are sequentially stacked. A height difference between a top surface of the first spacer adjacent to the another portion of the air gap and a top surface of the hardmask pattern may be in the range of about 0 Å to about 500 Å.

In some embodiments, an etch byproduct and/or a natural oxide layer may remain on a lateral end of the interface. The etch byproduct may include a silicon-fluorine compound, a silicon-chlorine compound, a silicon-sulfur compound, and/or a silicon-sulfur-fluorine compound.

In some embodiments, the first portion may be spaced apart from the second portion at the interface, and the air gap may also exist between the first portion and the second portion.

In some embodiments, the contact plug may further include: a poly-silicon pattern disposed under the metal silicide layer; and a high-concentration dopant doped region disposed in an upper portion of the poly-silicon pattern, the high-concentration dopant doped region contacting the metal silicide layer. The high-concentration dopant doped region may be doped with dopants of the same conductivity type as dopants doped in the poly-silicon pattern, and a dopant concentration of the high-concentration dopant doped region may be higher than that of the poly-silicon pattern.

In some embodiments, the contact plug may include: a lower portion lower than the interface; and an upper portion higher than the interface, and a width of the lower portion of the contact plug may be greater than a width of the upper portion of the contact plug.

In another aspect, a method of manufacturing a semiconductor device includes: forming line patterns on a substrate; forming a sacrificial spacer and a first spacer that sequentially are on, and in some embodiments cover, a sidewall of each of the line patterns; forming a poly-silicon layer in, and in some embodiments filling, a space between line patterns; performing a first etching process on the poly-silicon layer to form a first-etched poly-silicon layer in, and in some embodiments partially filling, the space between the line patterns and to expose a first portion of the first spacer, the first spacer further including a second portion not exposed under the first portion; performing a second etching process on the first-etched poly-silicon layer to form a poly-silicon pattern between the line patterns; and forming a metal silicide layer on a top surface of the poly-silicon pattern. The metal silicide layer is formed to be spaced apart from an interface between the first portion and the second portion of the first spacer.

In some embodiments, the first etching process may be an anisotropic etching process and the second etching process may be an isotropic etching process, and a sidewall of the second portion may be partially exposed by the second etching process.

In some embodiments, the method may further include: forming a second spacer on, and in some embodiments covering, the first portion before performing the second etching process. At this time, the second etching process may be an anisotropic etching process. The second etching process may be performed using the second spacer as an etch mask, and the poly-silicon pattern may be formed on, and in some embodiments to cover, a sidewall of the second portion.

In some embodiments, a recess region may be formed in a top surface of the poly-silicon pattern, which is not covered by the second spacer. In this case, the method may further include: forming a third spacer on, and in some embodiments covering, a sidewall of the second spacer and an inner sidewall of the recess region before the formation of the metal silicide layer.

In some embodiments, the method may further include: removing the third spacer after the formation of the metal silicide layer.

In some embodiments, the method may further include: forming a second spacer on, and in some embodiments covering, the sidewall of each of the line patterns before the formation of the sacrificial spacer.

In some embodiments, the method may further include: forming a metal-containing layer in, and in some embodiments to fill, the space between the line patterns; and removing the sacrificial spacer to form an air gap.

In some embodiments, the metal-containing layer may be formed on, and in some embodiments to cover, the line patterns. In this case, the method may further include: etching the metal-containing layer to form a landing pad and to expose a top end of the sacrificial spacer before removing the sacrificial spacer.

In another aspect, a semiconductor device includes a region on a substrate, the region including a sidewall. A first spacer including an air gap is on the sidewall, the air gap having a first end adjacent the substrate and a second end remote from the substrate. A second spacer extends on the first spacer, the second spacer having a second end that is adjacent the second end of the air gap and a first end that is between the first end of the air gap and the second end of the air gap. A contact is on the first spacer, the contact having a first end adjacent the substrate and a second end that is between the first end of the second spacer and the first end of the air gap and is spaced apart from the first end of the second spacer.

In some embodiments, the semiconductor device further includes a metal silicide layer that extends on the second end of the contact.

In some embodiments, the metal silicide layer is spaced apart from the air gap throughout an extent thereof.

In yet other aspects, methods of manufacturing a semiconductor device include forming a region on a substrate, the region including a sidewall and forming a first spacer extending on the sidewall. The first spacer includes a sacrificial layer having a first end adjacent the substrate and a second end remote from the substrate. The method further includes forming a contact on the first spacer. The contact has a first end adjacent the substrate and a second end that is between the first and second ends of the first spacer. The method further includes forming a second spacer extending on the first spacer, the second spacer having a second end that is adjacent the second end of the first spacer and a first end that is adjacent the second end of the contact. The method further includes recessing the second end of the contact so that it is spaced farther apart from the first end of the second spacer and removing the sacrificial layer to create an air gap in the first spacer, the air gap having a first end adjacent the substrate and a second end remote from the substrate.

In some embodiments, the following is performed between the recessing and the removing: forming a metal silicide layer that extends on the second end of the contact.

In some embodiments, the metal silicide layer is spaced apart from the air gap throughout an extent thereof.

BRIEF DESCRIPTION OF THE DRAWINGS

The inventive concepts will become more apparent in view of the attached drawings and accompanying detailed description.

FIGS. 4A to 15A and 17A to 19A are plan views illustrating a method of manufacturing a semiconductor device according to some embodiments of the inventive concepts;

FIGS. 4B to 15B and 17B to 19B are cross-sectional views taken along lines A-A' of FIGS. 4A to 15A and 17A to 19A, respectively;

FIGS. 4C to 15C and 17C to 19C are cross-sectional views taken along lines B-B' of FIGS. 4A to 15A and 17A to 19A, respectively;

FIGS. 4D to 15D and 17D to 19D are cross-sectional views taken along lines C-C' of FIGS. 4A to 15A and 17A to 19A, respectively;

DETAILED DESCRIPTION OF THE EMBODIMENTS

Figure 1A:
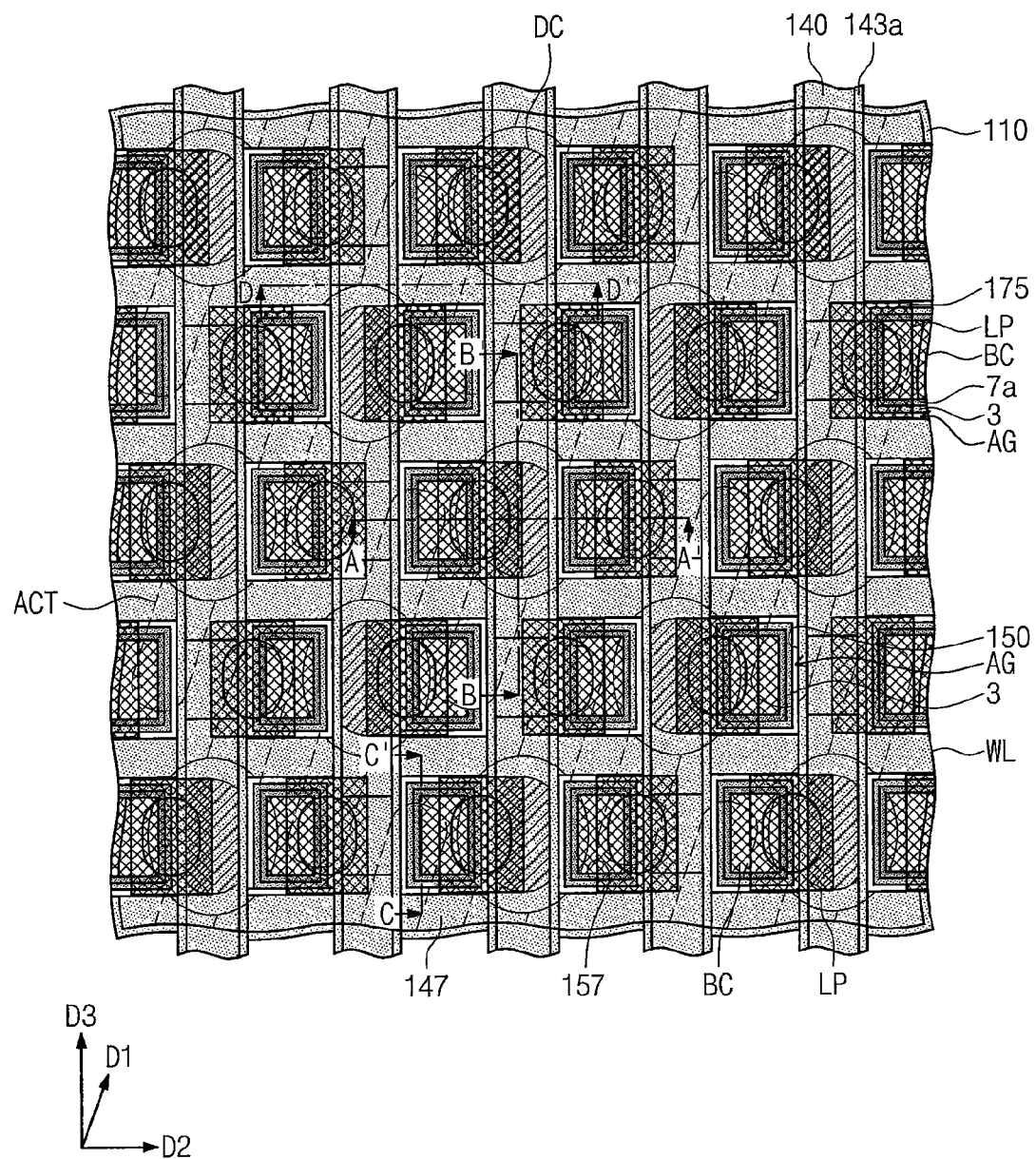
FIG. 1A is a plan view illustrating a semiconductor device according to a first embodiment of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" or extending "onto" another element, it can be directly on or extend directly onto the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Embodiments of aspects of the present inventive concepts explained and illustrated herein include their complementary counterparts. The same reference numerals or the same reference designators denote the same elements throughout the specification.

Moreover, various embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, the embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIG. 1A is a plan view illustrating a semiconductor device according to a first embodiment of the inventive concepts. FIGS. 1B, 1C, 1D, and 1E are cross-sectional views taken along lines A-A', B-B', C-C', and D-D', respectively. FIGS. 2A to 2E are enlarged views of a portion 'P1' of FIG. 1B according to embodiments of the inventive concepts.

Referring to FIGS. 1A, 1B, 1C, 1D, and 1E, device isolation patterns 102 are disposed on or in a semiconductor substrate 100 (hereinafter, referred to as 'a substrate') to define active portions ACT. Each of the active portions ACT may have an isolated shape when viewed from a plan view. Each of the active portions ACT may have an elongated bar-shape along a first direction D1 when viewed from a plan view. The active portions ACT may respectively correspond to portions of the substrate 100 surrounded by the device isolation patterns 102 when viewed from a plan view. The substrate 100 includes a semiconductor material. For example, the substrate 100 may be a silicon substrate, a germanium substrate and/or a silicon-germanium substrate. The device isolation patterns 102 may include an oxide (e.g., silicon oxide), a nitride (e.g., silicon nitride), and/or an oxynitride (e.g., silicon oxynitride).

Figure 4A:
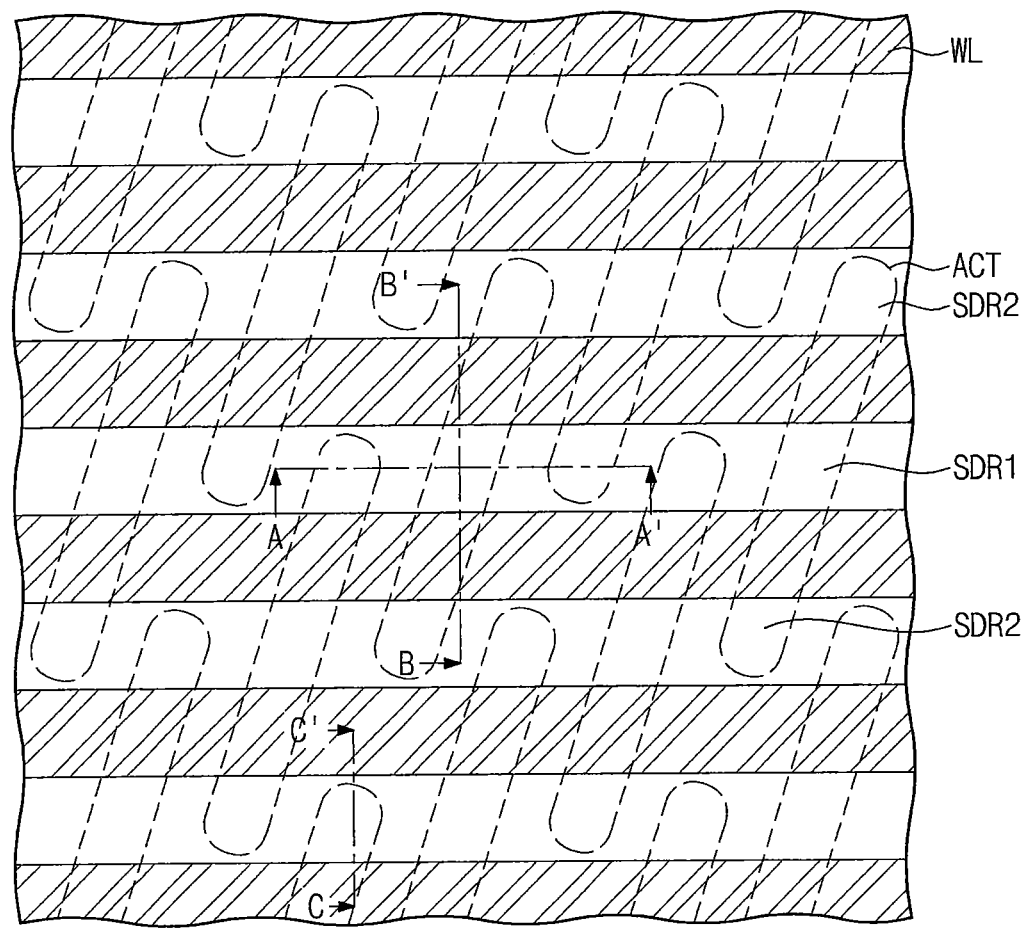
Figure 4B:
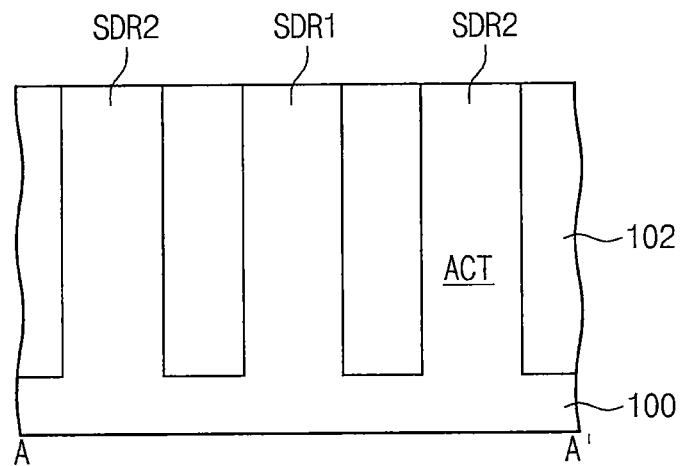
Figure 4C:
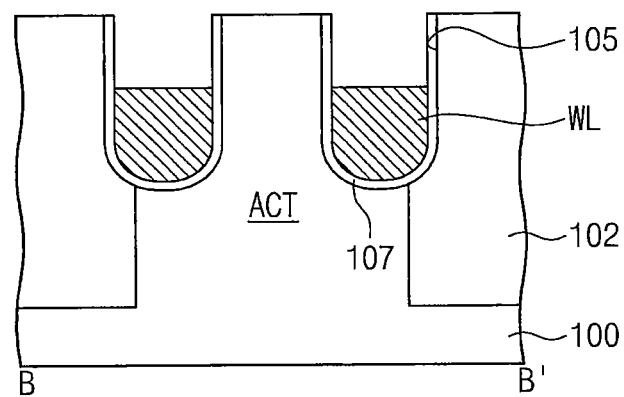
Figure 4D:
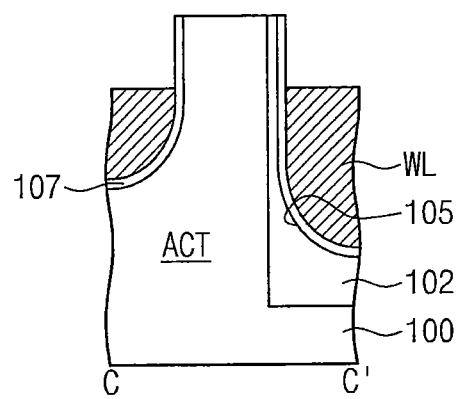

Arrangement of the active portions ACT and word lines WL in a plan view will be described in more detail with reference to FIG. 4A. FIG. 4A is a plan view illustrating the active portions ACT and the word lines WL. Referring to FIGS. 1A to 1E and 4A, the active portions ACT are arranged in parallel to each other in the first direction D1, and an end portion of each active portion ACT may be adjacent to a center of a neighboring active portion ACT in a plan view.

The word lines WL cross the active portions ACT. The word lines WL may be respectively disposed in recess regions 105 formed in the device isolation patterns 102 and the active portions ACT. A pair of the recess regions 105 may cross each active portion ACT. Thus, a pair of word lines WL may cross each active portion ACT. The word lines WL may be parallel to a second direction D2 intersecting the first direction D1. Thus, a long axis of each active portion ACT may be non-perpendicular and non-parallel to a longitudinal direction of the word lines WL when viewed from a plan view. The word lines WL are formed of a conductive material. For example, the word lines WL may include a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), and/or a metal-semiconductor compound (e.g., a metal silicide).

A gate dielectric layer 107 may be disposed between each word line WL and an inner surface of each recess region 105. The gate dielectric layer 107 may include thermal oxide, silicon nitride, silicon oxynitride, and/or a high-k dielectric material.

Figure 1B:
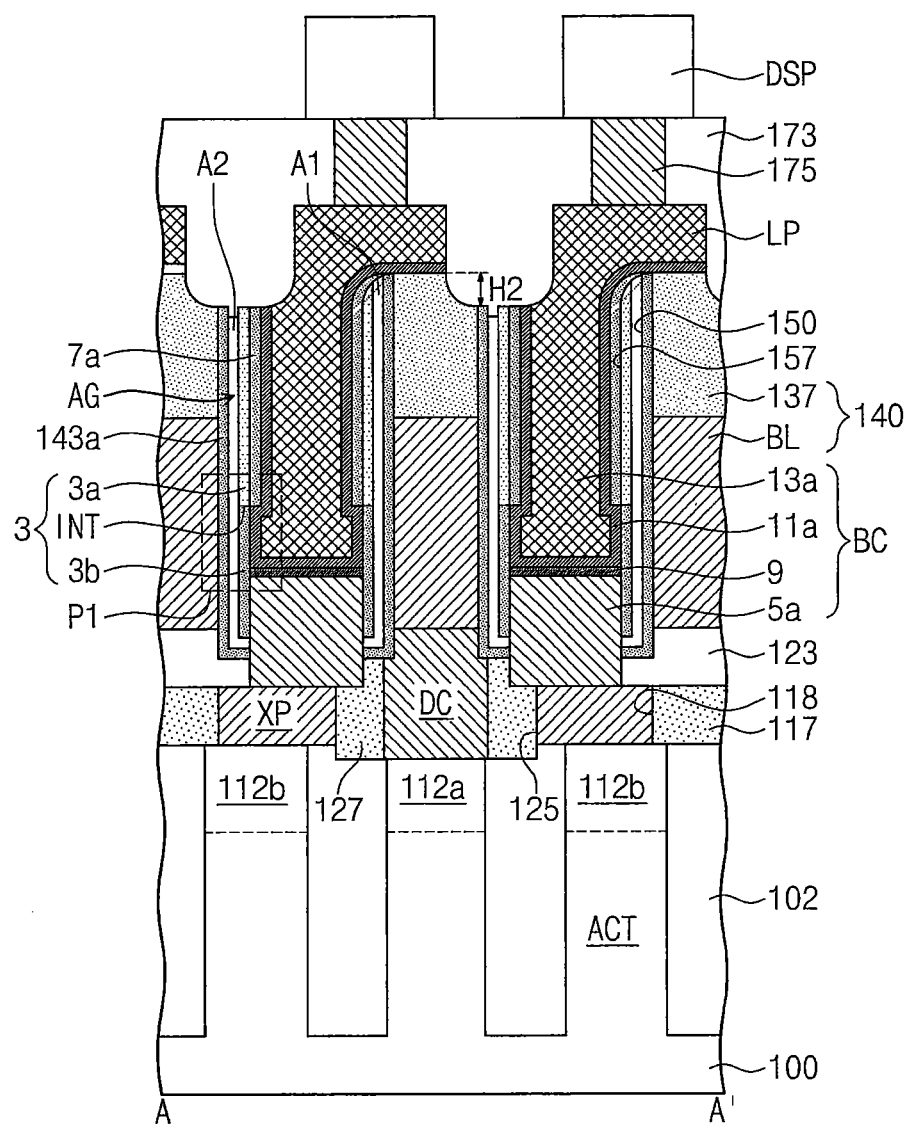
FIG. 1B is a cross-sectional view taken along a line A-A' of FIG. 1A.
Figure 1C:
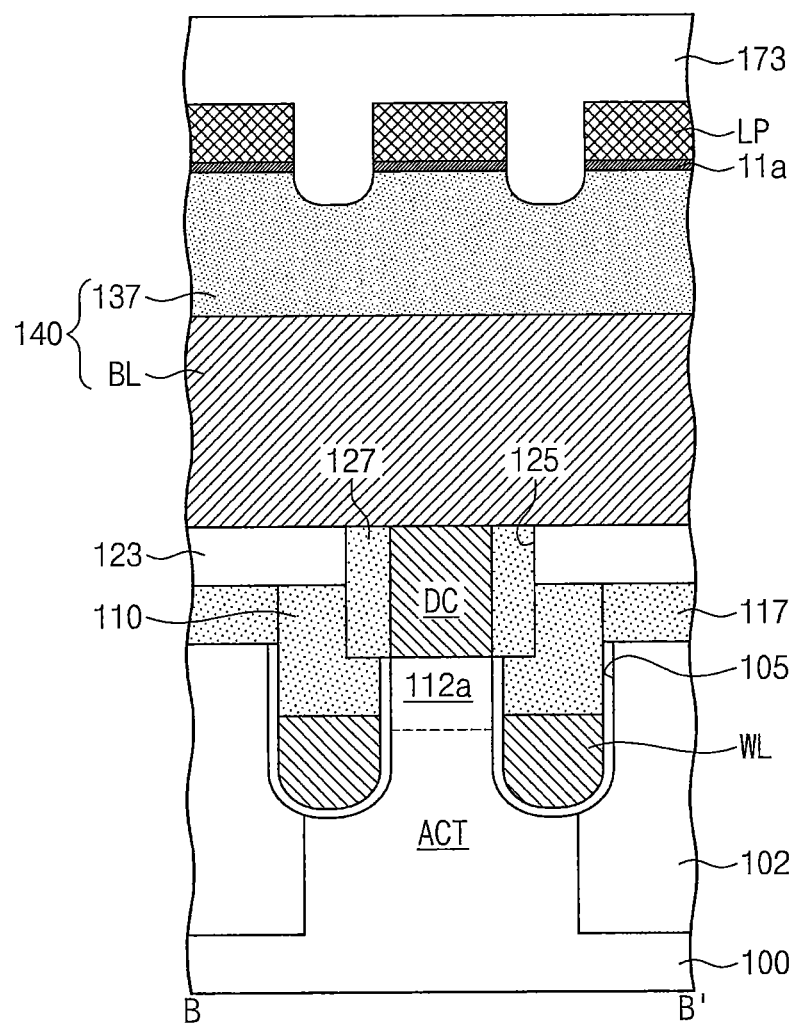
FIG. 1C is a cross-sectional view taken along a line B-B' of FIG. 1A.
Figure 1D:
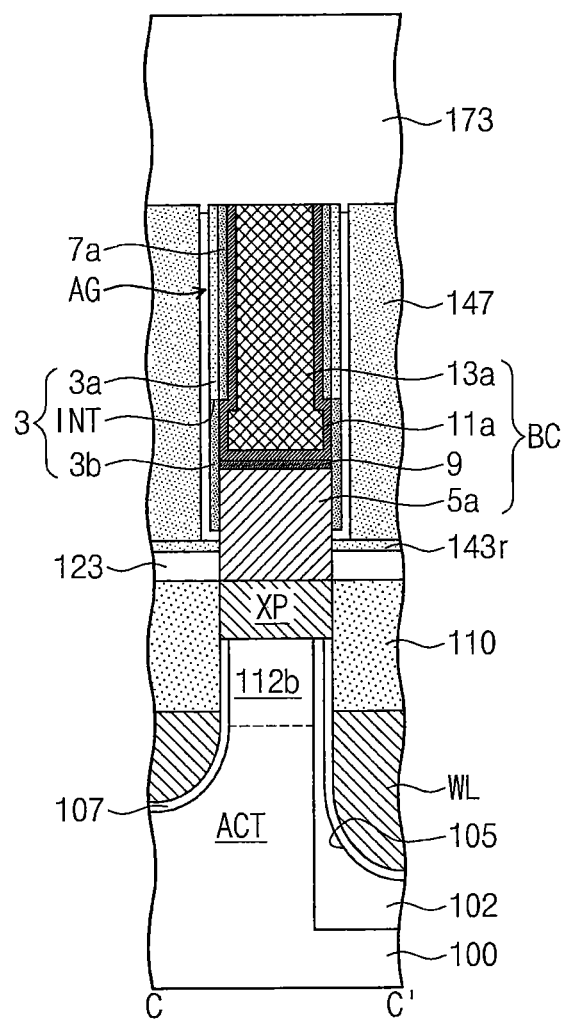
FIG. 1D is a cross-sectional view taken along a line C-C' of FIG. 1A.
Figure 1E:
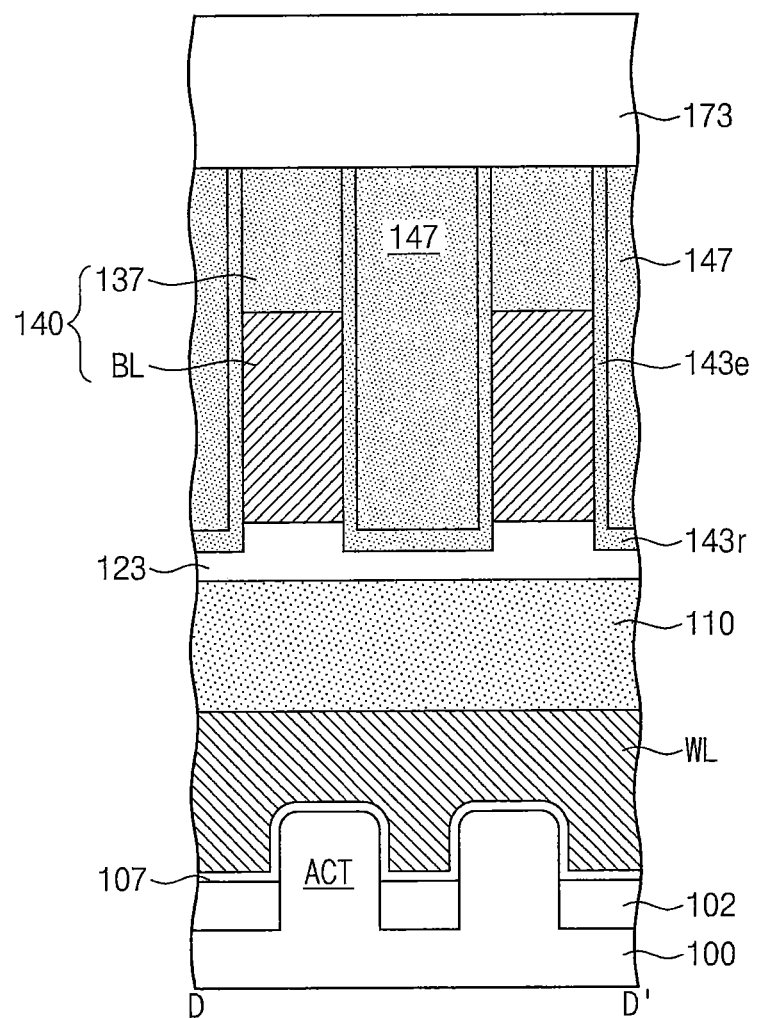
FIG. 1E is a cross-sectional view taken along a line D-D' of FIG. 1A.

As illustrated in FIG. 1E, a bottom surface of the recess region 105 may include a first bottom portion defined by a recessed active portion ACT and a second bottom portion defined by a recessed device isolation pattern 102. Here, the second bottom portion may be lower than the first bottom portion. Thus, the word line WL may cover a top surface and both sidewalls of the active portion ACT under the recess region 105. In other words, a channel region under the word line WL may be defined under the top surface and the both sidewalls of the recessed active portion ACT. As a result, an area of the channel region may be increased and a channel control characteristic of the word line may be increased so that a short channel effect may be improved.

A first doped region 112a may be disposed in each active portion ACT between the pair of word lines WL, and a pair of second doped regions 112b may be disposed in both edge regions of each active portion ACT, respectively. The first doped region 112a may correspond to a common drain region and the second doped regions 112b may correspond to source regions. In other words, the pair of word lines WL may be disposed between the pair of second doped regions 112b when viewed from a plan view. Each word line WL and the first and second doped regions 112a and 112b adjacent thereto may constitute a transistor. Thus, a pair of transistors may be disposed in each active portion ACT. At this time, the pair of transistors may share the first doped region 112a. Since the word lines WL are disposed in the recess regions 105, a channel length of the channel region under each word line WL may be increased in a limited area. Thus, the short channel effect of the transistors may be reduced or minimized.

As illustrated in FIGS. 1C, 1D, and 1E, top surfaces of the word lines WL may be lower than top surfaces of the active portions ACT. A gate capping insulating pattern 110 may be disposed on each word line WL. The gate capping insulating patterns 110 may have linear shapes extending in the longitudinal direction of the word lines WL and may cover entire top surfaces of the word lines WL. The gate capping insulating patterns 110 may fill the recess regions 105 on the word lines WL, respectively. Additionally, the gate capping insulating patterns 110 may protrude to be higher than the top surfaces of the active portions ACT.

Storage node pads XP may be disposed on the second doped regions 112b, respectively. The storage node pads XP may be disposed between the protruding portions of the gate capping insulating patterns 110 adjacent to each other. The storage node pads XP are spaced apart from each other. The storage node pads XP may be connected to the second doped regions 112b, respectively. The storage node pads XP may include a doped semiconductor material (e.g., doped silicon), a conductive metal nitride (e.g., titanium nitride and/or tantalum nitride), a metal (e.g., tungsten, titanium, and/or tantalum), and/or a metal-semiconductor compound (e.g., a metal silicide). If the storage node pads XP include a doped semiconductor material, the doped semiconductor material of the storage node pads XP are doped with dopants of the same conductivity type as the second doped regions 112b. For example, the active portions ACT may be doped with P-type dopants, and the second doped regions 112b and the storage node pads XP may be doped with N-type dopants.

Lower insulating fences 117 may be disposed between the protruding portions of a pair of gate capping insulating patterns 110 adjacent to each other. The storage node pads XP may be spaced apart from each other by the lower insulating fences 117. Top surfaces of the storage node pads XP may be substantially coplanar with top surfaces of the lower insulating fences 117 and top surfaces of the gate capping insulating patterns 110. A first interlayer insulating layer 123 may be disposed on the substrate 100 having the storage node pads XP and the lower insulating fences 117. The first interlayer insulating layer 123 may include an oxide (e.g., silicon oxide).

Bit line contact plugs DC may be disposed in interconnection-contact holes 125 penetrating the first interlayer insulating layer 123, respectively. The bit line contact plugs DC may be connected to the first doped regions 112a, respectively.

An insulating spacer 127 may be disposed between each bit line contact plug DC and an inner sidewall of each interconnection-contact hole 125. In some embodiments, a portion of the inner sidewall of the interconnection-contact hole 125 may be formed of a sidewall of the storage node pad XP adjacent to the bit line contact plug DC. Thus, the insulating spacer 127 may be disposed between the bit line contact plug DC and the storage node pad XP adjacent to the bit line contact plug DC. The bit line contact plugs DC may include a doped semiconductor material (e.g., doped silicon), a conductive metal nitride (e.g., titanium nitride and/or tantalum nitride), a metal (e.g., tungsten, titanium, and/or tantalum), and/or a metal-semiconductor compound (e.g., a metal silicide). If the bit line contact plugs DC include a doped semiconductor material, the doped semiconductor material of the bit line contact plugs DC is doped with dopants of the same conductivity type as the first doped regions 112a. For example, if the active portions ACT are doped with P-type dopants, the first doped regions 112a and the bit line contact plugs DC may be doped with N-type dopants.

Figure 8A:
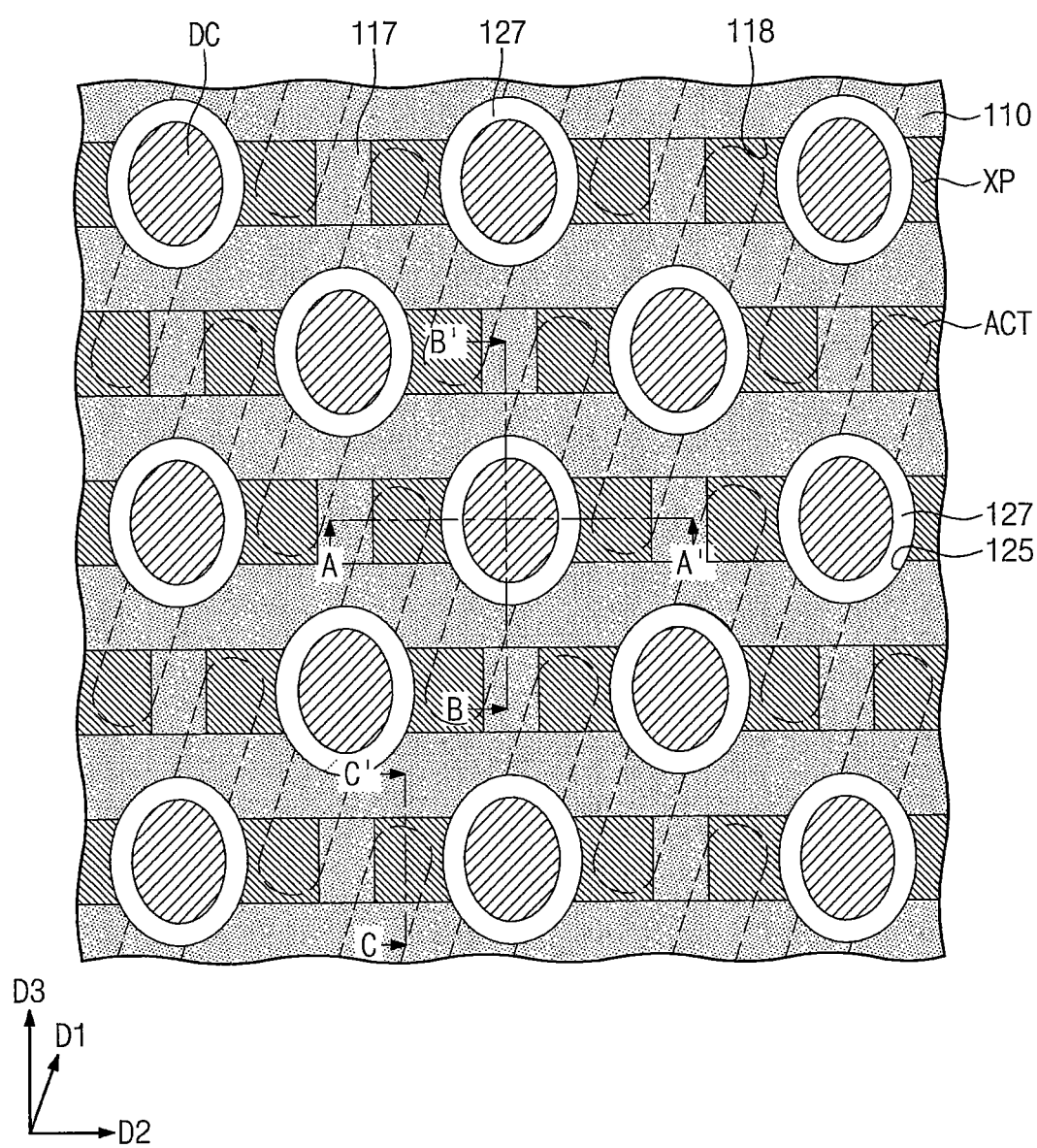
Figure 8B:
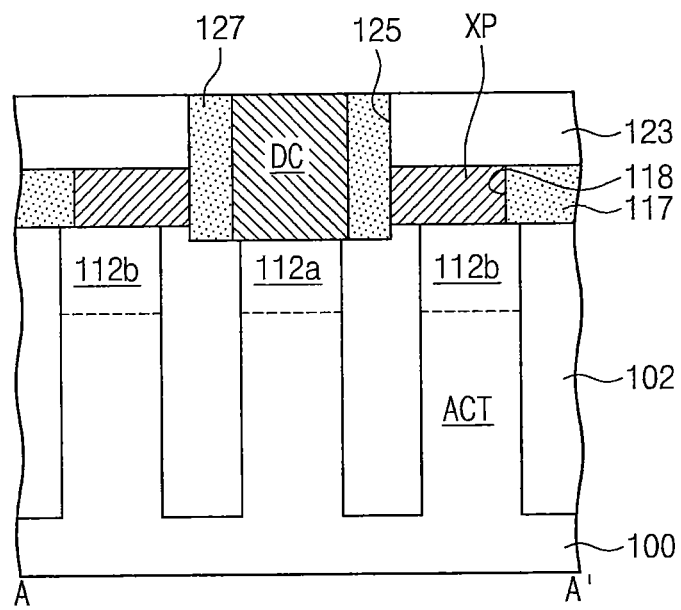
Figure 8C:
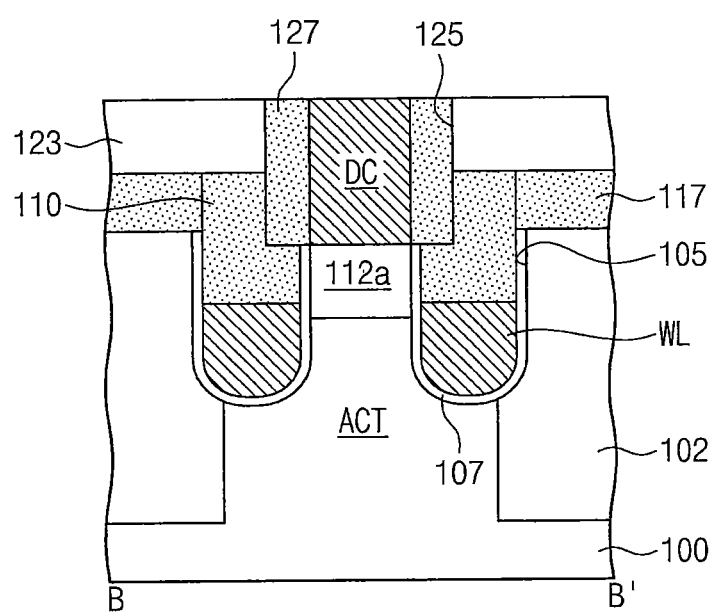
Figure 8D:
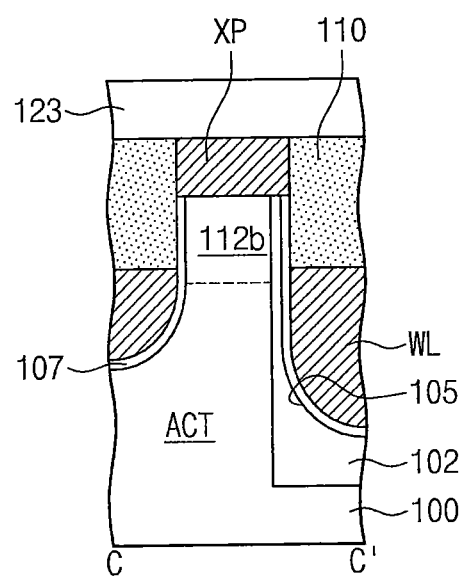
Figure 9A:
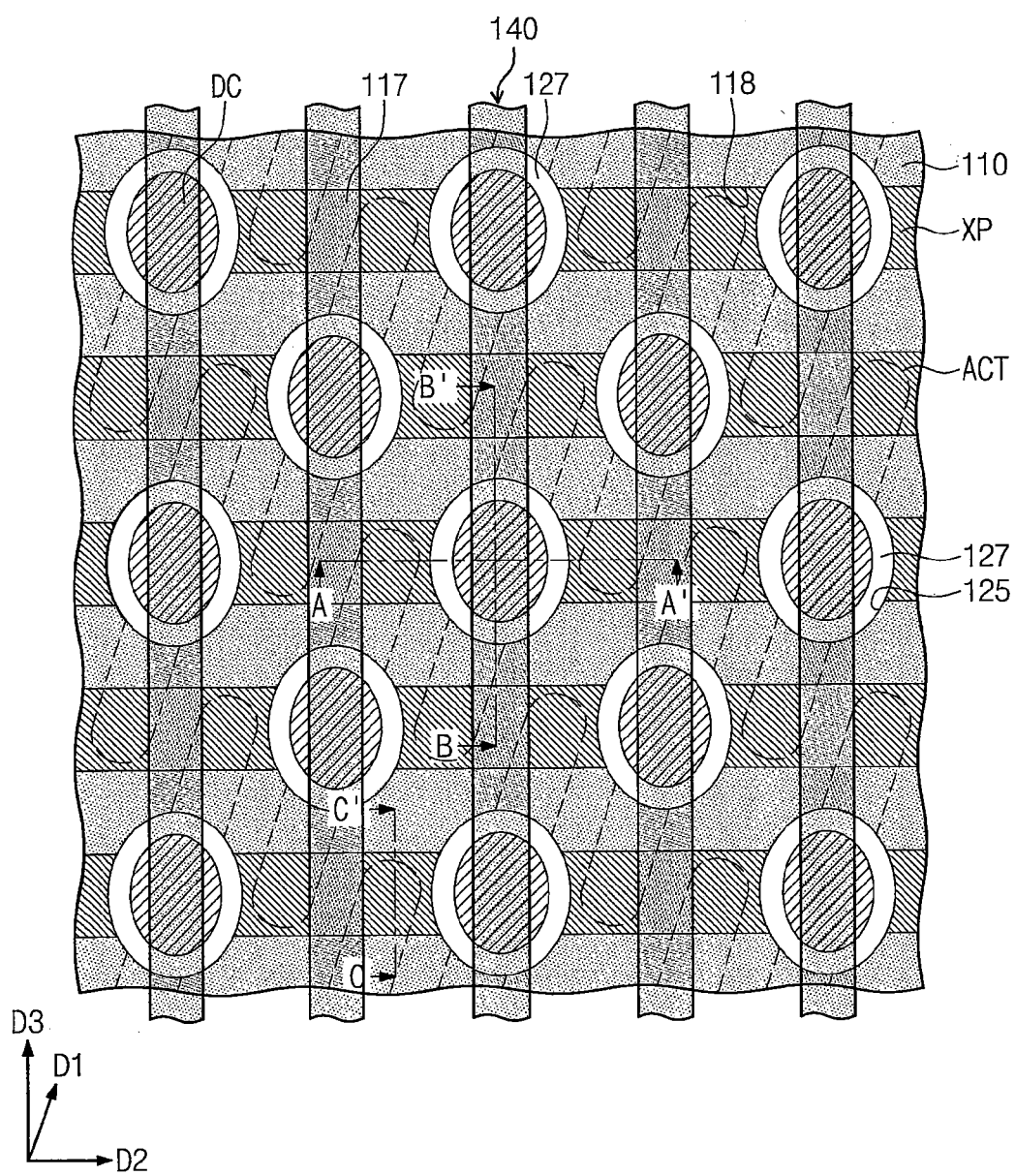
Figure 9B:
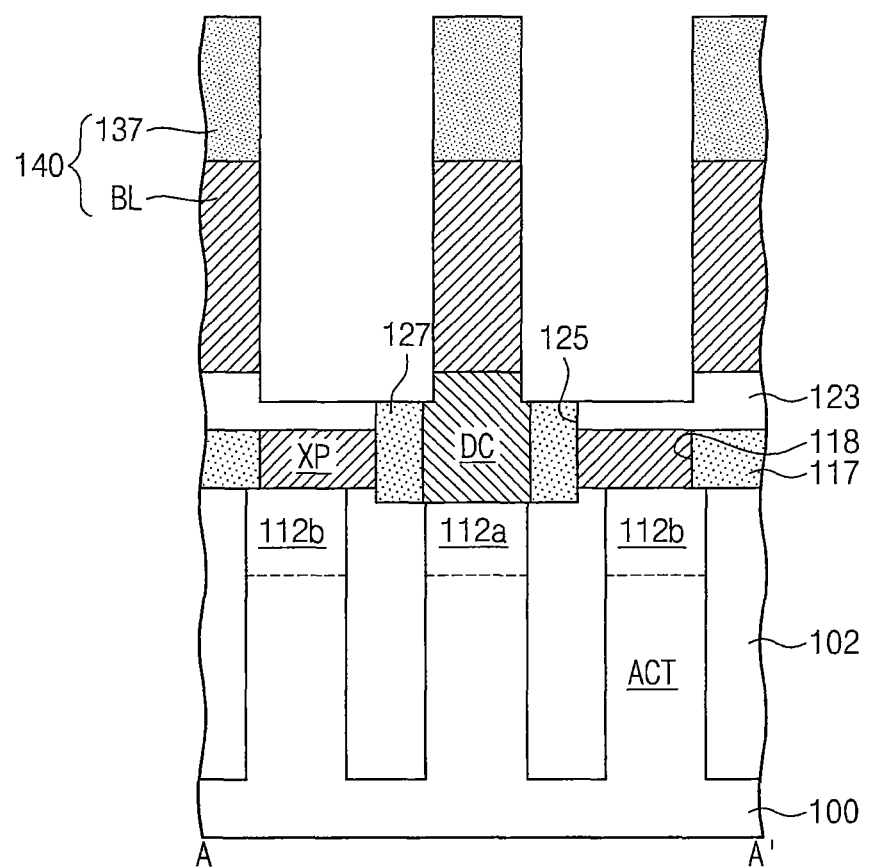
Figure 9C:
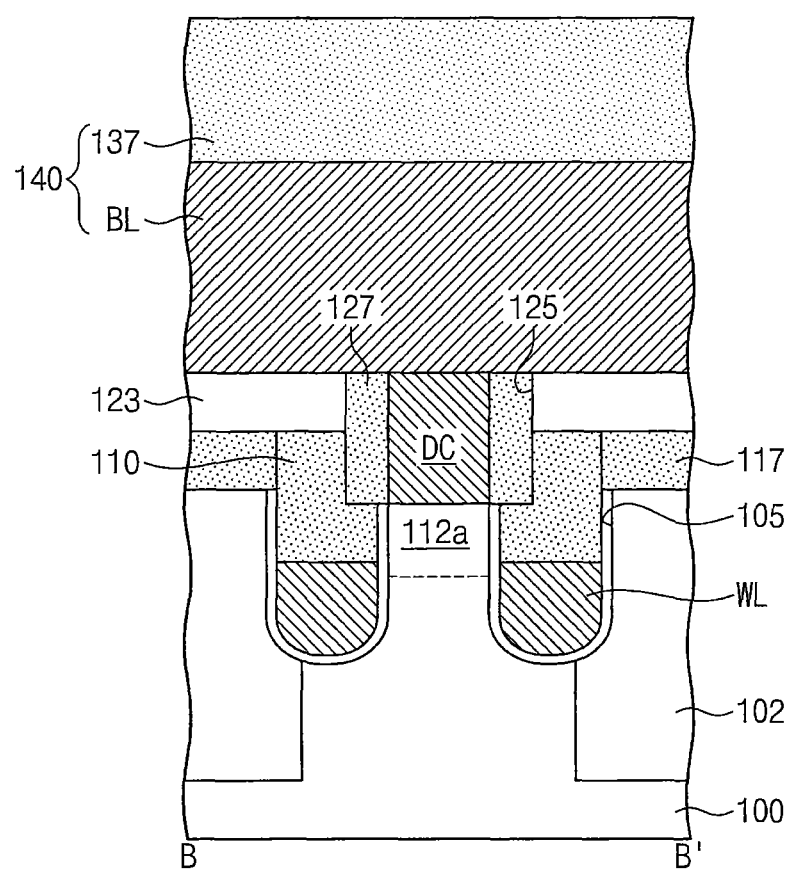
Figure 9D:
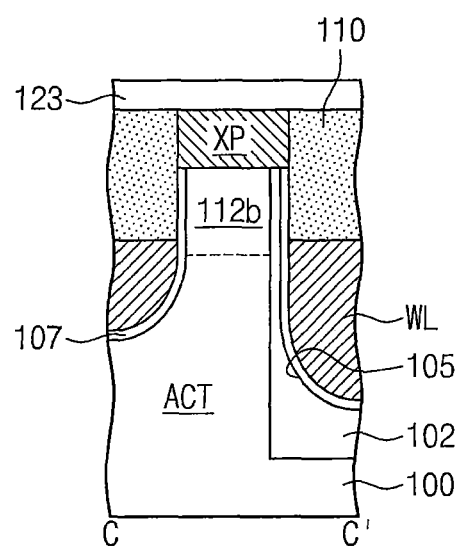
Figure 10A:
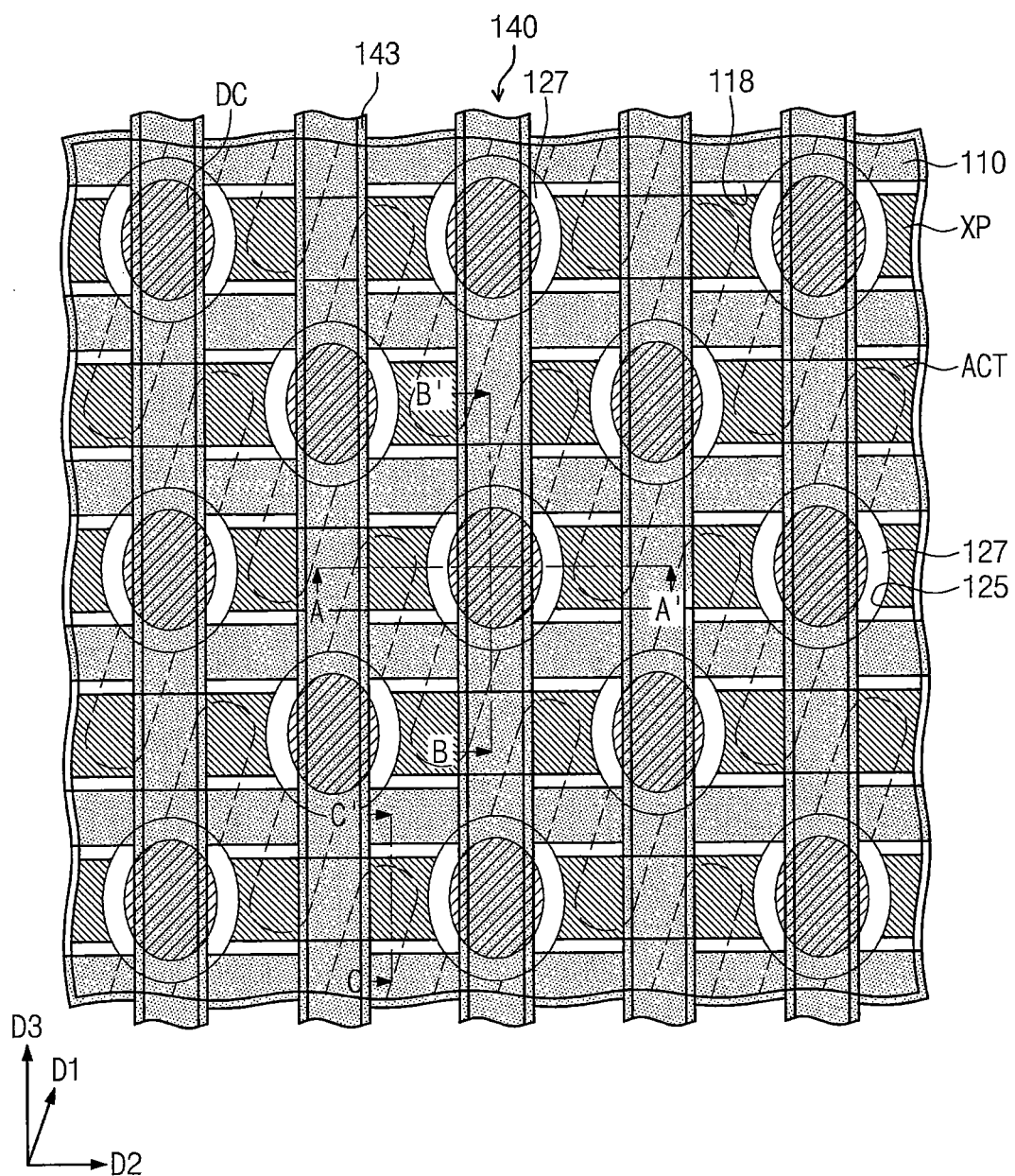
Figure 10B:
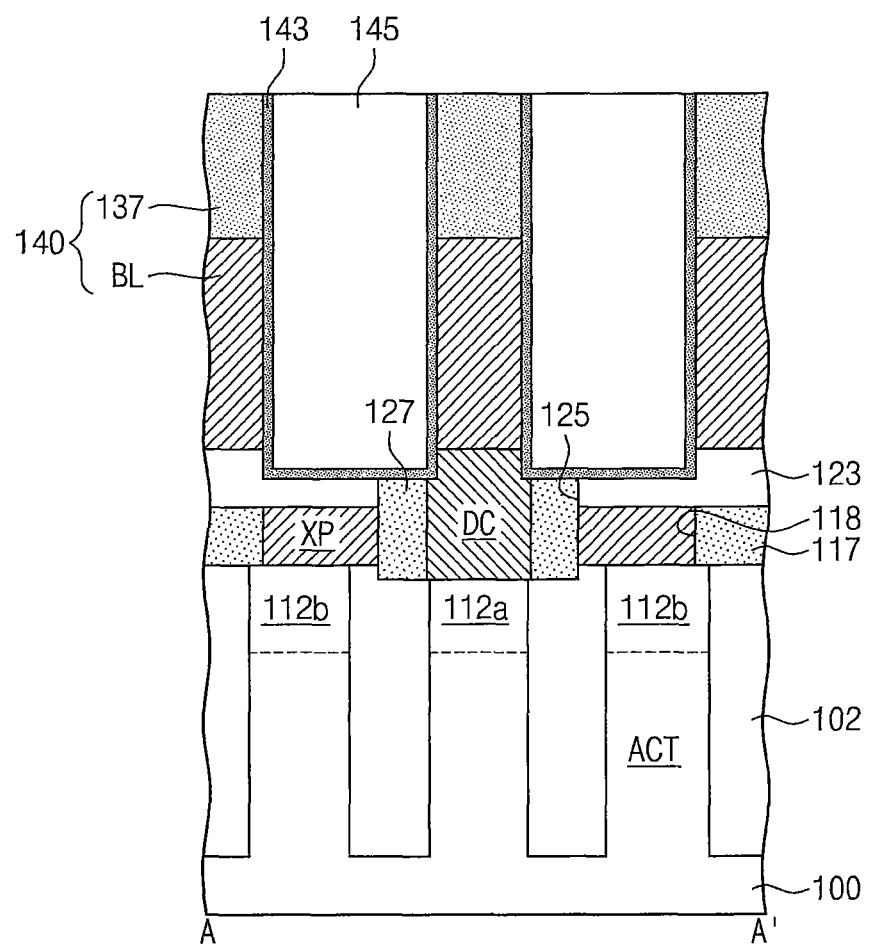
Figure 10C:
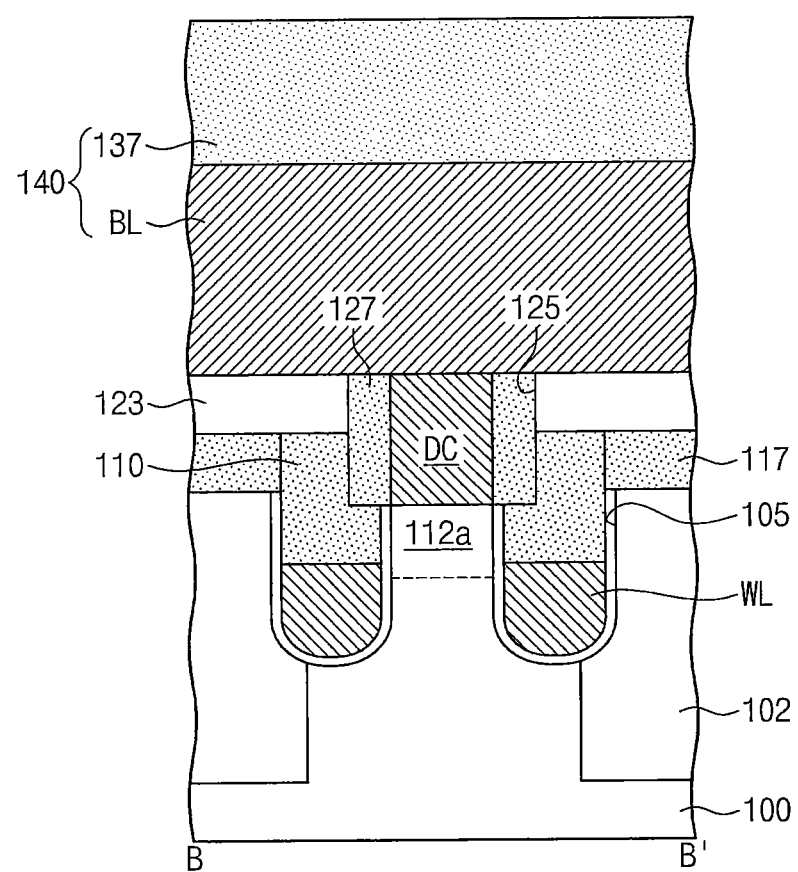
Figure 10D:
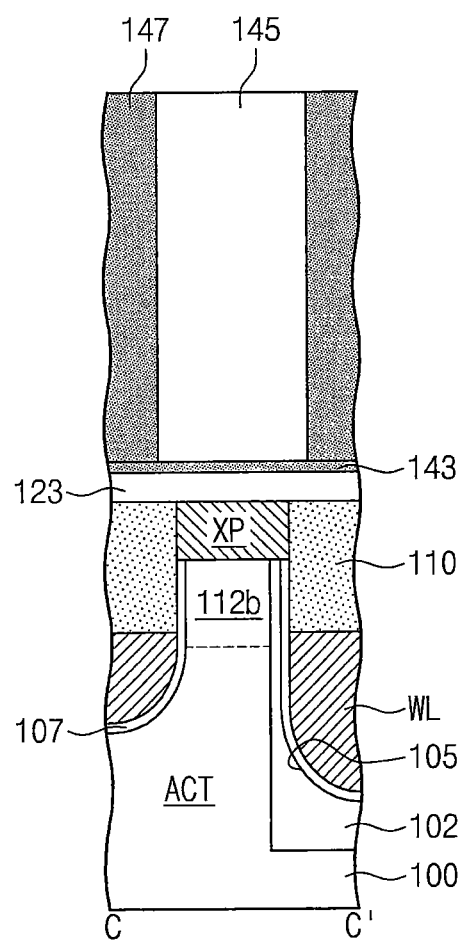

Location relation of the lower insulating fences 117, the storage node pads XP and the bit line contact plugs DC in a plan view will be described in more detail with reference to FIG. 8A. FIG. 8A is a plan view illustrating the lower insulating fences 117, the storage node pads XP and the bit line contact plugs DC. Referring to FIGS. 1A to 1E and 8A, the lower insulating fences 117, the storage node pads XP and the bit line contact plugs DC may be disposed between a pair of gate capping insulating patterns 110 adjacent to each other when viewed from a plan view. The lower insulating fences 117 may be arranged in the second direction D2. A pair of the storage node pads XP may be disposed between the pair of adjacent gate capping insulating patterns 110 and between a pair of the lower insulating fences 117 adjacent to each other. One bit line contact plug DC may be disposed between the pair of storage node pads XP. The insulating spacer 127 may be disposed between the bit line contact plug DC and the pair of the storage node pads XP adjacent thereto.

Referring to FIGS. 1A to 1E, line patterns 140 may be disposed on the first interlayer insulating layer 123. The line patterns 140 may cross over the gate capping insulating patterns 110 and the word lines WL. As illustrated in FIG. 1A, the line patterns 140 may be parallel to a third direction D2 intersecting the first and second directions D1 and D2. Each of the line patterns 140 may include a bit line BL and a hardmask pattern 137 that are sequentially stacked. Each of the bit lines BL may be connected to the bit line contact plugs DC arranged in the third direction D3. The bit line BL may be electrically connected to the first doped region 112a through the bit line contact plug DC. In some embodiments, a width of the bit line BL may be less than a width in the second direction D2 of the bit line contact plug DC. The bit lines BL may include a metal (e.g., tungsten, titanium, and/or tantalum) and/or a conductive metal nitride (e.g., titanium nitride, tantalum nitride, and/or tungsten nitride). The hardmask patterns 137 are formed of an insulating material. For example, the hardmask patterns 137 may include a nitride (e.g., silicon nitride) and/or an oxynitride (e.g., silicon oxynitride).

Storage node contact plugs BC are disposed between a pair of the line patterns 140 adjacent to each other. The storage node contact plugs BC are spaced apart from each other. Spacers 143a, 3 and 7a may be disposed between each storage node contact plug BC and the line patterns 140. The spacers 143a, 3 and 7a include a first spacer 143a, a second spacer 3, and a third spacer 7a. The first spacer 143a may extend in the third direction D3 to cover a sidewall of the line pattern 140. An air gap AG may exist between the second spacer 3 and the first spacer 143a. The first spacer 143a may have an L-shaped cross section. The air gap AG may also have an L-shaped cross section. The first spacer 143a protects the sidewall of the line pattern 140. In particular, the first spacer 143a protects a sidewall of the bit line BL.

Figure 2A:
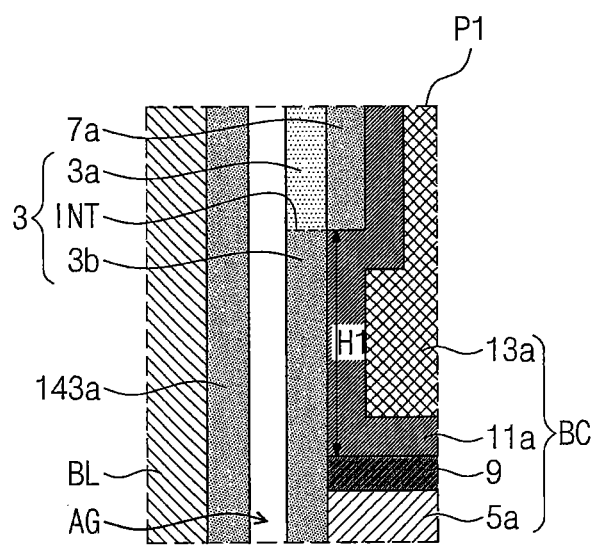
FIGS. 2A to 2E are enlarge views of a portion 'P1' of FIG. 1B according to embodiments of the inventive concepts.
Figure 2B:
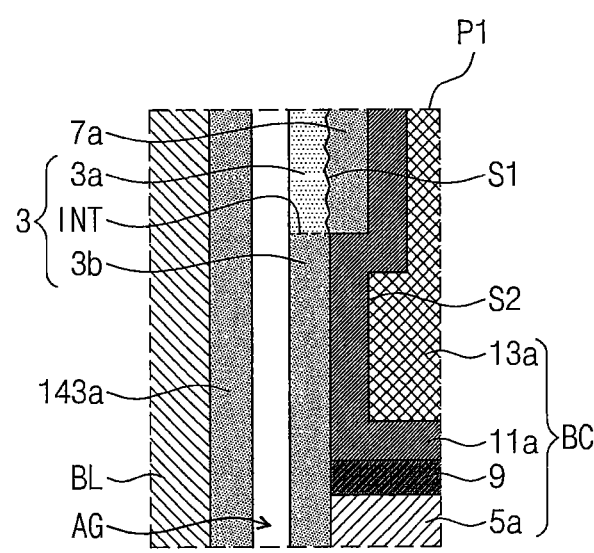
Figure 2C:
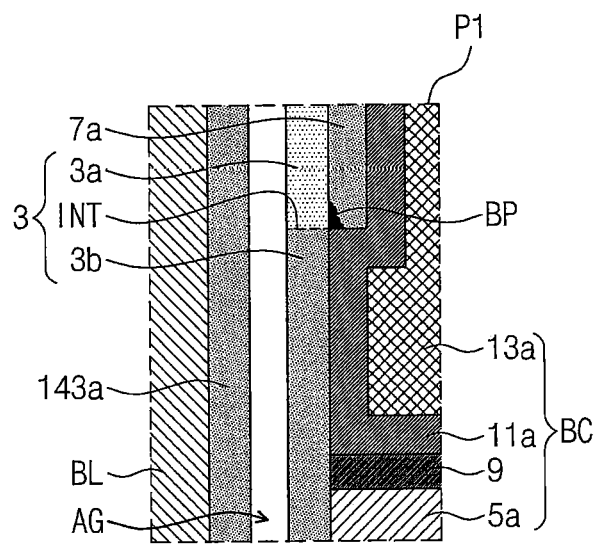
Figure 2D:
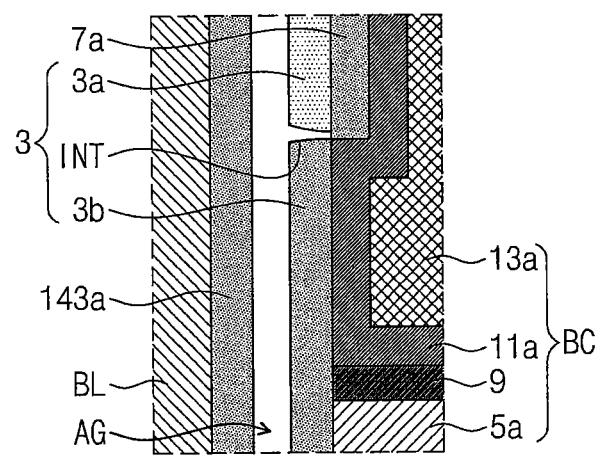
Figure 2E:
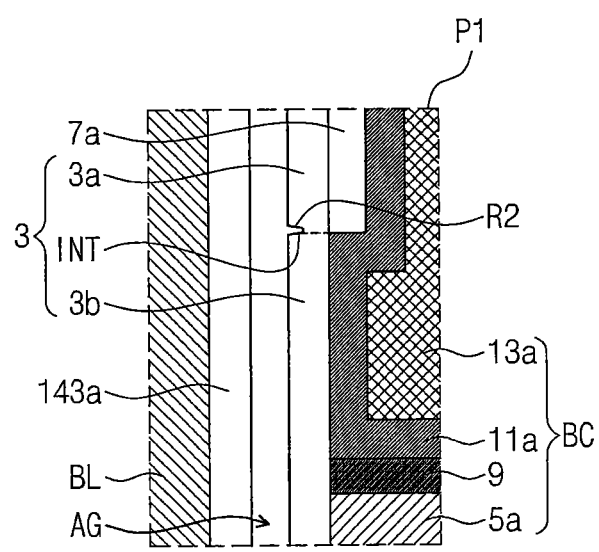

The second spacer 3 may include a first portion 3a and a second portion 3b disposed under the first portion 3a. The first portion 3a corresponds to a portion on which two anisotropic etching processes are performed. The second portion 3b corresponds to a portion on which one anisotropic etching process is performed. The anisotropic etching process may cause more damage to a target layer than an isotropic etching process. Thus, defects or etching damage of the first portion 3a may be more than those or that of the second portion 3b. Thus, a surface roughness of a sidewall S1 of the first portion 3a may be greater than a surface roughness of a sidewall S2 of the second portion 3b, as illustrated in FIG. 2B. Alternatively, the surface roughness of the sidewall of the first portion 3a may be nearly equal to the surface roughness of the sidewall of the second portion 3b, as illustrated in FIG. 2A. As illustrated in FIG. 2C, an etch byproduct BP may remain on a sidewall adjacent to an interface INT between the first and second portions 3a and 3b. The etch byproduct BP may include a silicon-fluorine compound, a silicon-chlorine compound, a silicon-sulfur compound, and/or a silicon-sulfur-fluorine compound. Additionally, a natural oxide layer may exist around the etch byproduct BP. The third spacer 7a may cover the sidewall S1 of the first portion 3a and may expose the sidewall S2 of the second portion 3b. Thus, a bottom surface of the third spacer 7a may be disposed at a substantially same height as the interface INT. Alternatively, as illustrated in FIG. 2D, the air gap AG may extend toward the interface INT and, moreover, the first portion 3a may be separated from the second portion 3b. In still other embodiments, a sidewall recess region R2 may be partially formed between the first and second portions 3a and 3b but the first and second portions 3a and 3b may not be completely separated from each other, as illustrated in FIG. 2E.

As described above, the interface INT may be defined as a place at which the surface roughness of the second spacer 3 is changed, a place at which the etch byproduct BP and/or the natural oxide layer exist, or a place at which the extending region of the air gap AG exists.

Each of the storage node contact plugs BC includes a poly-silicon pattern 5a, a metal silicide layer 9, a diffusion barrier pattern 11a, and a metal-containing pattern 13a that are sequentially stacked. The poly-silicon pattern 5a may be doped with dopants. In other words, the poly-silicon pattern 5a may be doped with dopants of the same conductivity type as the storage node pad XP. For example, the poly-silicon pattern 5a may be doped with N-type dopants.

The metal silicide layer 9 may be formed of titanium silicide, cobalt silicide, nickel silicide, tungsten silicide, platinum silicide, and/or molybdenum silicide. The diffusion barrier pattern 11a may be composed of a titanium nitride layer, a tantalum nitride layer and/or a tungsten nitride layer. The metal-containing pattern 13a may include tungsten, copper and/or aluminum.

A width of a lower portion of the storage node contact plug BC lower than the interface INT may be greater than a width of an upper portion of the storage node contact plug BC higher than the interface INT. In other words, a width of the poly-silicon pattern 5a may be greater than an inside diameter of the third spacer 7a disposed in a contact hole 157. The metal silicide layer 9 is spaced apart from both the interface INT and the air gap AG. A height difference H1 between a top surface of the metal silicide layer 9 and the interface INT (or a bottom surface of the third spacer 7a) may be in the range of about 50 Å to about 500 Å. The height difference H1 may be provided in order to reduce or prevent failure such an open fail in a manufacturing process. Thus, reliability of the semiconductor device may be improved. Additionally, a top surface of the poly-silicon pattern 5a is spaced apart from the third spacer 7a so that an area of the top surface of the poly-silicon pattern 5a may become wide. Thus, a formation area of the metal silicide layer 9 may become wide. As a result, a drain current may be increased.

The diffusion barrier pattern 11a may be in contact with the sidewall and the bottom surface of the third spacer 7a, the sidewall S2 of the second portion 3b and the top surface of the metal silicide layer 9. According to the present embodiment, a landing pad LP extends from a top end of each storage node contact plug BC to overlap with a first portion A1 of the air gap AG. At this time, a second portion A2 of the air gap AG is not covered by the landing pad LP.

As illustrated in FIG. 1B, a height of the first portion A1 of the air gap AG may be different from a height of the second portion A2 of the air gap AG. In other words, the first portion A1 and the second portion A2 of the air gap AG may be asymmetrical with respect to the storage node contact plug BC. The height of the first portion A1 of the air gap AG covered by the landing pad LP may be greater than the height of the second portion A2 of the air gap not covered by the landing pad LP. In some embodiments, a top end of the first portion A1 of the air gap AG may be closed by the diffusion barrier pattern 11a under the landing pad LP. A top end of the second portion A2 of the air gap AG may be closed by a second interlayer insulating layer 173. A height difference H2 between a top end of the second spacer 3 adjacent to the second portion A2 of the air gap AG and a top surface of the hard mask pattern 137 may be in the range of about 0 to about 500 Å.

As illustrated in FIG. 1A, the air gap AG may have a closed loop-shape surrounding the storage node contact plug BC when viewed from a plan view. The second and third spacers 3 and 7a may also have closed loop-shapes surrounding the storage node contact plugs BC. In more detail, upper insulating fences 147 arranged in the third direction D3 may be disposed between a pair of line patterns 140 adjacent to each other. Each of guide holes 150 may be defined between a pair of the upper insulating fences 147 adjacent to each other and between the pair of line patterns 140 adjacent to each other. In particular, the first spacer 143a having a linear shape may be disposed between the upper insulating fence 147 and each line pattern 140. Thus, each of the guide holes 150 may be defined between the pair of adjacent upper insulating fences 147 and between a pair of the first spacers 143 disposed between the pair of adjacent line patterns 140.

Each of the storage node contact plugs BC may be disposed in each guide hole 150 when viewed from a plan view. The second and third spacers 3 and 7a may be disposed between the storage node contact plug BC and an inner sidewall of the guide hole 150. The air gap AG may be disposed between the second spacer 3 and the inner sidewall of the guide hole 150. The guide hole 150 may have a quadrilateral shape when viewed from a plan view. A bottom surface of the storage node contact plug BC may have a quadrilateral shape due to the shape of the guide hole 150.

As illustrated in FIGS. 1D and 1E, an extension 143r of the first spacer 143a may be disposed between the upper insulating fence 147 and the first interlayer insulating layer 123.

In other embodiments, the first spacer 143a may have a shape surrounding the sidewall of the storage node contact plug BC. In this case, the first spacer 143a may be disposed between the storage node contact plug BC and the inner sidewall of the guide hole 150.

The first spacer 143a may be formed of an insulating material capable of reducing or preventing the bit line BL from being oxidized. Additionally, the first spacer 143a may be formed of an insulating material capable of reducing or preventing metal atoms in the bit line BL from being diffused outward. For example, the first spacer 143a may include a nitride (e.g., silicon nitride) and/or an oxynitride (e.g., silicon oxynitride). The second and third spacers 3 and 7a may be formed of an insulating material capable of reducing or preventing the storage node contact plug BC from being oxidized. For example, the second and third spacers 3 and 7a may include a nitride (e.g., silicon nitride) and/or an oxynitride (e.g., silicon oxynitride).

As illustrated in FIGS. 1A and 1B, the second spacer 3 having the closed loop-shape may define the contact hole 157. The storage node contact plug BC may be disposed in the contact hole 157. The contact hole 157 may extend downward to penetrate the first interlayer insulating layer 123. Thus, the storage node contact plug BC may also extend downward to be connected to the storage node pad XP.

The storage node contact plug BC may be disposed in the contact hole 157 and the landing pad LP may be disposed outside the contact hole 157. In some embodiments, the landing pad LP may extend to cover a portion of the top surface of the line pattern 140 (i.e., a top surface of the hard mask pattern 137) adjacent to a side of the storage node contact plug BC. The portion of the top surface of the hard mask pattern 137, which is covered by the landing pad LP, may be higher than another portion of the top surface of the hard mask pattern 137, which is not covered by the landing pad LP. The landing pad LP may be connected to a portion of a top surface of the storage node contact plug BC without an interface therebetween. In other words, the landing pad LP and the storage node contact plug BC connected to each other may constitute one united body. However, the inventive concepts are not limited thereto. In other embodiments, an interface may exist between the landing pad LP and the storage node contact plug BC. The storage node contact plug BC and the landing pad LP are formed of a conductive material. For example, the storage node contact plug BC and the landing pad LP may include a doped semiconductor material (e.g., doped silicon), a metal (e.g., tungsten, titanium, and/or tantalum), a conductive metal nitride (e.g., titanium nitride, tantalum nitride, and/or tungsten nitride), and/or a metal-semiconductor compound (e.g., a metal silicide).

As described above, the second interlayer insulating layer 173 may be disposed on the second portion A2 of the air gap AG, which is not covered by the landing pad LP. As illustrated in FIG. 1B, the second interlayer insulating layer 173 may fill a space between the landing pads LP and may cover top surfaces of the landing pads LP. Alternatively, the second interlayer insulating layer 174 may fill the space between the landing pads LP and may have a top surface substantially coplanar with the top surfaces of the landing pads LP.

Data storage parts DSP may be disposed on the second interlayer insulating layer 173. The data storage parts DSP may be electrically connected to the landing pads LP, respectively. Each of the data storage parts DSP may be electrically connected to each of the landing pads LP through a via-plug 175 penetrating the second interlayer insulating layer 173. Thus, each of the data storage parts DSP may be electrically connected to each of the second doped regions 112b through the landing pad LP, the storage node contact plug BC and the storage node pad XP. In other words, the bit line BL and the data storage part DSP may be electrically connected to the first doped region 112a and the second doped region 112b of each transistor, respectively. The transistors may correspond to selection elements. Each of the selection elements and the data storage part DSP connected thereto may constitute one memory cell. Thus, the semiconductor device according to embodiments of the inventive concepts may be realized as a semiconductor memory device. The data storage part DSP may be realized as one of various shapes capable of storing logic data.

According to the semiconductor device described above, the storage node contact plug BC is disposed between the pair of line patterns 140 adjacent to each other, and the air gap AG is disposed between the storage node contact plug BC and the line patterns 140. The air gap AG has a dielectric constant lower than that of silicon oxide. Thus, a parasitic capacitance between the storage node contact plug BC and the line patterns 140 may be reduced or minimized. As a result, a semiconductor device having excellent reliability may be realized. Additionally, since the parasitic capacitance is reduced, a distance between the storage node contact plug BC and the line pattern 140 can be reduced to realize a highly integrated semiconductor device.

Furthermore, the first portion A1 of the air gap AG is covered by the landing pad LP and the second portion A2 of the air gap AG is not covered by the landing pad LP. Thus, the air gap AG may be easily formed.

As described above, the data storage part DSP may be realized as one of various shapes capable of storing logic data. This will be described with reference to the drawings.

FIG. 1D may also be regarded as illustrating a semiconductor device according to various other embodiments of the inventive concept. The semiconductor device includes a region, which may be embodied by the upper insulating fence 147, on a substrate 100, the region including a sidewall; a first spacer, which may be embodied by the second spacer 3, including an air gap AG therein on the sidewall, the air gap AG having a first end adjacent the substrate 100 and a second end remote from the substrate 100; a second spacer, which may be embodied by the third spacer 7*a*, extending on the first spacer, the second spacer having a second end that is adjacent the second end of the air gap AG and a first end that is between the first end of the air gap AG and the second end of the air gap AG; and a contact, which may be embodied by the poly-silicon pattern 5*a*, on the first spacer, the contact having a first end adjacent the substrate 100 and a second end that is between the first end of the second spacer and the first end of the air gap AG and is spaced apart from the first end of the second spacer.

FIG. 1D may also be regarded as illustrating a semiconductor device according to various other embodiments of the inventive concepts. The semiconductor device further includes a metal silicide layer 9 that extends on the second end of a contact, which may be embodied by the poly-silicon pattern 5*a*, to directly contact a first spacer, which may be embodied by the second spacer 3. The metal silicide layer 9 is spaced apart from the air gap AG throughout an extent of the metal silicide layer 9.

Figure 3A:
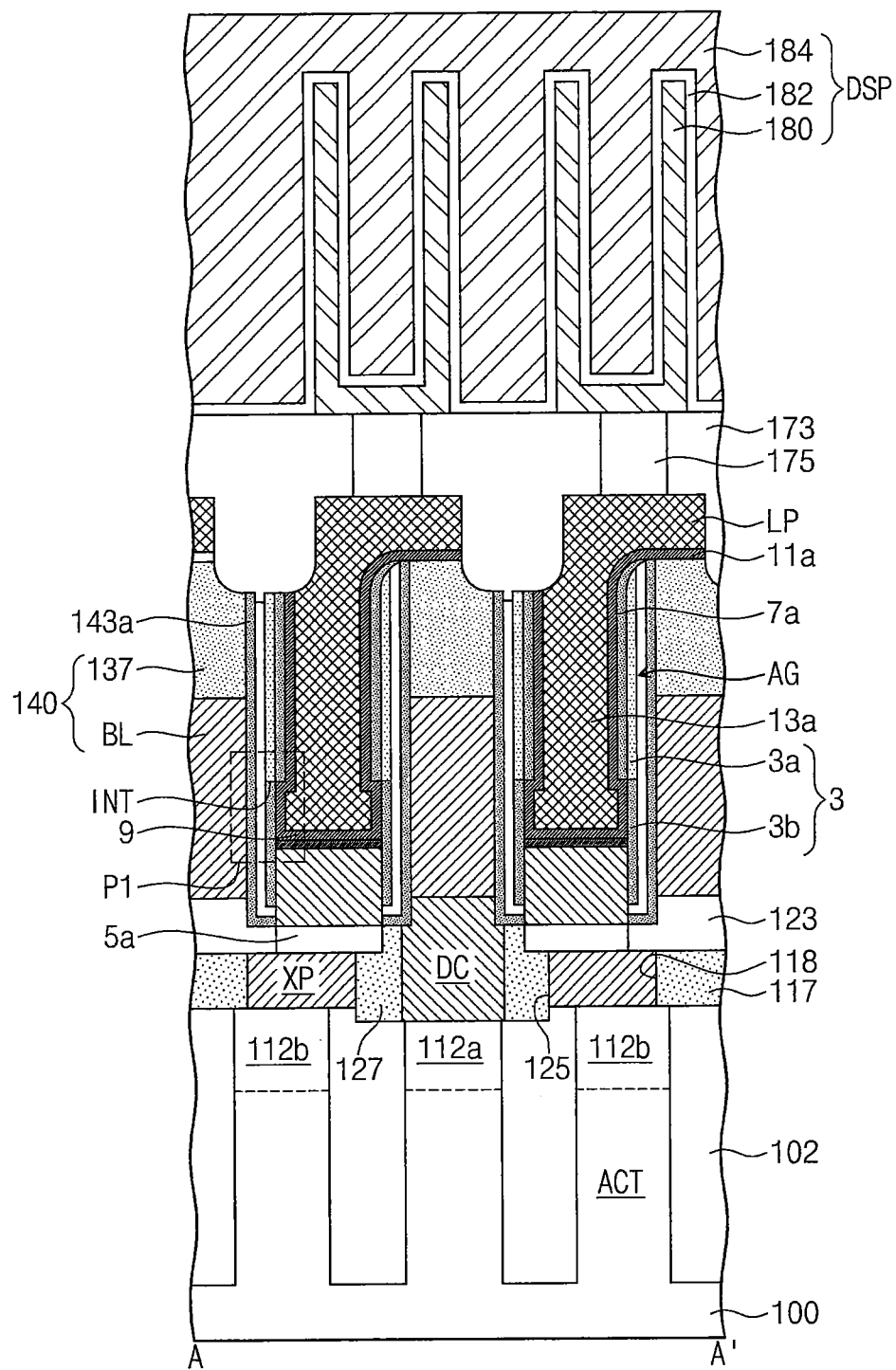
FIG. 3A is a cross-sectional view illustrating an example of a data storage part of a semiconductor device according to embodiments of the inventive concepts.

FIG. 3A is a cross-sectional view illustrating an example of a data storage part of a semiconductor device according to embodiments of the inventive concepts.

Referring to FIG. 3A, the data storage part DSP may include a lower electrode 180, an upper electrode 184, and a capacitor dielectric layer 182 between the lower and upper electrodes 180 and 184. In other words, the data storage part DSP may be realized as a capacitor. The lower electrode 180 may be electrically connected to each of the landing pads LP through the via-plug 175. The lower electrode 180 may have a cylindrical shape. The upper electrode 184 may cover surfaces of a plurality of lower electrodes 180. The capacitor dielectric layer 182 may be disposed between the upper electrode 184 and the lower electrodes 180. Each of the lower and upper electrodes 180 and 184 may include a doped semiconductor material (e.g., doped silicon), a conductive metal nitride (e.g., titanium nitride, tantalum nitride, and/or tungsten nitride), a metal (e.g., ruthenium, iridium, titanium, and/or tantalum), and/or a conductive metal oxide (e.g., iridium oxide). The upper electrode 184 may be formed of the same conductive material as or a different conductive material from the lower electrode 180. The capacitor dielectric layer 182 may be formed of an oxide (e.g., silicon oxide), a nitride (e.g., silicon nitride), an oxynitride (silicon oxynitride), a high-k dielectric material, and/or a ferroelectric material.

As described above, in the event that the data storage part DSP is the capacitor, the bit line BL may correspond to a bit line.

Figure 3B:
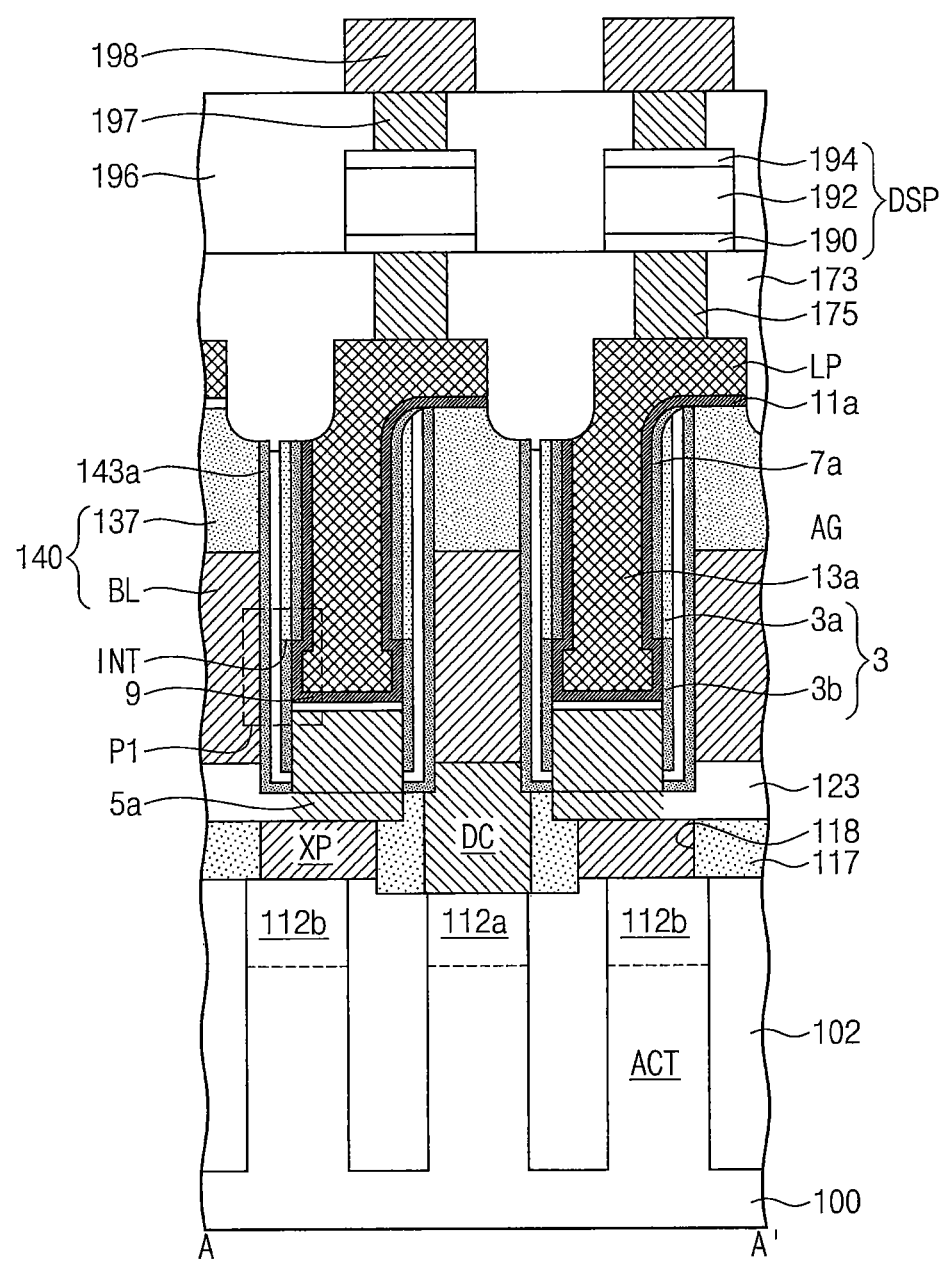
FIG. 3B is a cross-sectional view illustrating another example of a data storage part of a semiconductor device according to embodiments of the inventive concepts.

FIG. 3B is a cross-sectional view illustrating another example of a data storage part of a semiconductor device according to embodiments of the inventive concepts.

Referring to FIG. 3B, a data storage part DSP according to the present example may include a lower electrode, a variable resistor 192 and an upper electrode 194 that are sequentially stacked. A state of the variable resistor 192 may be changed into any one of a plurality of states having different resistance values from each other by a program operation. The lower and upper electrodes 190 and 194 may include a conductive metal nitride (e.g., titanium nitride, tantalum nitride, and/or tungsten nitride).

In some embodiments, the variable resistor 192 may include a magnetic tunnel junction pattern. The magnetic tunnel junction pattern may include a reference magnetic layer, a free magnetic layer, and a tunnel barrier disposed between the reference and free magnetic layers. The reference magnetic layer may have a magnetization direction fixed in one direction, and a magnetization direction of the free magnetic layer may be changed into any one of parallel and anti-parallel directions to the magnetization direction of the reference magnetic layer. The reference and free magnetic layers may include a ferromagnetic material. The tunnel barrier may include aluminum oxide and/or magnesium oxide.

In other embodiments, the variable resistor 192 may include a phase change material. A phase of the phase change material may be changed into an amorphous state or a crystalline state according to a temperature and/or a supply time of heat supplied by a program operation. The phase change material in the amorphous state may have a resistivity higher than that of the phase change material in the crystalline state. For example, the phase change material may be a compound including chalcogen elements (e.g., tellurium (Te) and/or selenium (Se)). For example, the phase change material may include Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se and/or 6A group element-Sb—Se. If the variable resistor 192 includes the phase change material, the lower electrode 190 may be omitted and the variable resistor 192 may be connected to the via-plug 175. In this case, the via-plug 175 may be used as a heating electrode and the via-plug 175 may be formed of a conductive metal nitride (e.g., titanium nitride, tantalum nitride, and/or tungsten nitride).

In still other embodiments, the variable resistor 192 may include a transition metal oxide. By a program operation, an electrical path may be generated in the transition metal oxide or the electrical path in the transition metal oxide may disappear. Both ends of the electrical path may be connected to the lower electrode 190 and the upper electrode 194, respectively. The data storage part DSP having the electrical path may have a low resistance value, and the data storage part DSP not having the electrical path may have a high resistance value. For example, the transition metal oxide may include niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, and/or barium-strontium-zirconium oxide. If the variable resistor 192 includes the transition metal oxide, the lower and upper electrodes 190 and 194 may include a conductive metal nitride (e.g., titanium nitride and/or tantalum nitride), a transition metal (e.g., titanium and/or tantalum) and/or a rare-earth metal (e.g., ruthenium and/or platinum).

Referring again to FIG. 3B, a third interlayer insulating layer 196 may cover the data storage parts DSP. Upper via-plugs 197 may penetrate the third interlayer insulating layer 196 to be connected to the data storage parts DSP, respectively. An upper interconnection 198 may be disposed on the third interlayer insulating layer 196. The upper interconnection 198 may be parallel to the bit line BL. The upper interconnection 198 may be electrically connected to the data storage part DSP through the upper via-plug 197.

Next, a method of manufacturing the semiconductor device will be described.

Figure 15A:
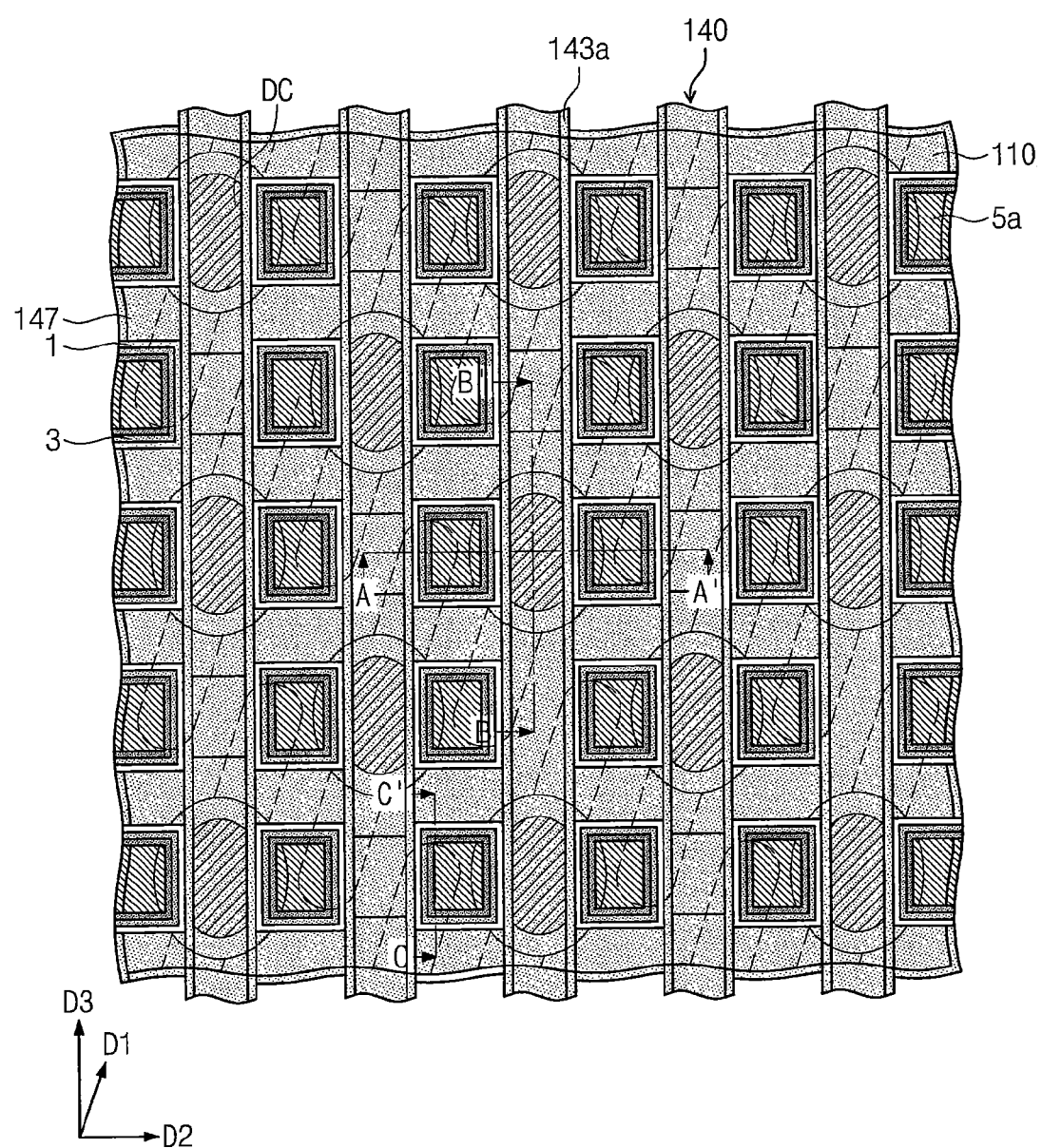
Figure 15B:
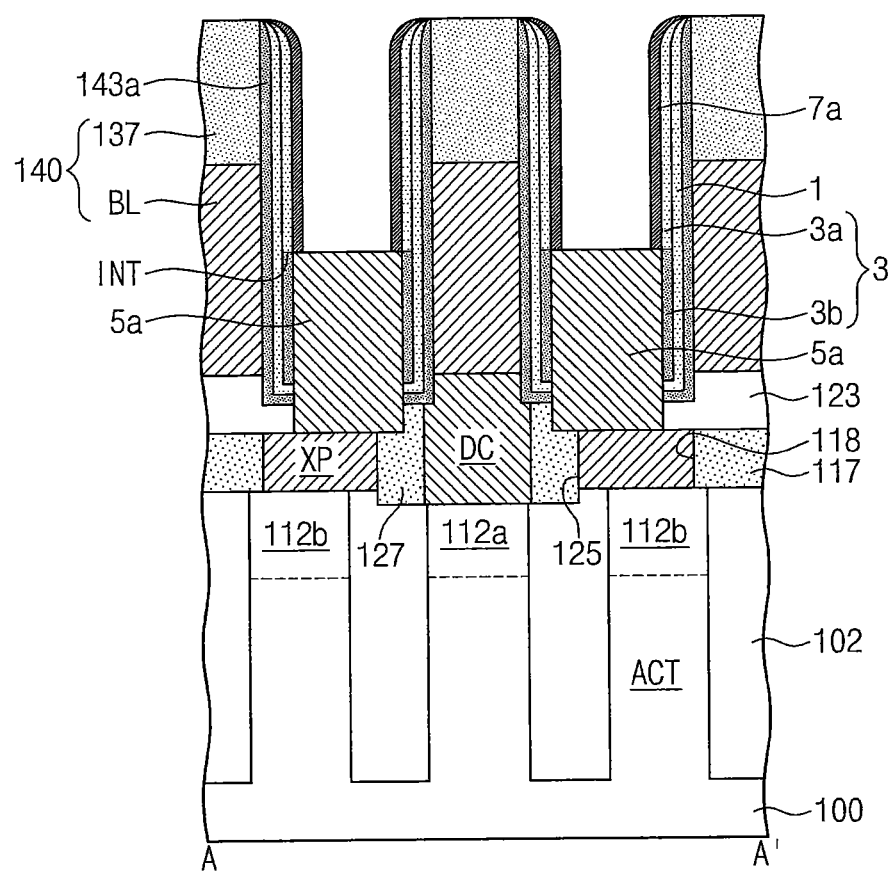
Figure 15C:
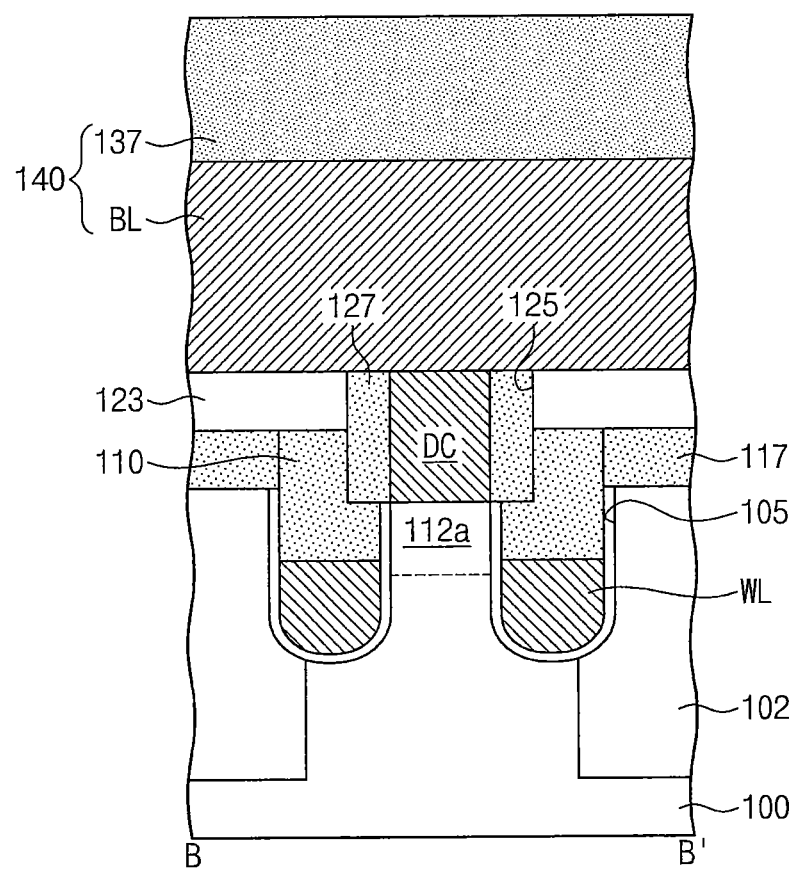

FIGS. 4A to 15A and 17A to 19A are plan views illustrating a method of manufacturing a semiconductor device according to some embodiments of the inventive concepts. FIGS. 4B to 15B and 17B to 19B are cross-sectional views taken along lines A-A' of FIGS. 4A to 15A and 17A to 19A, respectively. FIGS. 4C to 15C and 17C to 19C are cross-sectional views taken along lines B-B' of FIGS. 4A to 15A and 17A to 19A, respectively. FIGS. 4D to 15D and 17D to 19D are cross-sectional views taken along lines C-C' of FIGS. 4A to 15A and 17A to 19A, respectively. FIGS. 13E and 13F are enlarged views of a portion 'P1' of FIG. 13B according to embodiments of the inventive concepts. FIG. 16A is a cross-sectional view taken along a line A-A' of FIG. 15A. FIG. 16B is a cross-sectional view taken along a line B-B' of FIG. 15A. FIG. 16C is a cross-sectional view taken along a line C-C' of FIG. 15A.

Referring to FIGS. 4A, 4B, 4C, and 4D, a device isolation pattern 102 may be formed in or on a substrate 100 to define active portions ACT. A device isolation trench may be formed in the substrate 100 and the device isolation pattern 102 may be formed to fill the device isolation trench. The active portions ACT may be arranged as described with reference to FIGS. 1A to 1E. The active portions ACT and the device isolation pattern 102 may be patterned to form recess regions 105. The recess regions 105 cross the active portions ACT. A pair of recess regions 105 may cross each of the active portions ACT. As illustrated in FIG. 4A, each of the active portions ACT may be divided into a first source/drain region SDR1 and a pair of second source/drain regions SDR2 by the pair of recess regions 105. The first source/drain region SDR1 may be defined between the pair of recess regions 105. The pair of second source/drain regions SDR2 may be defined in both edge regions of each active portion ACT, respectively. A gate dielectric layer 107 may be disposed on inner surfaces of the recess regions 105. The gate dielectric layer 107 may be formed by a thermal oxidation process, a chemical vapor deposition (CVD) process and/or an atomic layer deposition (ALD) process.

Next, a gate conductive layer may be formed to fill the recess regions 105. The gate conductive layer may be etched to form word lines WL in the recess regions 105, respectively. Top surfaces of the word lines WL may be recessed to be lower than top surfaces of the active portions ACT. In some embodiments, a bottom surface of the recess region 105 in the device isolation pattern 102 may be lower than a bottom surface of the recess region 105 in the active portion ACT, as illustrated in FIG. 1E. Thus, the word line WL may cover a top surface and both sidewalls of the recessed portion of the active portion ACT.

Referring to FIGS. 5A, 5B, 5C, and 5D, a capping insulating layer may be formed on the substrate 100. The capping insulating layer may fill the recess regions 105 on the word lines WL. The capping insulating layer may be patterned to form gate capping insulating patterns 110 on the word lines WL, respectively. The gate capping insulating patterns 110 may fill the recess regions 105 on the word lines WL and may protrude to be higher than the top surfaces of the active portions ACT. The gate capping insulating patterns 110 extend in parallel to the word lines WL.

In some embodiments, the protruding portions of the gate capping insulating patterns 110 may have a substantially same width as the recess regions 105. In other embodiments, the width of the protruding portion of the gate capping insulating pattern 110 may be less than the width of the recess region 105. In still other embodiments, the width of the protruding portion of the gate capping insulating pattern 110 may be greater than the width of the recess region 105.

Dopants may be injected using the gate capping insulating patterns 110 as masks into the active portions ACT to form first and second doped regions 112a and 112b. The first doped region 112a and the second doped regions 112b may be formed in the first source/drain region SDR1 and the second source/drain regions SDR2 of each active portion ACT, respectively.

A first filling layer may be formed on an entire surface of the substrate 100. The first filling layer may be planarized until the gate capping insulating patterns 110 are exposed, thereby forming first filling line patterns. Each of the first filling line patterns may be formed between the protruding portions of the gate capping insulating patterns 110 adjacent to each other. Subsequently, the first filling line patterns may be patterned to form first concave regions and first filling patterns 115. The first filling patterns 115 are spaced apart from each other by the first concave regions. The first concave regions may be formed between the protruding portions of the gate capping insulating patterns 110. A first fence insulating layer filling the first concave regions may be formed on the substrate 100. The first fence insulating layer may be planarized until the first filling patterns 115 are exposed, thereby forming lower insulating fences 117.

Figure 5A:
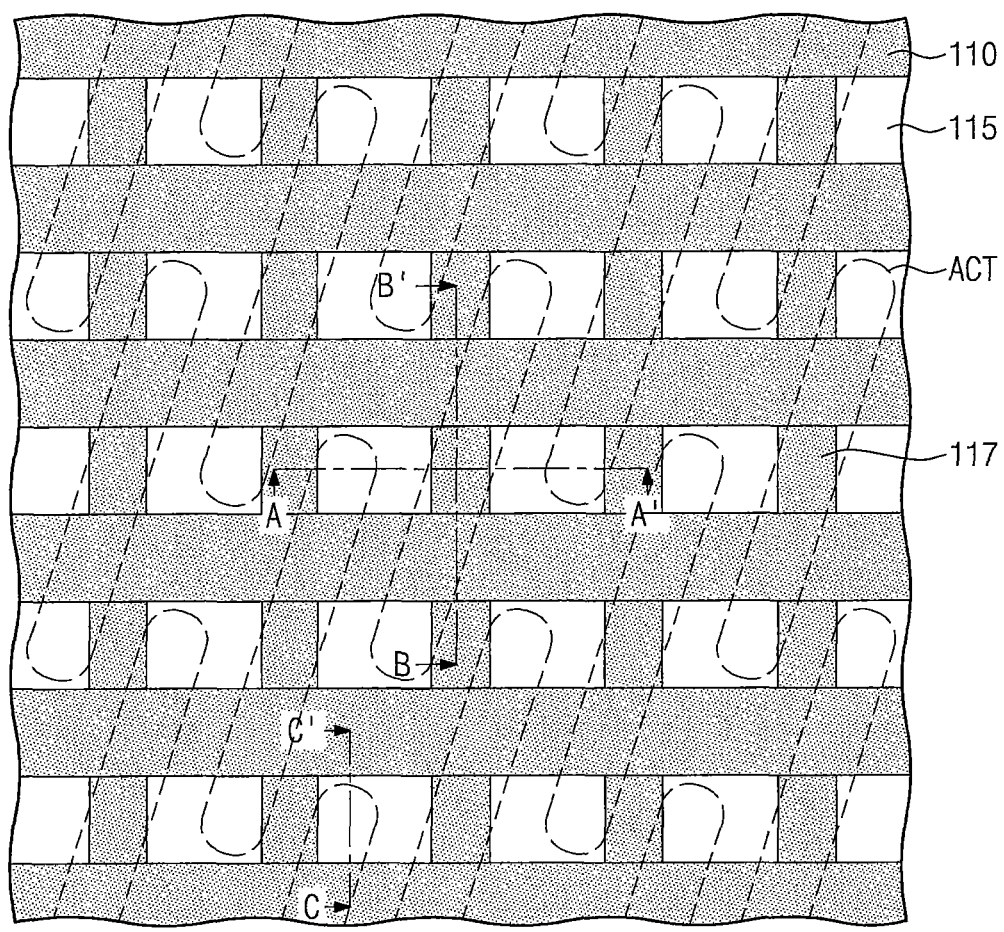
Figure 5A:
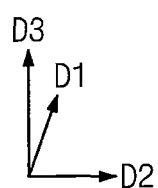
Figure 5B:
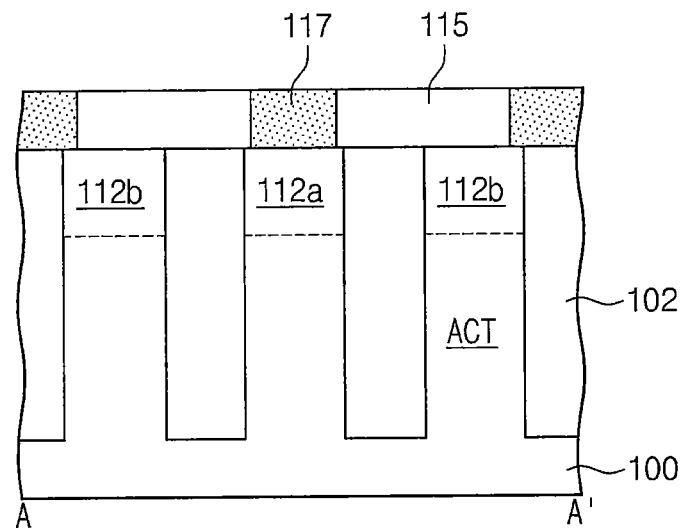
Figure 5C:
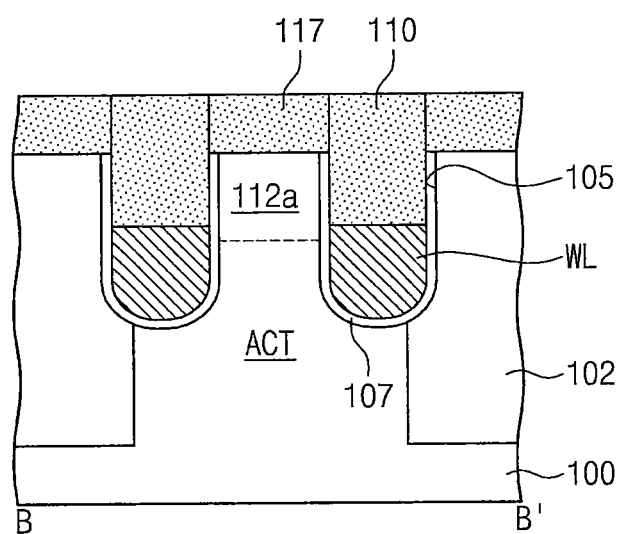
Figure 5D:
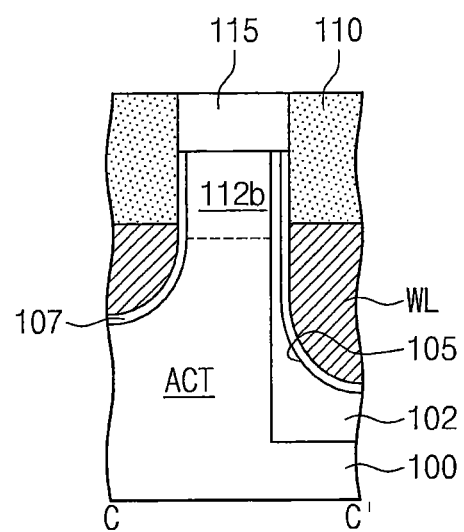
Figure 6A:
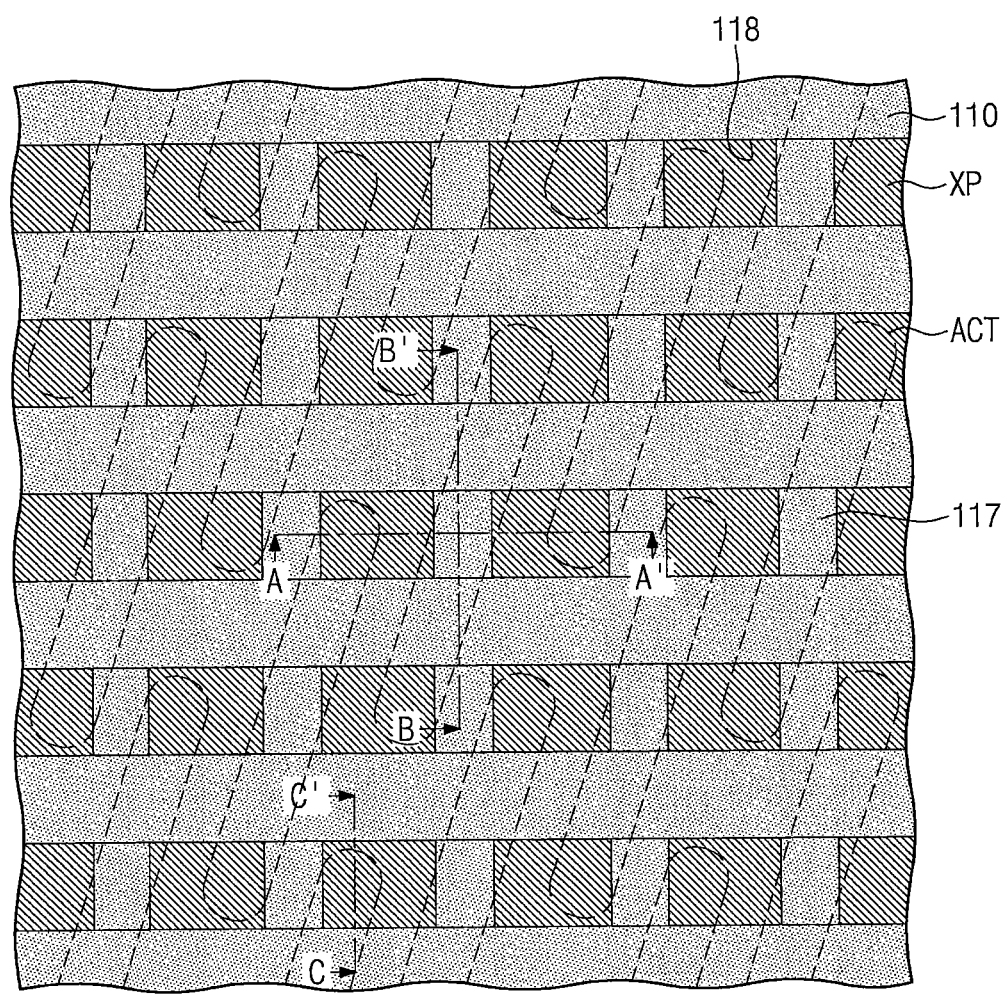
Figure 6B:
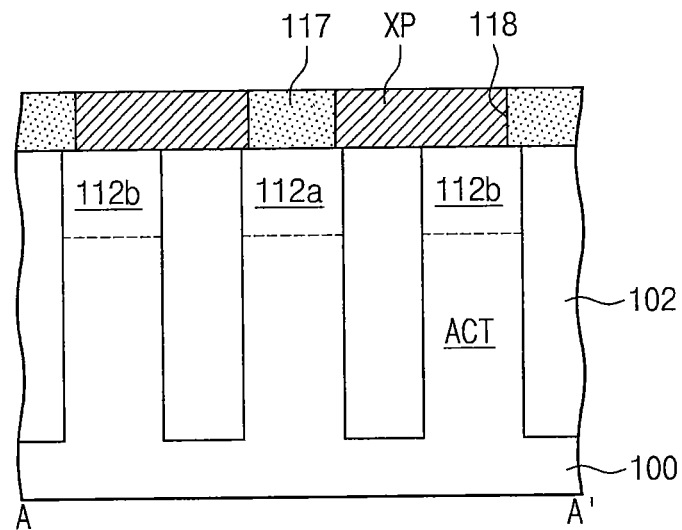
Figure 6C:
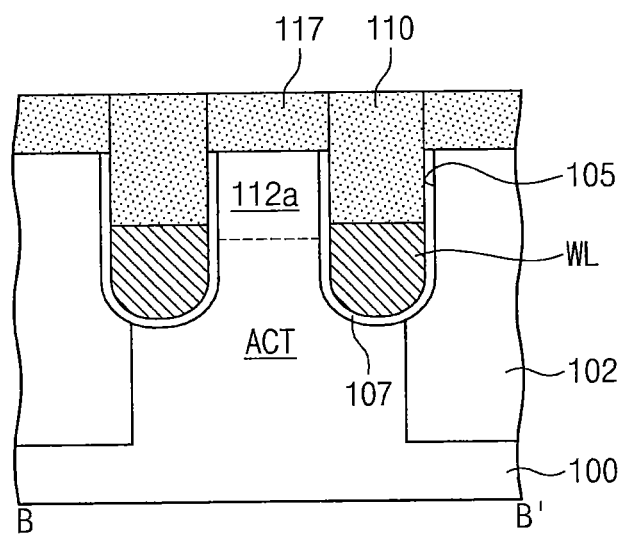
Figure 6D:
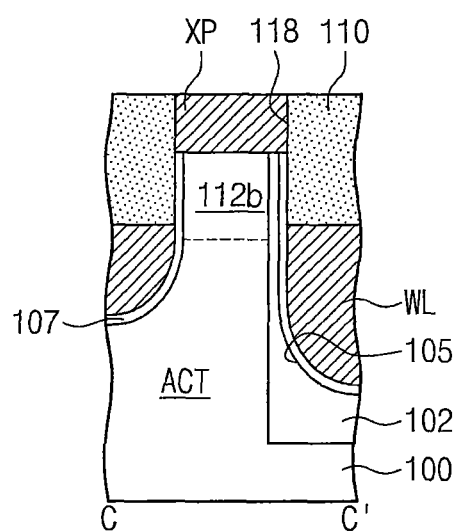
Figure 7A:
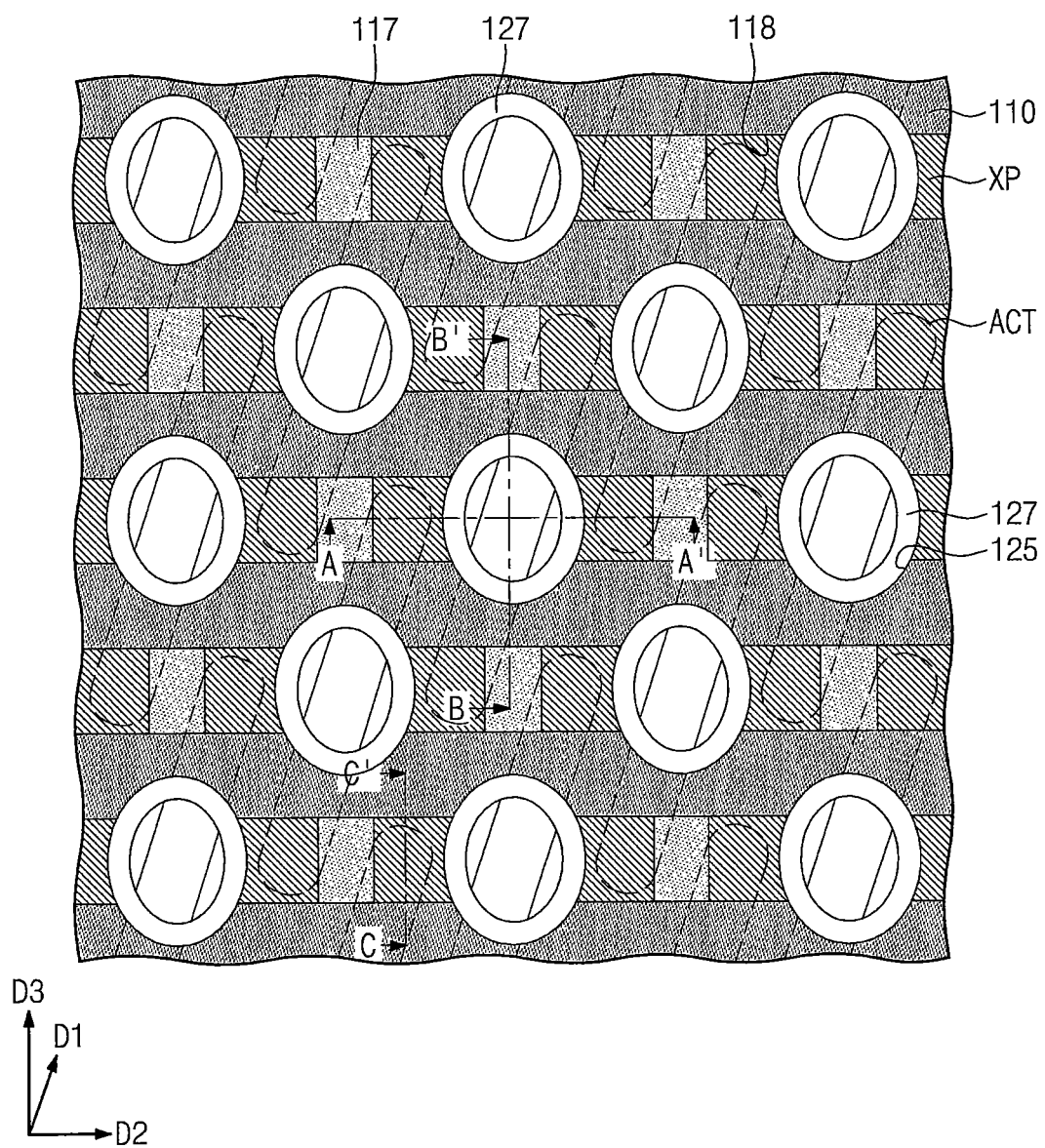
Figure 7B:
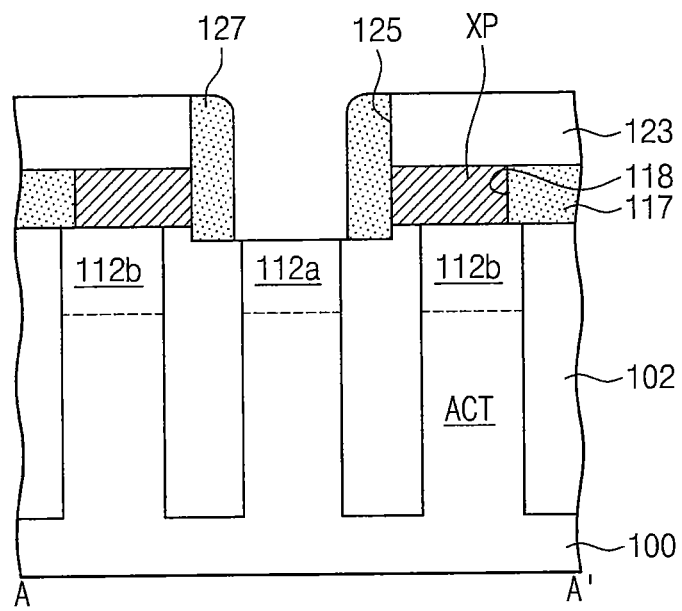
Figure 7C:
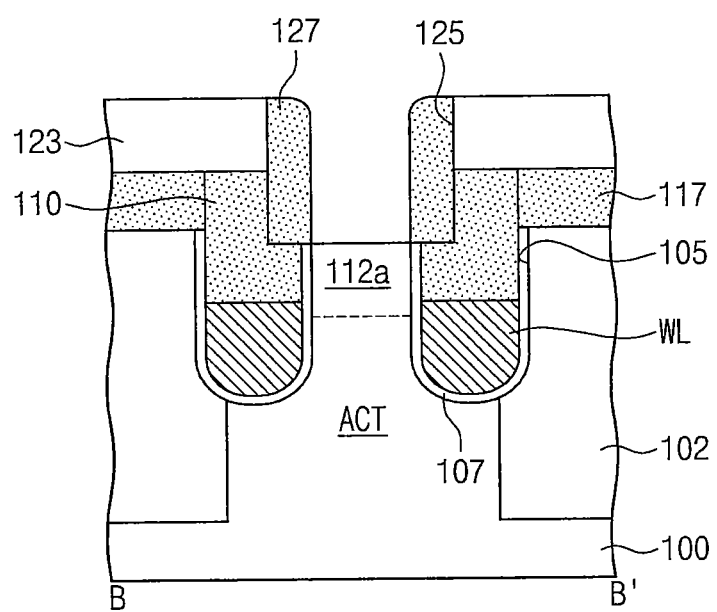
Figure 7D:
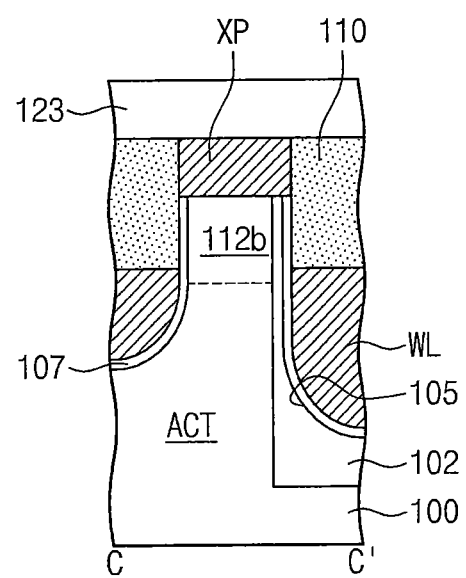

As illustrated in FIG. 5A, the lower insulating fences may be two-dimensionally arranged along rows and columns when viewed from a plan view. Each of the first filling patterns 115 may be disposed between the protruding portions of a pair of the gate capping insulating patterns 110 adjacent to each other and between a pair of the lower insulating fences 117 adjacent in the second direction D2 to each other. The first filling patterns 115 may be disposed on at least portions of the second doped regions 112b. Some of the lower insulating fences 117 may be disposed on the first doped regions 112b, respectively. The others of the lower insulating fences 117 may be disposed on the device isolation pattern 102.

The first filling patterns 115 may be formed of a material having an etch selectivity with respect to the lower insulating fences 117 and the gate capping insulating patterns 110. For example, the first filling patterns 115 may be formed of silicon oxide, and the lower insulating fences 117 and the gate capping insulating patterns 110 may be formed of silicon nitride and/or silicon oxynitride.

Referring to FIGS. 6A, 6B, 6C, and 6D, the first filling patterns 115 may be removed to form openings 118 exposing the second doped regions 112b. In some embodiments, each of the openings 118 may also expose a portion of the first doped region 112a of a neighboring active portion ACT adjacent to the second doped region 112b.

A first conductive layer filling the openings 118 may be formed on the substrate 100. The first conductive layer may be planarized until the lower insulating fences 117 and the gate capping insulating patterns 110 are exposed, thereby forming storage node pads XP. The storage node pads XP may be connected to the second doped regions 112b, respectively. In some embodiments, each of the storage node pads XP may be in contact with an edge of the first doped region 112a of the neighboring active portion ACT adjacent to the second doped region 112b.

Referring to FIGS. 7A, 7B, 7C, and 7D, a first interlayer insulating layer 123 may be formed on the entire surface of the substrate 100. The first interlayer insulating layer 123 may be patterned to form interconnection-contact holes 125 respectively exposing the first doped regions 112a. A mask pattern (not shown) may be formed on the first interlayer insulating layer 123. The mask pattern may include mask-openings defining the interconnection-contact holes 125. A width in the second direction D2 of each mask-Opening is greater than a width in the second direction D2 of the lower insulating fence 117 disposed on the first doped region 112a. A width in the third direction D3 of each mask-opening may be greater than a distance between the pair of gate capping insulating patterns 110 adjacent to each other. An etching process may be performed using the mask pattern as an etch mask to etch the first interlayer insulating layer 123, the lower insulating fences 117 and the storage node pads XP on the first doped regions 112a, and the portions of the gate capping insulating patterns. Thus, the interconnection-contact holes 125 may be formed. In some embodiments, sidewalls of the storage node pads XP may be exposed at sidewalls of the interconnection-contact holes 125. Since the interconnection-contact holes 124 are formed, the first doped regions 112a may be spaced apart from the storage node pads XP.

Subsequently, an insulating spacer layer may be conformally formed on the substrate 100. The insulating spacer layer may be blanket-anisotropically etched to form insulating spacers 127 on the sidewalls of the interconnection-contact holes 125, respectively.

Referring to FIGS. 8A, 8B, 8C, and 8D, a second conductive layer may be formed on the substrate 100 to fill the interconnection-contact holes 125. The second conductive layer may be planarized until the first interlayer insulating layer 123 is exposed, thereby forming bit line contact plugs DC in the interconnection-contact holes 125, respectively. The bit line contact plugs DC are connected to the first doped regions 112a, respectively. The bit line contact plugs DC are electrically insulated from the storage node pads XP by the insulating spacers 127.

Referring to FIGS. 9A, 9B, 9C, and 9D, a third conductive layer and a hardmask layer may be sequentially formed on the substrate 100. The hardmask layer and the third conductive layer may be successively patterned to form line patterns 140. The line patterns 140 may extend in parallel to the third direction D3. Each of the line patterns 140 may include a bit line BL and a hardmask pattern 137 that are sequentially stacked. Each of the bit lines BL may be connected to the bit line contact plugs DC arranged in the third direction D3. Upper portions of the first interlayer insulating layer 123, the insulating spacers 127 and the bit line contact plugs DC may be partially etched when the line patterns 140 are formed.

Referring to FIGS. 10A, 10B, 10C, and 10D, a first spacer layer 143 may be conformally formed on the substrate 100 after the formation of the line patterns 140. A second filling layer may be formed on the first spacer layer 143. The second filling layer may fill spaces between the line patterns 140. The second filling layer may be planarized to form second filling line patterns. The second filling line patterns may fill the spaces between the line patterns 140, respectively. The first spacer layer 143 on top surfaces of the line patterns 140 may be removed during the planarization process of the second filling layer. However, the first spacer layer 143 under the second filling line patterns may remain. The first spacer 143 may be formed to have a substantially uniform thickness on both sidewalls of the line patterns 140 and the first interlayer insulating layer 123 disposed between the line patterns 140. The first spacer layer 143 protects sidewalls of the line patterns 140. In particular, the first spacer layer 143 protects sidewalls of the bit lines BL.

The first spacer layer 143 is formed of an insulating material. The second filling layer may be formed of a material having an etch selectivity with respect to the hardmask patterns 137 and the first spacer layer 143. For example, the second filling layer may be formed of silicon oxide, and the first spacer layer 143 and the hardmask patterns 137 may be formed of silicon nitride and/or silicon oxynitride.

The second filling line patterns may be patterned to form second concave regions and second filling patterns 145 between the line patterns 140. The second filling patterns 145 are spaced apart from each other by the second concave regions. The second concave regions may expose the first spacer layer 143. The second filling patterns 145 may be disposed over the storage node pads XP, respectively. A second fence insulating layer may be formed to fill the second concave regions on the substrate 100. The second fence insulating layer may be planarized until the second filling patterns 145 are exposed, thereby forming upper insulating fences 147.

Each of the second filling patterns 145 is disposed between a pair of the upper insulating fences 147 adjacent in the third direction D3 to each other. The upper insulating fences 147 may be formed of an insulating material an etch selectivity with respect to the second filling patterns 145. For example, the upper insulating fences 147 may be formed of silicon nitride and/or silicon oxynitride.

Referring to FIGS. 11A, 11B, 11C, and 11D, the second filling patterns 145 may be removed to form guide holes 150. The guide holes 150 may be disposed over the storage node pads XP, respectively. Each of the guide holes 150 may have a quadrilateral shape when viewed from a plan view.

A sacrificial spacer layer may be conformally formed on the substrate 100 having the guide holes 150, and a second spacer layer may be conformally formed on the sacrificial spacer layer. Next, the second spacer layer, the sacrificial spacer layer and the first spacer layer may be anisotropically etched to form contact holes 157, first spacers 143a, sacrificial spacers 1, and second spacers 3. A sidewall of each of the second spacers 3 may be damaged by the anisotropic etching process.

The first spacer 143a may be formed to have a linear shape extending along a sidewall of each line pattern 140. An extending portion 143r of the first spacer 143 may remain between the upper insulating fence 147 and the first interlayer insulating layer 123. The sacrificial spacer 1 and the second spacer 3 may be sequentially stacked on an inner sidewall of each guide hole 150. Each of the contact holes 157 may be surrounded by the sacrificial spacer 1 and the second spacer 3. The first interlayer insulating layer 123 under the contact holes 157 may be anisotropically etched to expose the storage node pads XP. In some embodiments, top ends of the sacrificial spacers 1 may be exposed.

The second spacer 3, the first spacer 143a, and the hardmask pattern 137 and the upper insulating fence 147 may be formed of an insulating material having an etch selectivity with respect to the sacrificial spacer 1. For example, the second spacer 3, the first spacer 143a, and the hardmask pattern 137 and the upper insulating fence 147 may be formed of silicon nitride and/or silicon oxynitride, and the sacrificial spacer 1 may be formed of silicon oxide or poly-silicon.

Figure 11A:
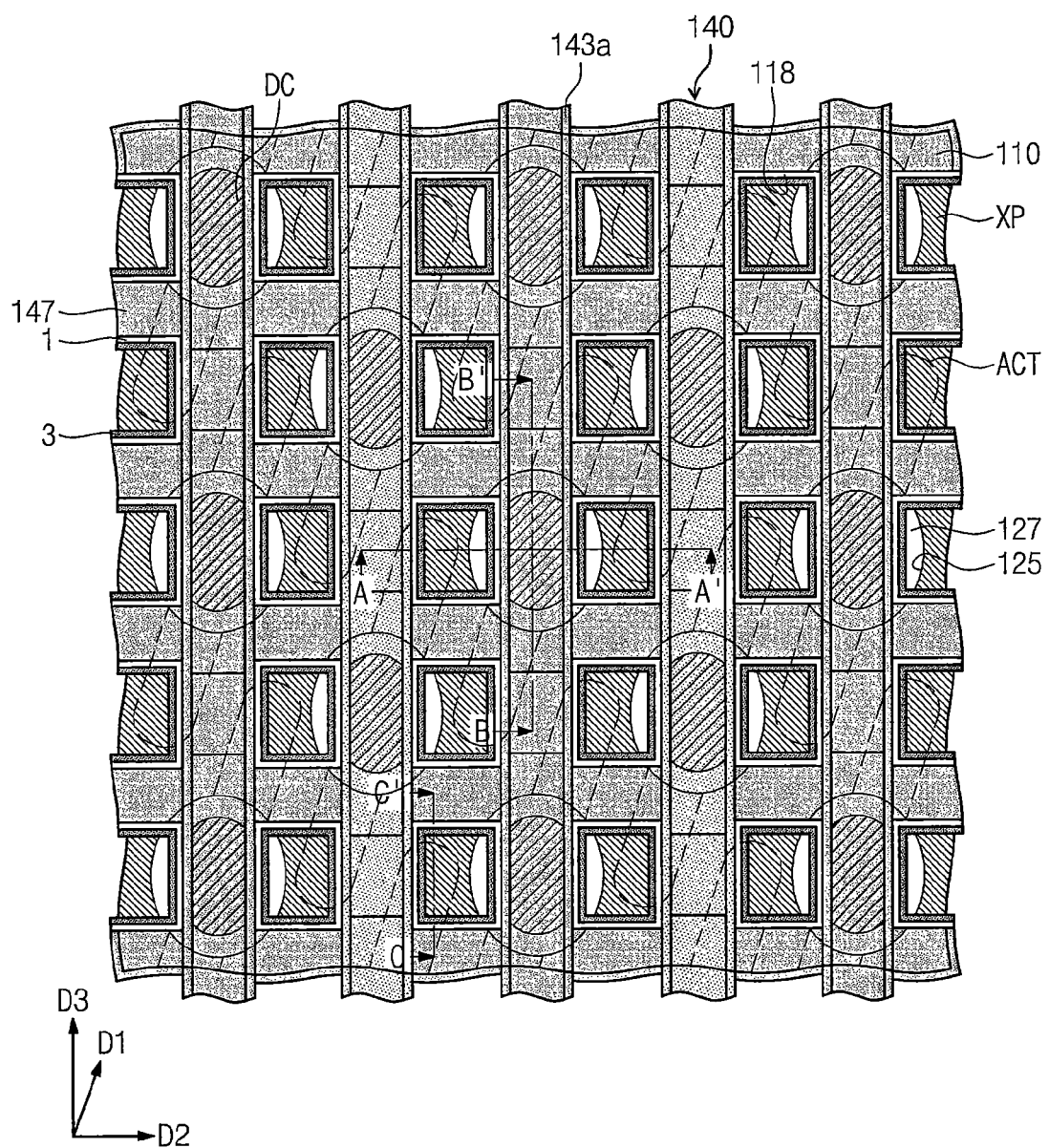
Figure 11B:
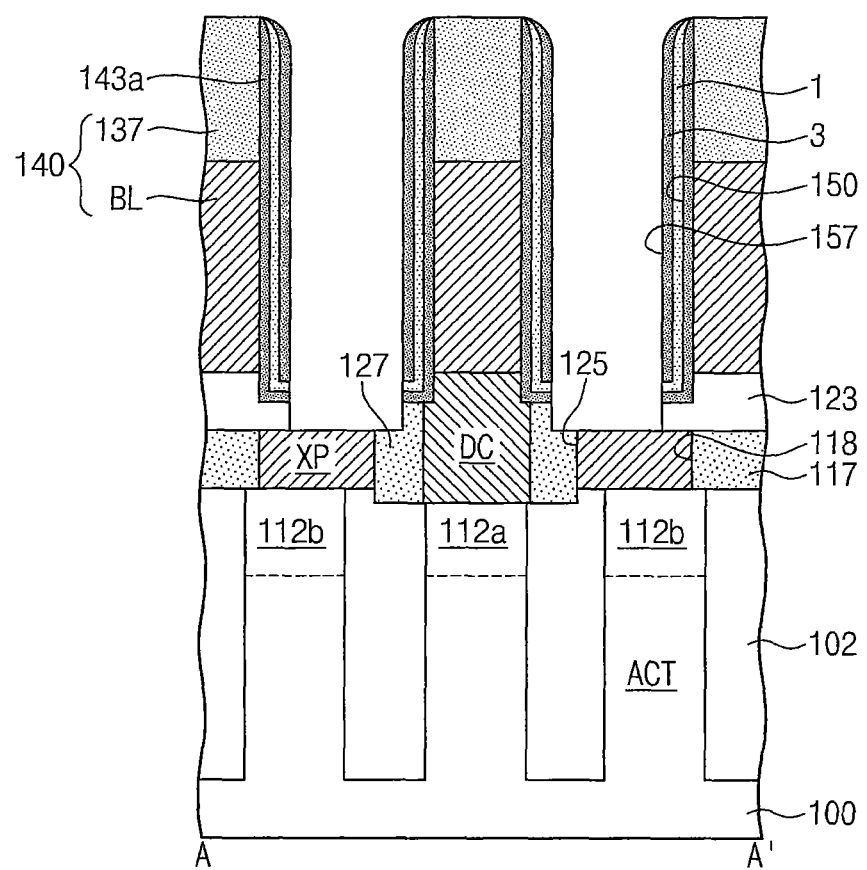
Figure 11C:
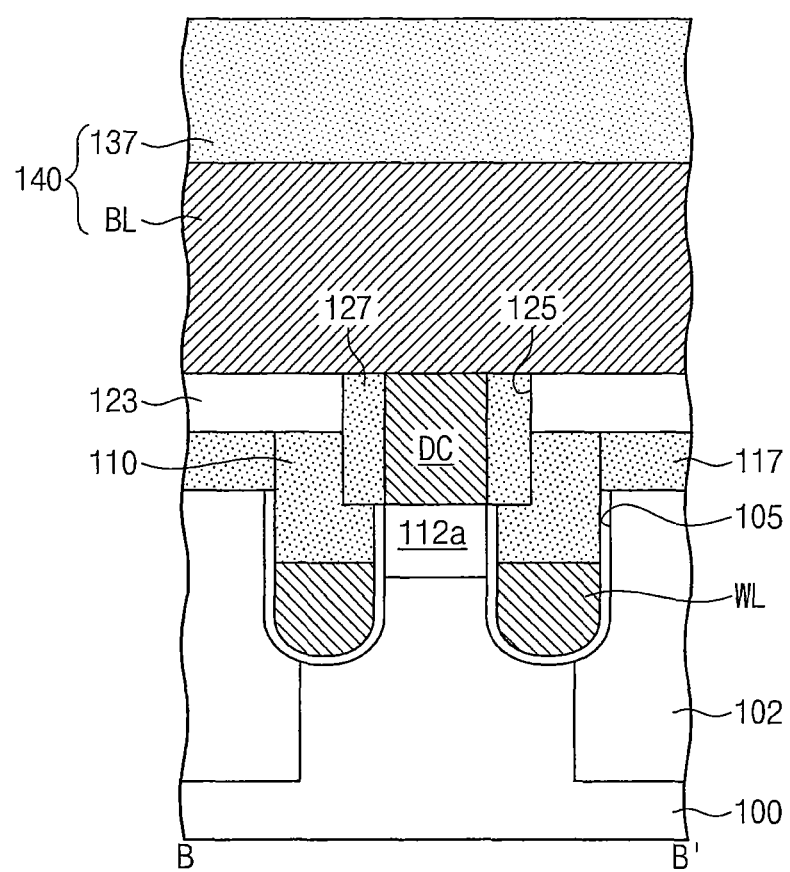
Figure 11D:
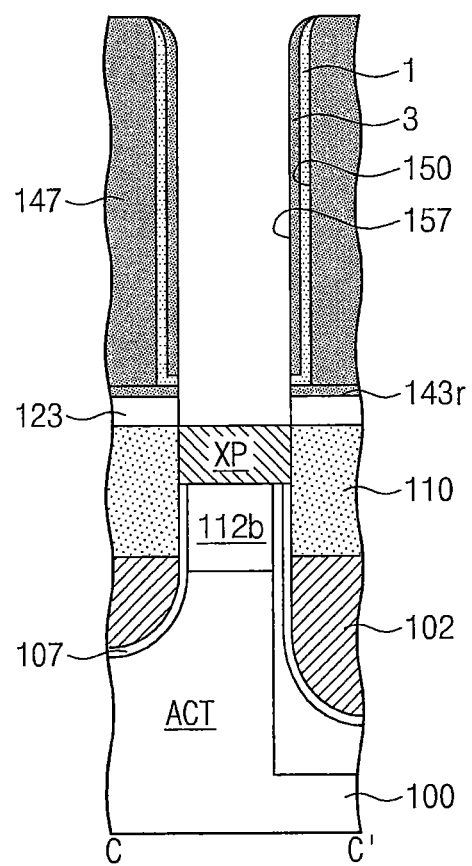

FIG. 11D may also be regarded as illustrating a method of manufacturing a semiconductor device according to various embodiments of the inventive concepts, In these embodiments, the method includes forming a region on a substrate 100, wherein the region may be embodied by the upper insulating fence 147. The region includes a sidewall. A first spacer, which may be embodied by the second spacer 3, is formed to extend on the sidewall, the first spacer including a sacrificial layer, which may be embodied by the sacrificial spacer 1, having a first end adjacent the substrate 100 and a second end remote from the substrate 100.

Referring to FIGS. 12A, 12B, 12C, and 12D, a poly-silicon layer 5 may be formed to fill the contact holes 157 on the substrate 100. The poly-silicon layer 5 may be doped with dopants. The poly-silicon layer 5 may be formed using a chemical vapor deposition (CVD) process or a physical vapor deposition (PVD) process.

Referring to FIGS. 13A, 13B, 13C, 13D, 13E, and 13F, a first etching process may be performed on the first poly-silicon layer 5 to form a poly-silicon pattern 5 in a lower region of each contact hole 157. The first etching process may be an anisotropic etching process, for example, a blanket etch-back process. The first etching process may be performed using a fluorine-based etchant (e.g., $CF_4$ or $SF_6$) and/or a chlorine-based etchant (e.g., Cl2 or CCl4). A first portion 3a of the second spacer 3 is exposed but a second portion 3b of the second spacer 3 is not exposed by the first etching process. At this time, an etch byproduct BP may remain near to an interface INT of the first portion 3a and the second portion 3b, as illustrated in FIG. 13E. The etch byproduct BP may include a silicon-fluorine compound, a silicon-chlorine compound, a silicon-sulfur compound, and/or a silicon-sulfur-fluorine compound according to a kind of the etchant. Even though not shown in the drawings, a natural oxide layer may be formed on the poly-silicon pattern 5a. The etch byproduct BP and the natural oxide layer may be mostly removed by a cleaning process. However, a very small amount of the etch byproduct BP and/or the natural oxide layer may remain.

Two anisotropic etching processes have been performed on the first portions 3a. In other words, the two anisotropic etching processes may include the anisotropic etching process for the formation of the second spacer 3 and the blanket etch-back process for the formation of the poly-silicon pattern 5a. On the other hand, one anisotropic etching process (i.e., the anisotropic etching process for the formation of the second spacer 3) has been performed on the second portion 3b. Thus, etch-damage of the first portion 3a may be greater than etch-damage of the second portion 3b such that a surface roughness of a sidewall S1 of the first portion 3a may be greater than a surface roughness of a sidewall S2 of the second portion 3b. Additionally, the etch byproduct BP and/or the natural oxide layer may be generated near to the interface INT between the first and second portions 3a and 3b. The interface INT may be the most damaged weak portion.

Figure 13A:
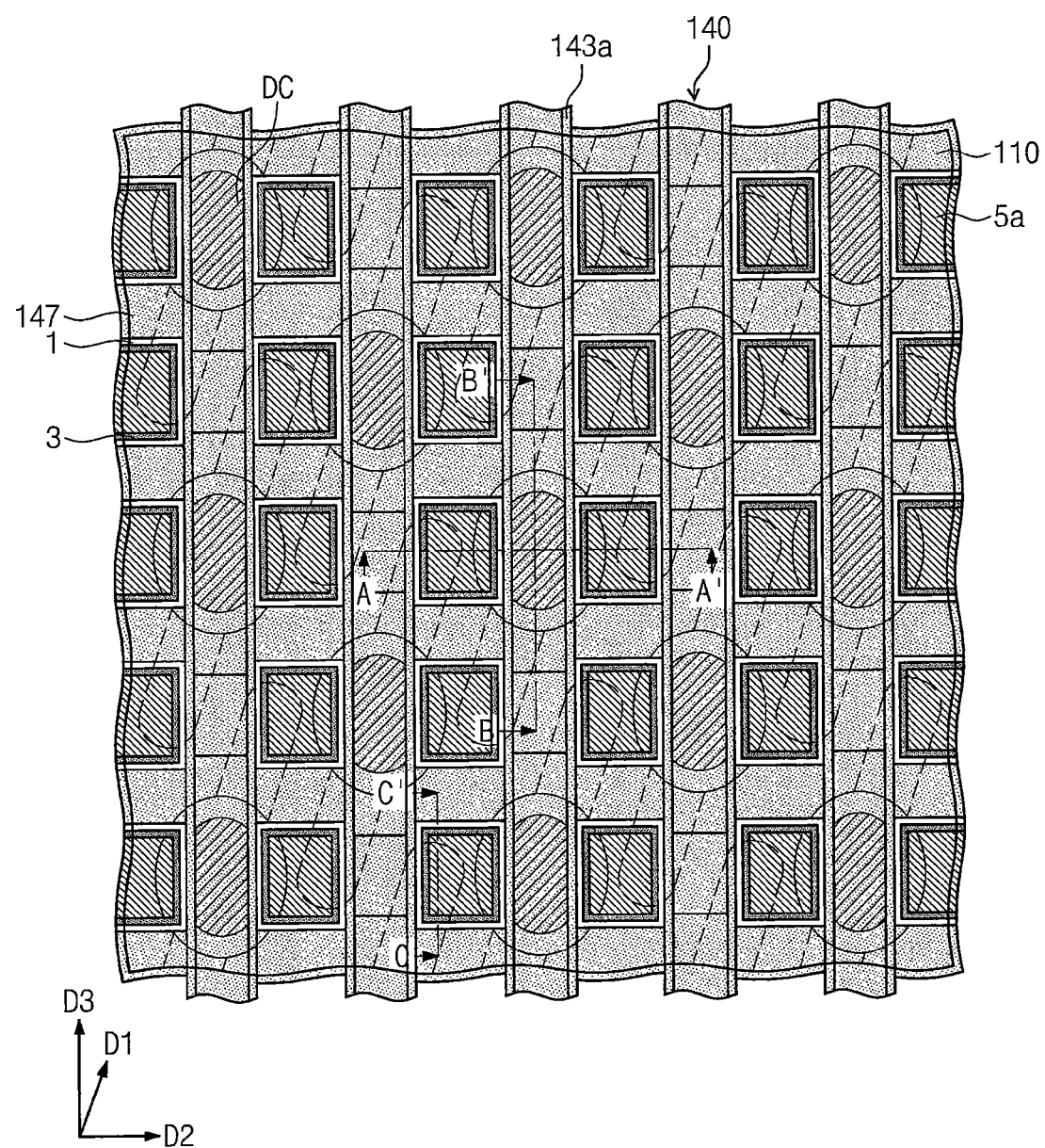
Figure 13B:
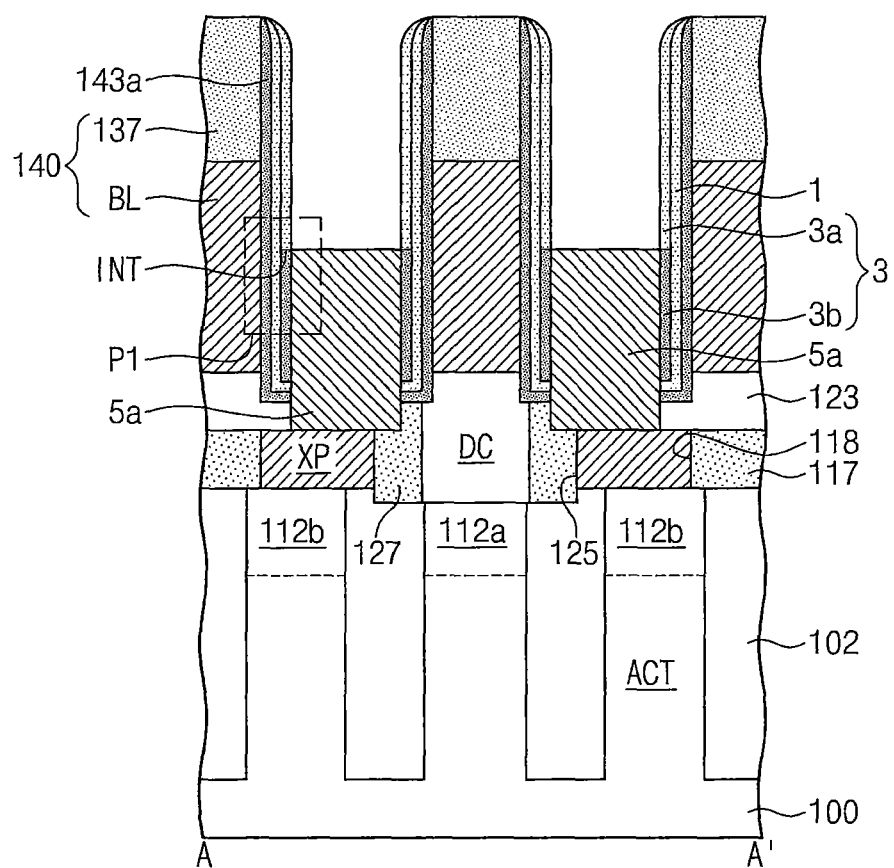
Figure 13C:
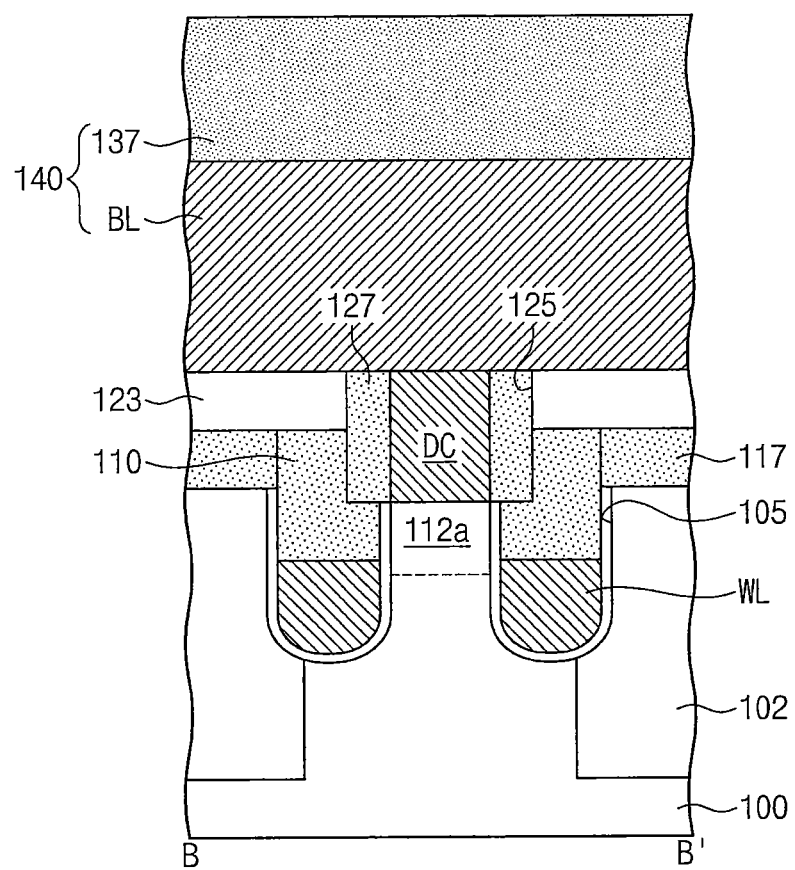
Figure 13D:
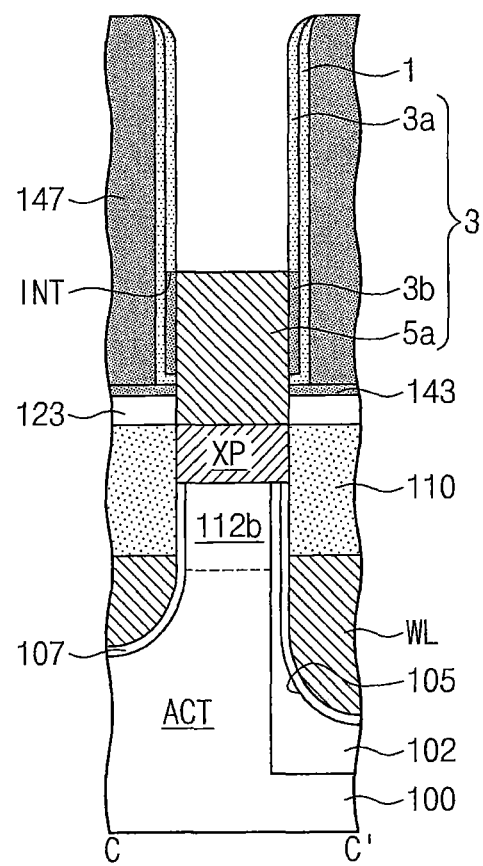

FIG. 13D may also be regarded as describing a method of manufacturing a semiconductor device according to various other embodiments of the inventive concepts that include forming a contact, which may be embodied by the poly-silicon pattern 5a, on a first spacer, which may be embodied by the second spacer 3, the contact having a first end adjacent the substrate 100 and a second end that is between the first and second ends of the first spacer.

Referring to FIGS. 14A, 14B, 14C, and 14D, a third spacer layer 7 is conformally formed on the entire surface of the substrate 100. The third spacer layer 7 may be formed of a material having an etch selectivity with respect to the sacrificial spacer 1. For example, the third spacer layer 7 may be formed of a silicon nitride layer.

Referring to FIGS. 15A, 15B, 15C, and 15D, an anisotropic etching process is performed on the third spacer layer 7 to form third spacers 7a. The third spacers 7a may prevent the first portions 3a of the second spacers 3 from being damaged in subsequent processes. The third spacers 7a are formed to expose top surfaces of the poly-silicon patterns 5a.

Figure 15D:
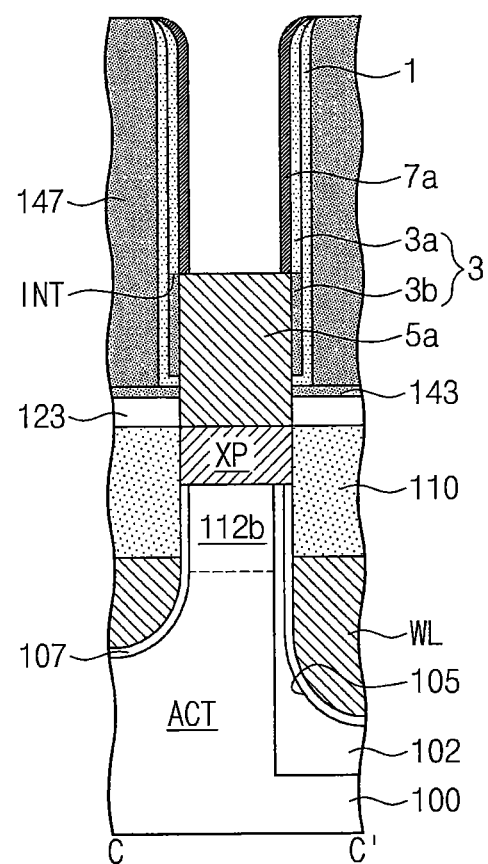
Figure 16A:
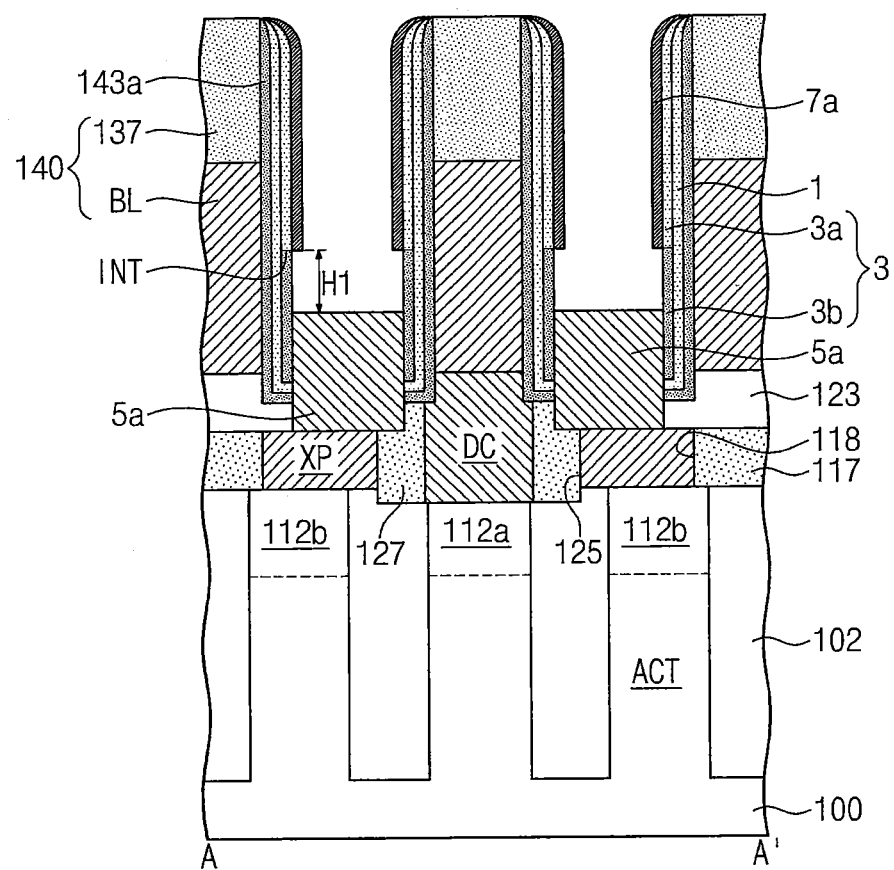
FIG. 16A is a cross-sectional view taken along a line A-A' of FIG. 15A.
Figure 16B:
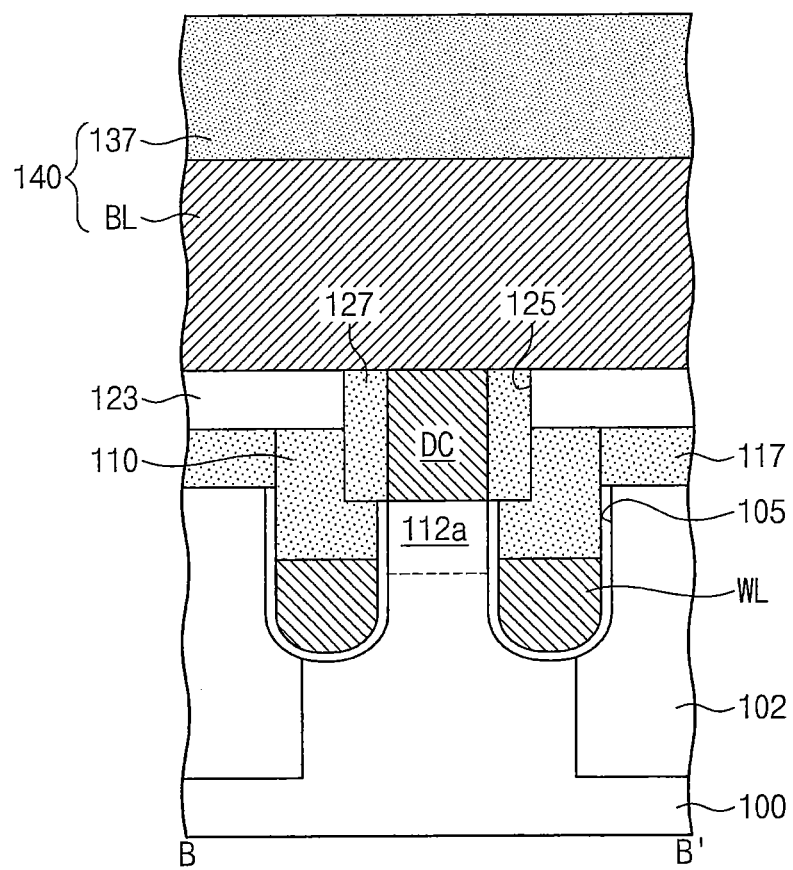
FIG. 16B is a cross-sectional view taken along a line B-B' of FIG. 15A.
Figure 16C:
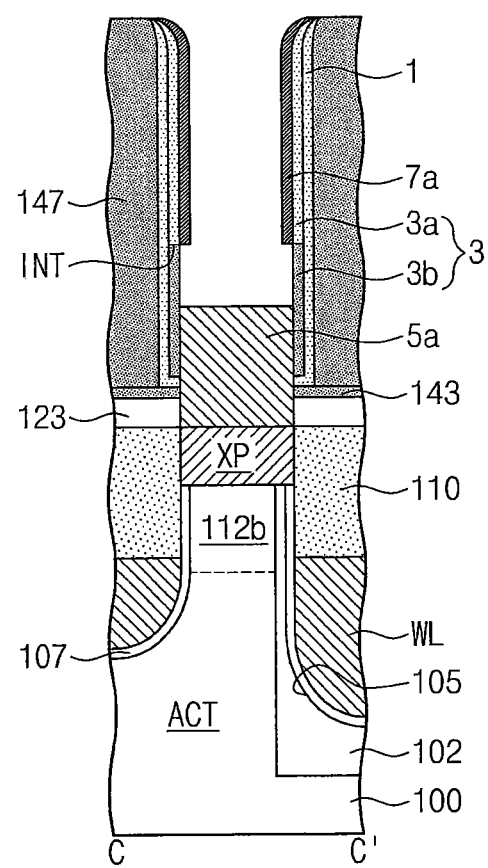
FIG. 16C is a cross-sectional view taken along a line C-C' of FIG. 15A.

FIG. 15D may also be regarded as illustrating a method of manufacturing a semiconductor device according to various other embodiments of the inventive concepts, wherein the method further comprises forming a second spacer, which may be embodied by the third spacer 7a, extending on a first spacer, which may be embodied by the second spacer 3, the second spacer having a second end adjacent the second end of the first spacer, and a first end that is adjacent the second end of the contact, which may be embodied by the poly-silicon pattern 5a.

Referring to FIGS. 16A, 16B, and 16C, a second etching process is performed on the poly-silicon patterns 5a to recess upper portions of the poly-silicon patterns 5a and to expose sidewalls of the second portions 3b of the second spacers 3 at the same time. The second etching process may be an isotropic etching process. The second etching process may be performed using a mixed solution of ammonia water and deionized water as an etchant. The etchant may not impact on an etch target but may etch the etch target by only chemical reaction of the etchant and the etch target during the isotropic etching process, unlike the anisotropic etching process. Thus, etch-damage caused by the isotropic etching process may be less than etch-damage caused by the anisotropic etching process. As a result, the etch-damage of the exposed sidewall of the second portion 3b caused by the isotropic etching process may be relatively slighter than the etch-damage caused by the anisotropic etching process.

FIG. 16C may also be regarded as illustrating a method of manufacturing a semiconductor device according to various embodiments of the inventive concepts, wherein the method further comprises recessing the second end of a contact, which may be embodied by the poly-silicon pattern 5a, so that it is spaced farther apart from a first end of a second spacer, which may be embodied by the third spacer 7a.

Referring to FIGS. 17A, 17B, 17C, and 17D, a metal layer is conformally formed on the entire surface of the substrate 100. A rapid thermal treatment process is performed to react the metal layer with an upper portion of the poly-silicon pattern 5a, thereby forming a metal silicide layer 9. An unreacted metal layer is removed. The metal silicide layer 9 may be formed of titanium silicide, cobalt silicide, nickel silicide, tungsten silicide, platinum silicide, and/or molybdenum silicide.

If the metal silicide layer 9 is formed on the poly-silicon pattern 5a in a state that the upper portion of the poly-silicon pattern 5a is not recessed after the formation of the third spacer 7a, a portion of the top surface of the poly-silicon pattern 5a may be covered by the third spacer 7a so that an area of an exposed top surface of the poly-silicon pattern 5a may be reduced. Thus, an area of the metal silicide layer 9 may be reduced to deteriorate a current flow characteristic of a semiconductor device. However, in the embodiment of the inventive concepts, the upper portion of the poly-silicon pattern 5a is recessed after the formation of the third spacer 7a such that the top surface of the recessed poly-silicon pattern 5a is spaced apart from the third spacer 7a. Thus, an area of the exposed top surface of the recessed poly-silicon pattern 5a may be increased to increase a formation area of the metal silicide layer 9. As a result, the current flow characteristic of the semiconductor device may be improved. For example, a drain current of the semiconductor device may be increased. A diffusion barrier layer 11 is conformally formed on the entire surface of the substrate 100. A metal-containing layer 13 is formed on the diffusion barrier layer 11 to fill the contact holes 157.

Figure 17A:
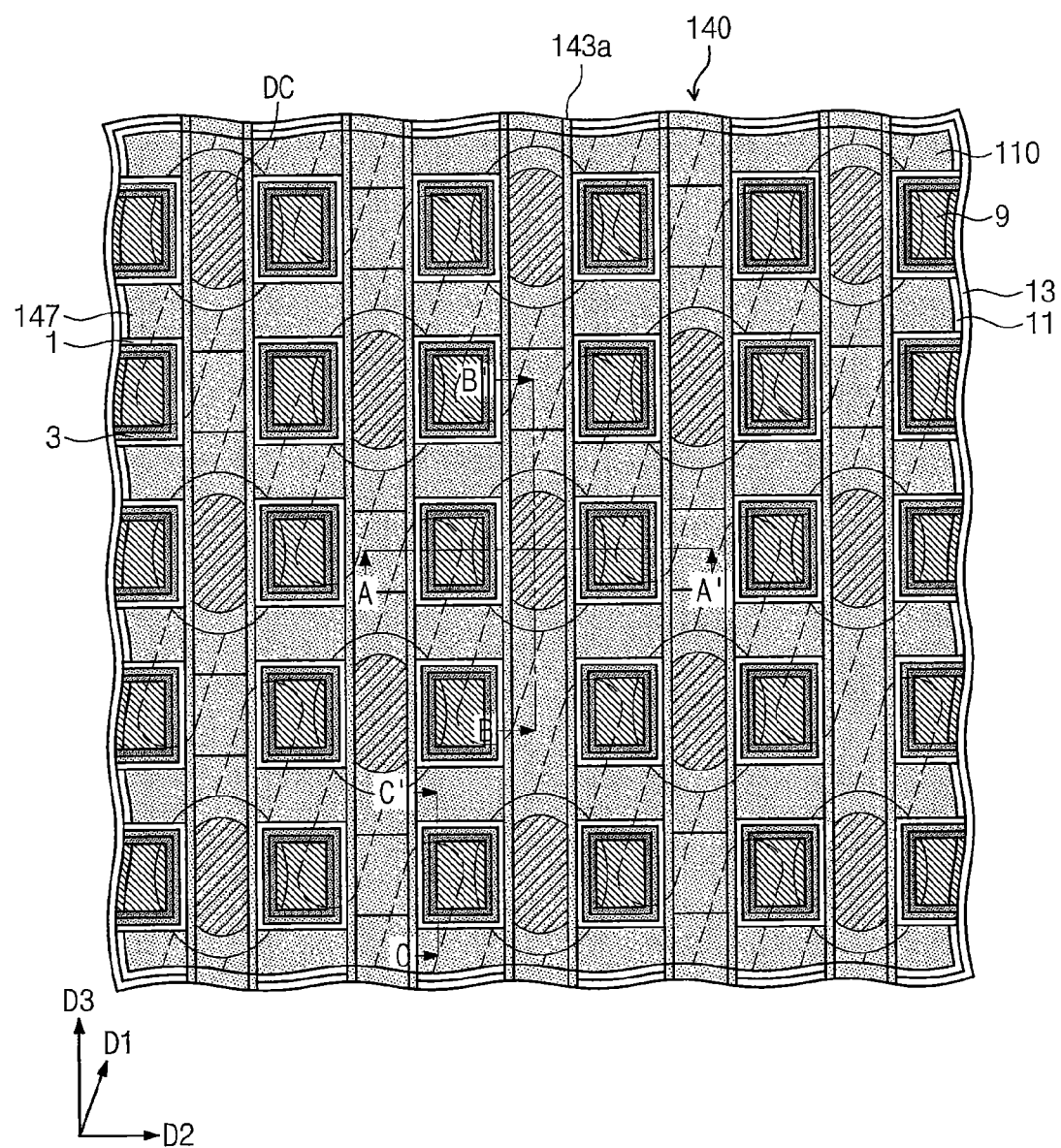
Figure 17B:
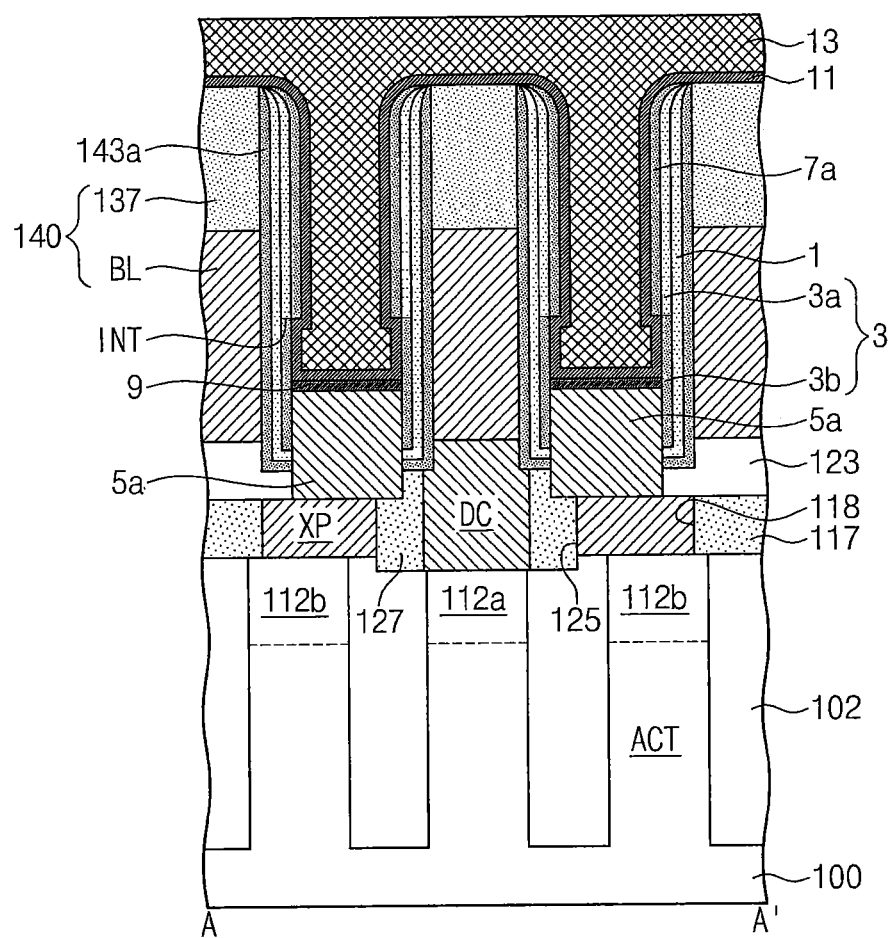
Figure 17C:
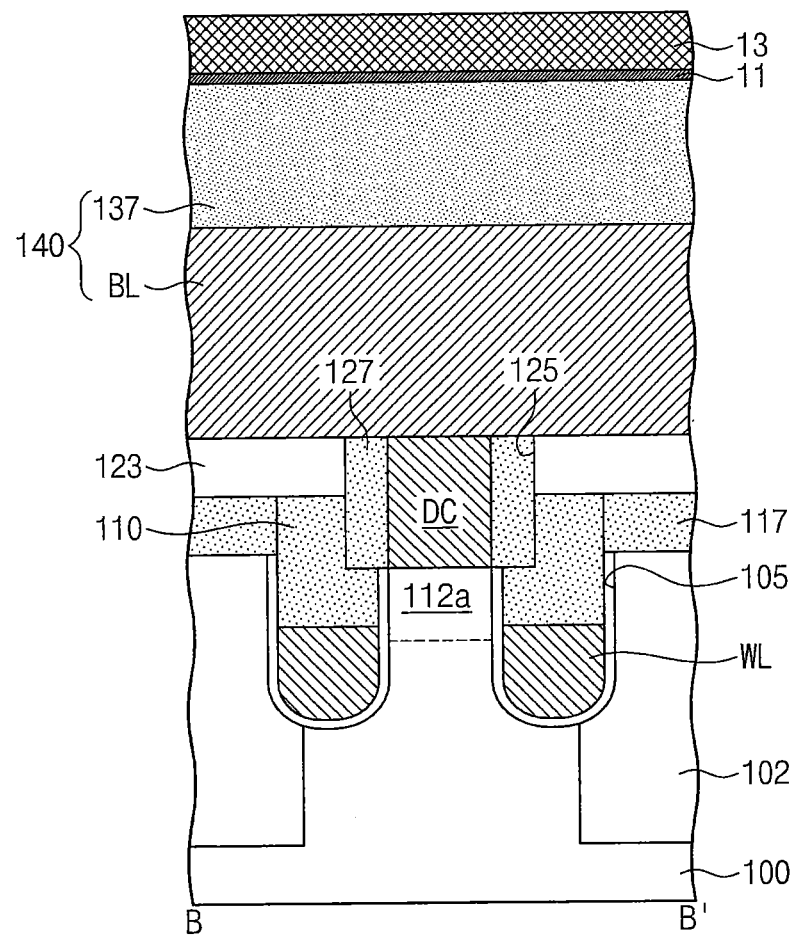
Figure 17D:
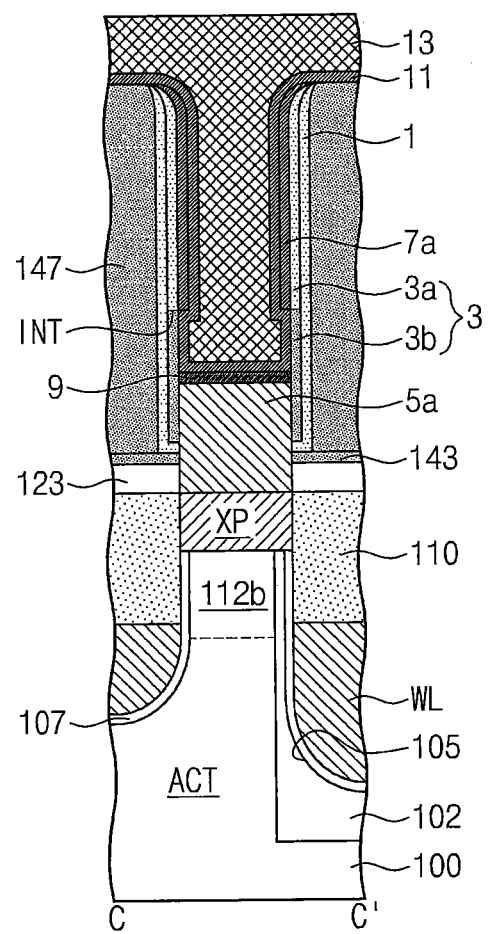
Figure 18A:
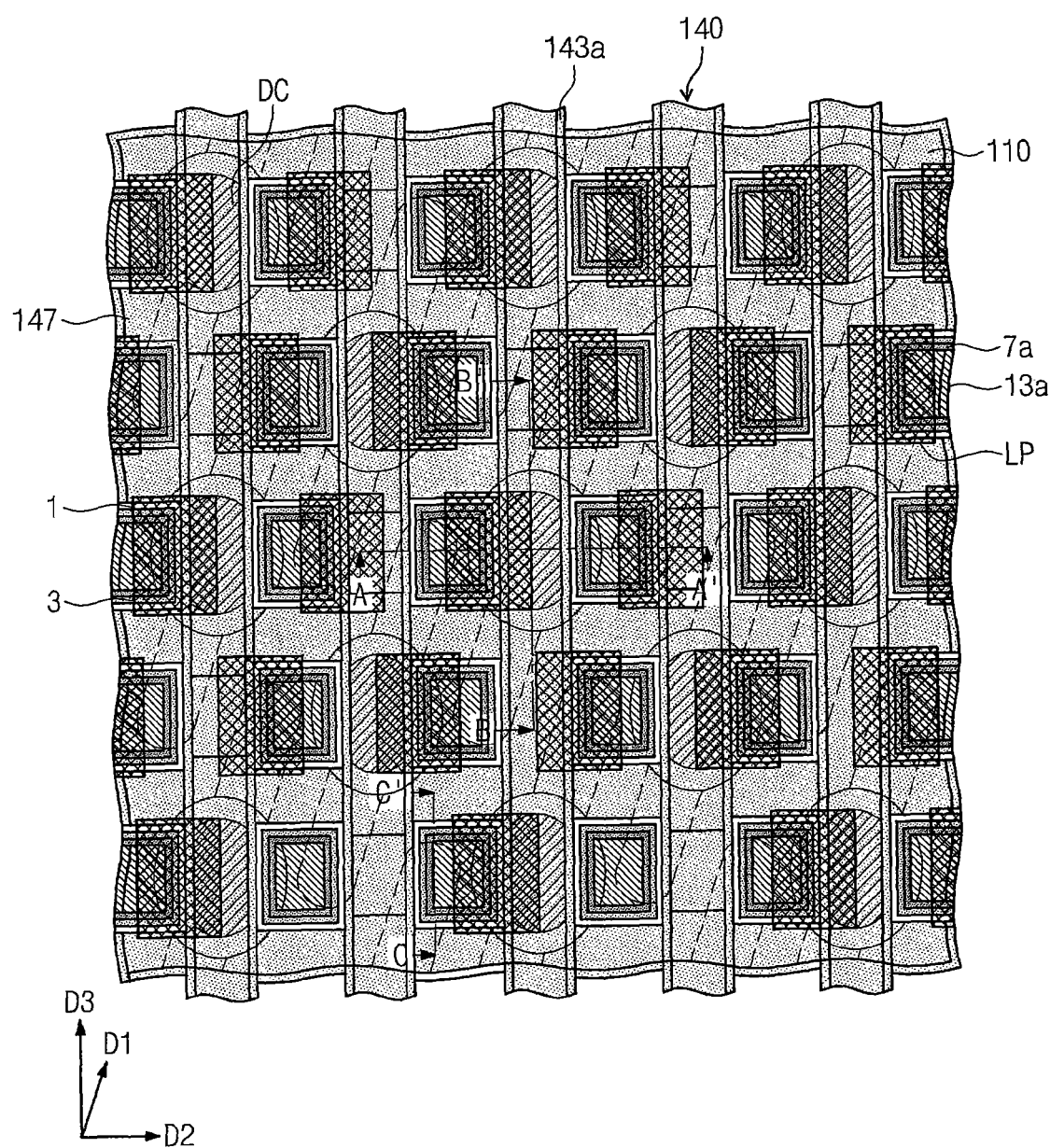
Figure 18B:
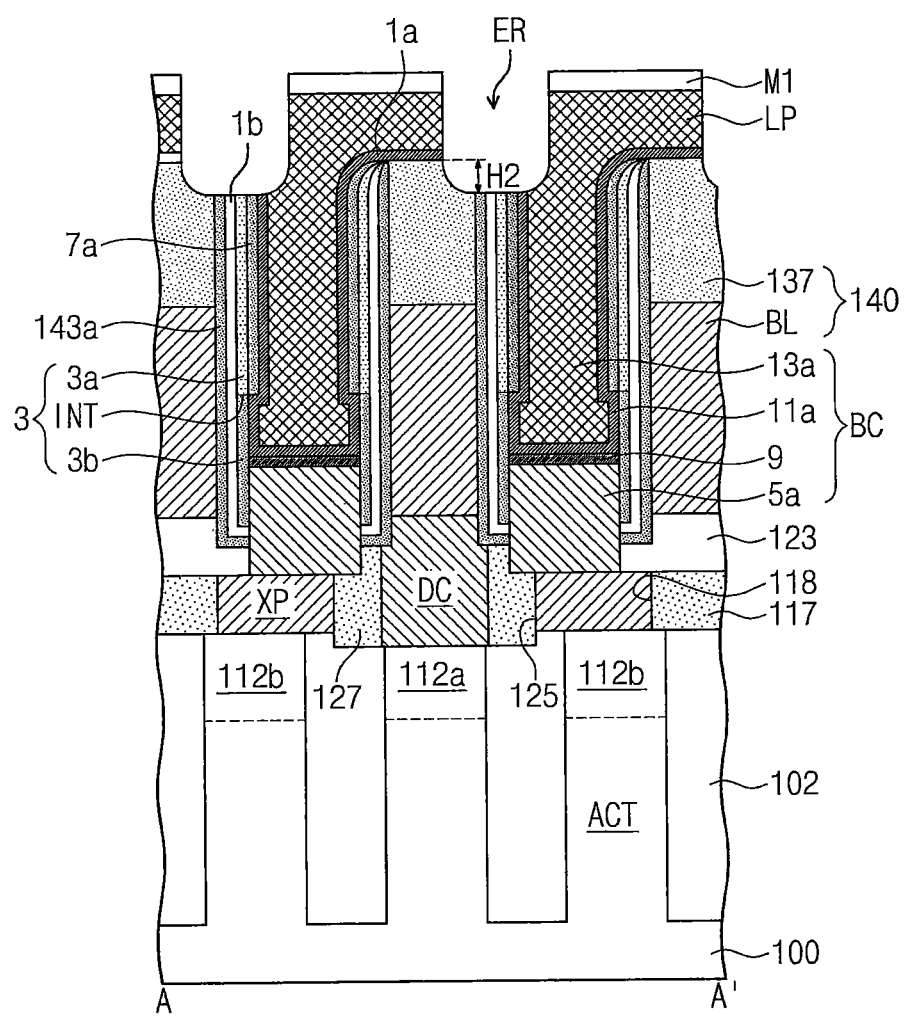
Figure 18C:
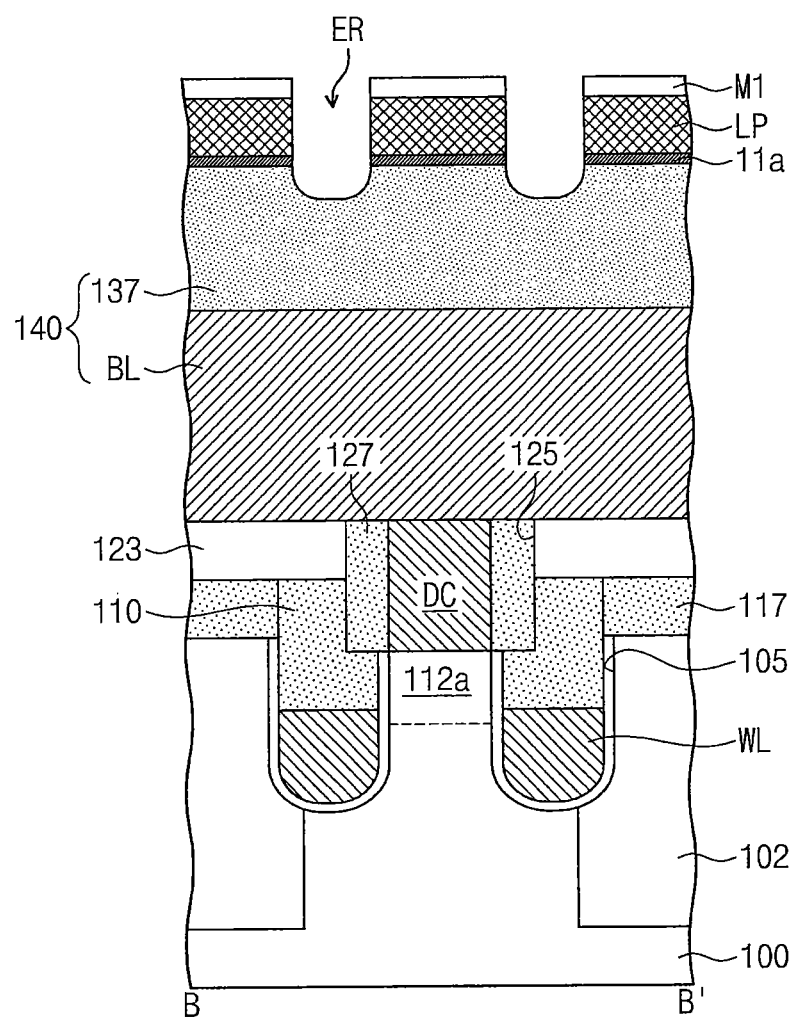
Figure 18D:
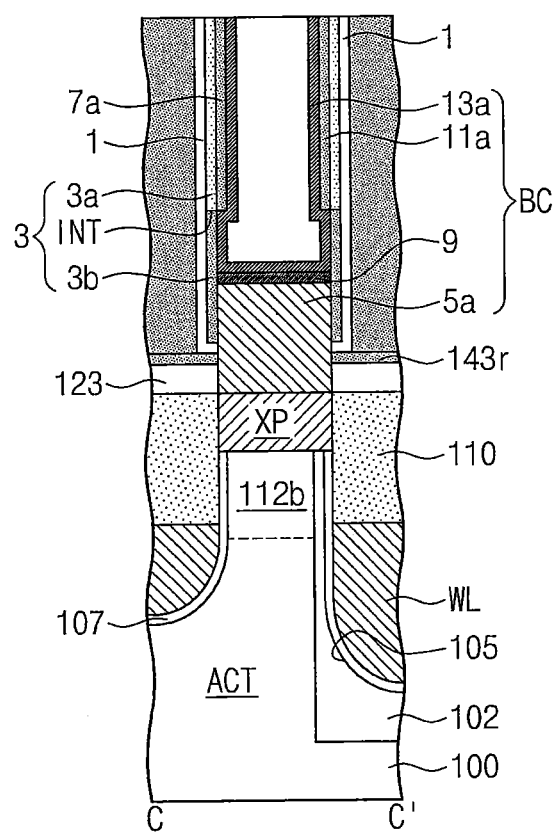

FIG. 17B may be regarded as illustrating a method of manufacturing a semiconductor device according to further embodiments of the inventive concepts that further comprises forming a metal silicide layer 9 that extends on the second end of a contact, which may be embodied by the poly-silicon pattern 5a, to directly contact a first spacer, which may be embodied by the second spacer 3. The metal silicide layer 9 is spaced apart from the air gap AG throughout an extent of the metal silicide layer 9.

Referring to FIGS. 18A, 18B, 18C, and 18D, mask patterns M1 are formed on the metal-containing layer 13. The mask patterns M1 define planar shapes of landing pads LP. The metal-containing layer 13, the diffusion barrier layer 11, the hardmask patterns 137, the first to third spacers 143a, 3 and 7a and the sacrificial spacers 1 may be partially removed using the mask patterns M1 as etch masks. Thus, storage node contact plugs BC and landing pads LP may be formed. The storage node contact plugs BC fill the contact holes 157, respectively. Each of the storage node contact plug BC includes the poly-silicon pattern 5a, the metal silicide layer 9, a diffusion barrier pattern 11a and a metal-containing pattern 13a that are sequentially stacked. Each landing pad LP may extend from a top end of each storage node contact plug BC to be disposed outside of each contact hole 157.

The landing pad LP may cover a first portion 1a of the sacrificial spacer 1 surrounding the storage node contact plug BC. Here, the sacrificial spacer 1 further includes a second portion 1b not covered by the landing pad LP. The second portion 1b of the sacrificial spacer 1 is exposed. The landing pad LP may cover portions of the first to third spacers 143a, 3 and 7a disposed at both sides of the first portion 1a of the sacrificial spacer 1. In some embodiments, the landing pad LP may further cover a portion of the top surface of the line pattern 140 adjacent to the first portion 1a of the sacrificial spacer 1.

A bottom surface of an etched region ER between the landing pads LP may be lower than top ends of the first portions 1a of the sacrificial spacers 1 covered by the landing pads LP. In other words, a top end of the second portion 1b of the sacrificial spacer 1 not covered by the landing pad LP may be lower than the top end of the first portion 1a of the sacrificial spacer 1 covered by the landing pad LP. Likewise, top ends of first portions of the first to third spacers 143a, 3 and 7a not covered by the landing pad LP may be lower than tope ends of second portions of the first to third spacers 143a, 3 and 7a covered by the landing pad LP. The first and second portions 1a and 1b of the sacrificial spacer 1 are connected to each other.

A height difference H2 between a top end of the second spacer 2 adjacent to the second portion 1b of the sacrificial spacer 1 and the top surface of the hardmask pattern 137 may be in the range of about 0 Å to about 500 Å. Even though the height difference H2 is zero (0), the sacrificial spacer 1 may be exposed. If the height difference H2 is too great, the bit line BL may be exposed to be damaged.

Referring to FIGS. 19A, 19B, 19C, 19D, and 2D, the mask patterns M1 are removed. The sacrificial spacer 1 is removed by an isotropic etching process through the exposed second portion 1b of the sacrificial spacer 1. At this time, an etchant for the removal of the sacrificial spacer 1 may be, for example, a mixed solution of hydrofluoric acid (HF) and ammonium fluoride ($NH_4F$). The first portion 1a of the sacrificial spacer 1 is also removed by the isotropic etching process. Thus, an air gap AG is formed between the storage node contact plug BC and the line patterns 140 adjacent thereto. A portion of the air gap AG between the storage node contact plug BC and the line pattern 140 is disposed between the first and second spacers 143a and 3. Another portion of the air gap AG between the storage node contact plug BC and the upper insulating fence 147 may be disposed between the second spacer 3 and the upper insulating fence 147.

As described above, the sacrificial spacer 1 may be removed by the wet etching process. At this time, the etchant removing the sacrificial spacer 1 may infiltrate into the interface INT between the first and second portions 3a and 3b of the second spacer 3, which corresponds to the weakest portion. Thus, the air gap AG may also be formed at the interface INT or the first portion 3a of the second spacer 3 may be separated from the second portion 3b of the second spacer 3. If the metal silicide layer 9 is disposed at a substantially same level as or to be adjacent to the interface INT between the first and second portions 3a and 3b, the etchant removing the sacrificial spacer 1 may also dissolve the metal silicide layer 9. If the metal silicide layer 9 is dissolved, the air gap AG may also exist between the diffusion barrier pattern 11a and the poly-silicon pattern 5a to increase an electrical resistance of the bit line contact plug BC. Thus, a defect such as an open fail may be caused. However, according to embodiments of the inventive concepts, a height difference H1 between the interface INT and the top surface of the metal silicide layer 9 is equal to or greater than about 50 Å and a lateral end of the interface INT is in contact with the diffusion barrier pattern 11a. Thus, even though the etchant removing the sacrificial spacer 1 infiltrates into the interface INT, the etchant does not meet the metal silicide layer 9. As a result, the etchant does not dissolve the metal silicide layer 9 such that the defect (e.g., the open fail) does not occur. Accordingly, the reliability of the semiconductor device may be improved.

Figure 19A:
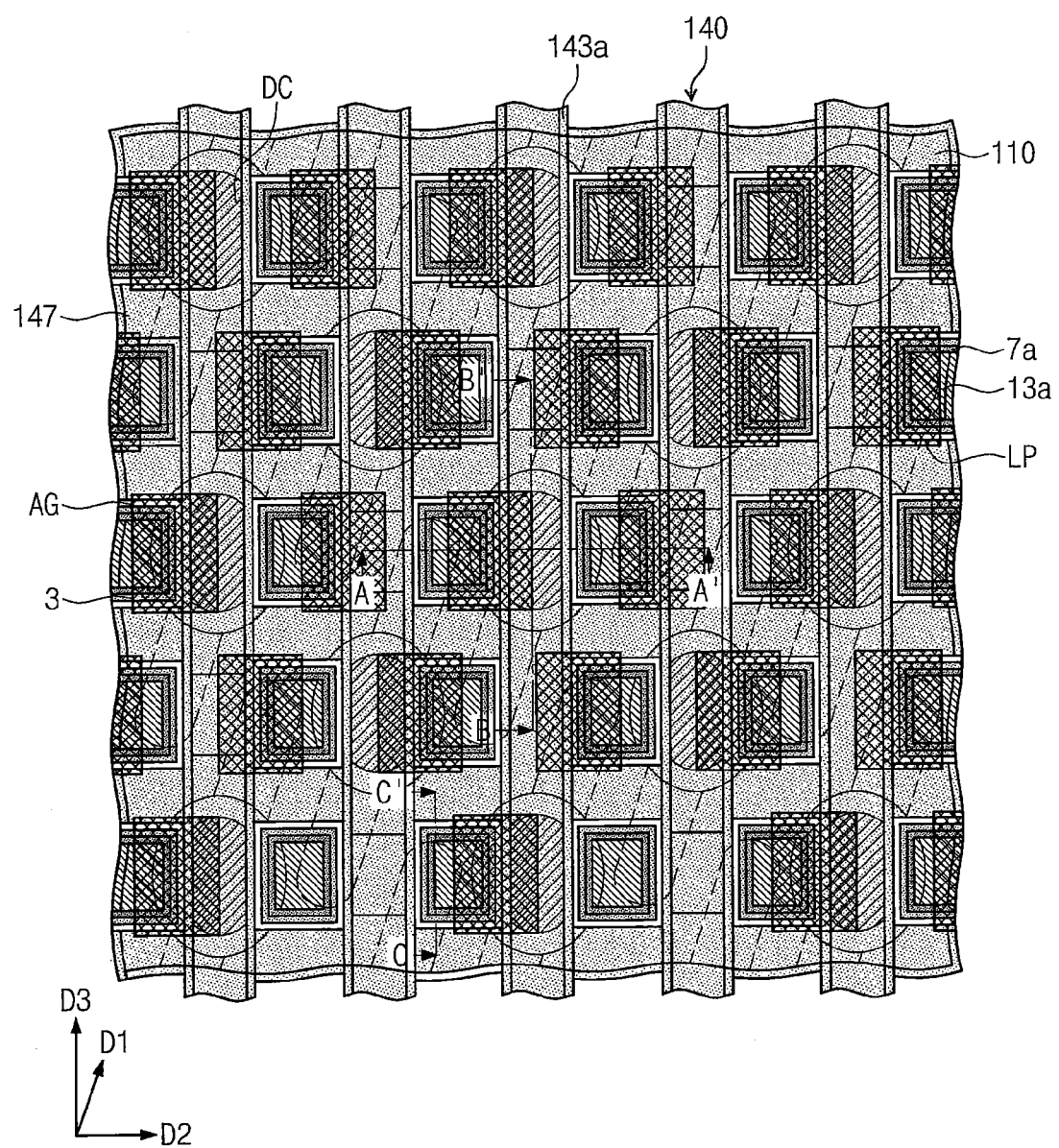
Figure 19B:
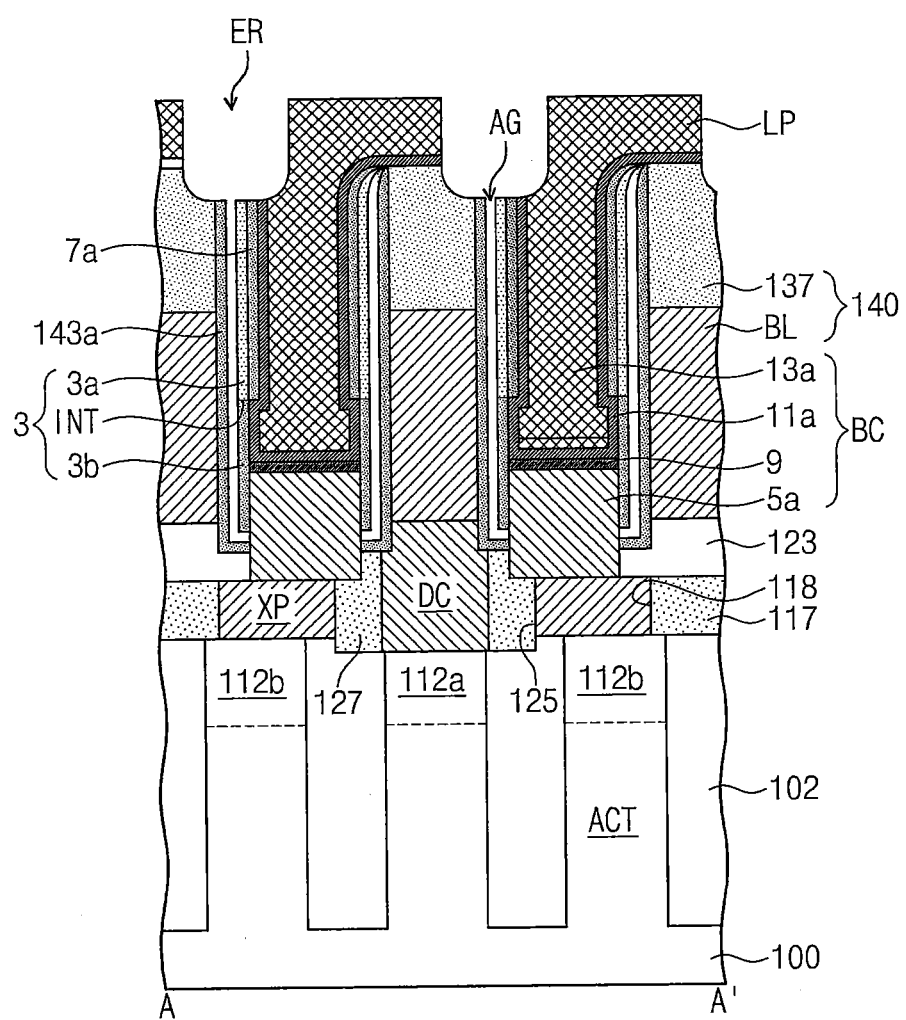
Figure 19C:
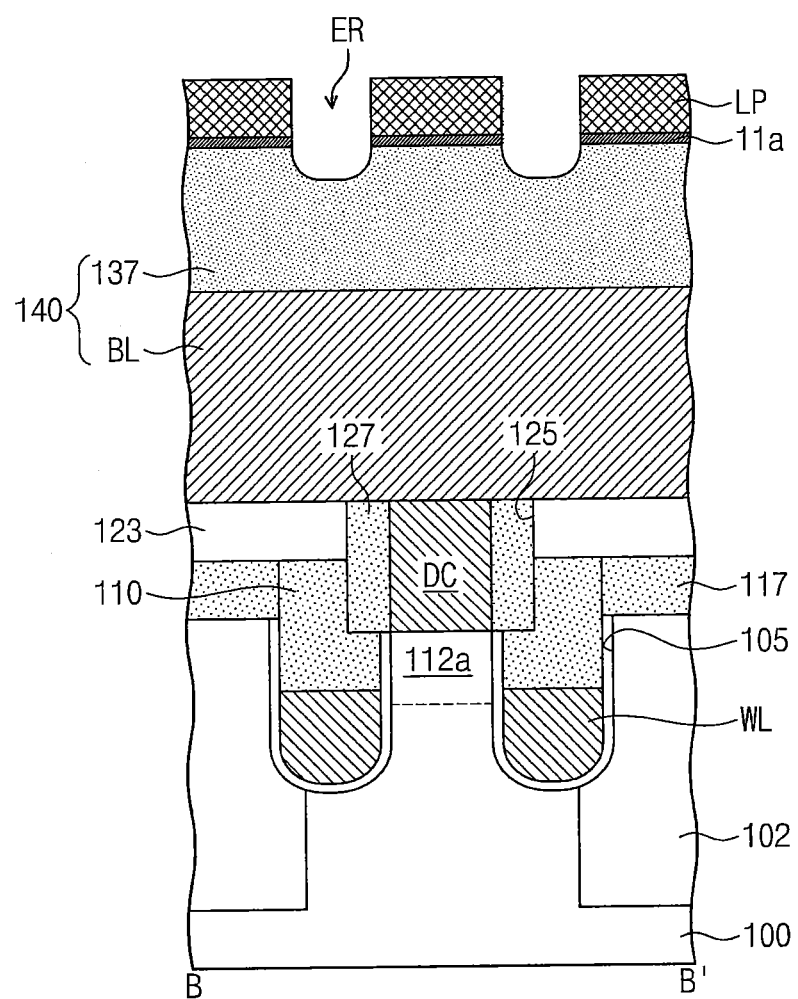
Figure 19D:
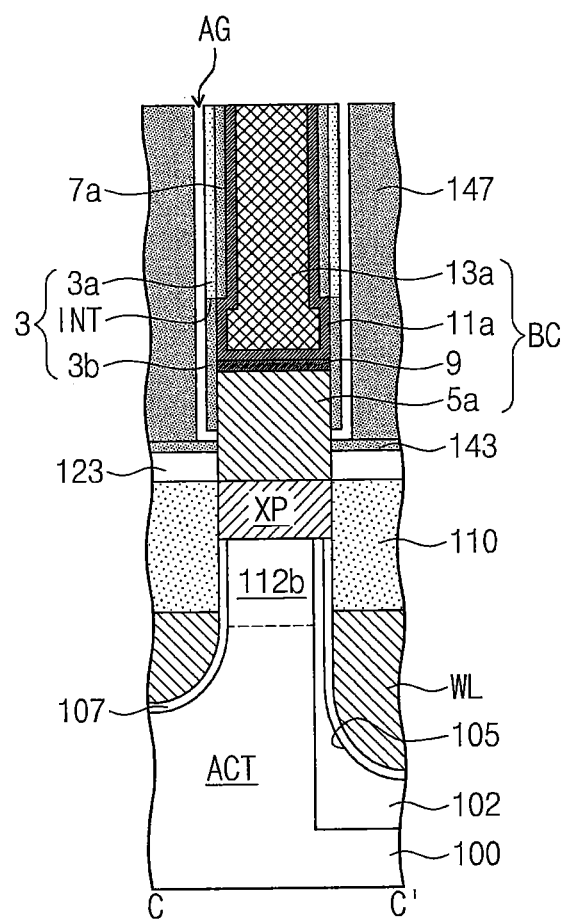

FIG. 19D may also be regarded as illustrating a method of manufacturing a semiconductor device according to various embodiments of the inventive concepts, wherein the method further includes removing the sacrificial layer, which may be embodied by the sacrificial spacer 1, to create an air gap AG in the first spacer, which may be embodied by the second spacer 3, the air gap AG having a first end adjacent the substrate 100 and a second end remote from the substrate 100.

Next, the second interlayer insulating layer 173 of FIGS. 1B to 1E may be formed. A top end of the second portion A2 not covered by the landing pad LP of the air gap AG may be closed by the second interlayer insulating layer 173. The second interlayer insulating layer 173 may have a poor step coverage characteristic. Thus, the top end of the second portion A2 of the air gap AG may be closed. Since the top end of the first portion 1a of the sacrificial spacer 1 is higher than the top end of the second portion 1b of the sacrificial spacer 1, a height of the first portion A1 covered by the landing pad LP of the air gap AG may be greater than a height of the second portion A2 not covered by the landing pad LP of the air gap AG.

Subsequently, the via-plugs 175 and the data storage parts DSP of FIGS. 1A and 1B may be formed. The data storage parts DSP may be realized as the data storage part DSP of FIG. 3A or the data storage part DSP of FIG. 3B. Thus, the semiconductor device illustrated in FIGS. 1A to 1E may be realized.

According to the aforementioned methods of manufacturing the semiconductor device, the landing pad LP may be formed to partially cover the sacrificial spacer 1 and then the sacrificial spacer 1 may be removed by the isotropic etching process through the exposed portion of the sacrificial spacer 1. Thus, the air gap AG may be easily formed between the storage node contact plug BC and the line pattern 140. As a result, a parasitic capacitance between the storage node contact plug BC and the line pattern 140 may be reduced to realize the semiconductor device having the excellent reliability. Additionally, since the air gap AG is easily formed, the productivity of the semiconductor device may be improved.

Moreover, the first spacer 143a protects the sidewall of the bit line BL and the second spacer 3 protects the storage node contact plug BC during the removal of the sacrificial spacer 1. Thus, it is possible to reduce or prevent the bit line BL and the storage node contact plug BC from being damaged during the removal of the sacrificial spacer 1. As a result, the semiconductor device with the excellent reliability may be realized.

Furthermore, the height difference H1 between the interface INT and the top surface of the metal silicide layer 9 is equal to or greater than about 50 Å and the lateral end of the interface INT is in contact with the diffusion barrier pattern 11a. Thus, even though the etchant for removing the sacrificial spacer 1 infiltrates into the interface INT, the etchant does not meet the metal silicide layer 9. As a result, the etchant does not dissolve the metal silicide layer 9 such that the defect (e.g., the open fail) does not occur. Therefore, the reliability of the semiconductor device may be more improved.

Furthermore, the poly-silicon pattern 5a is spaced apart from the third spacer 3a such that the area of the top surface of the poly-silicon pattern 5a becomes wide. Thus, the formation area of the metal silicide layer 9 may be increased to improve the current flow characteristic of the semiconductor device.

Second Embodiment

Figure 20:
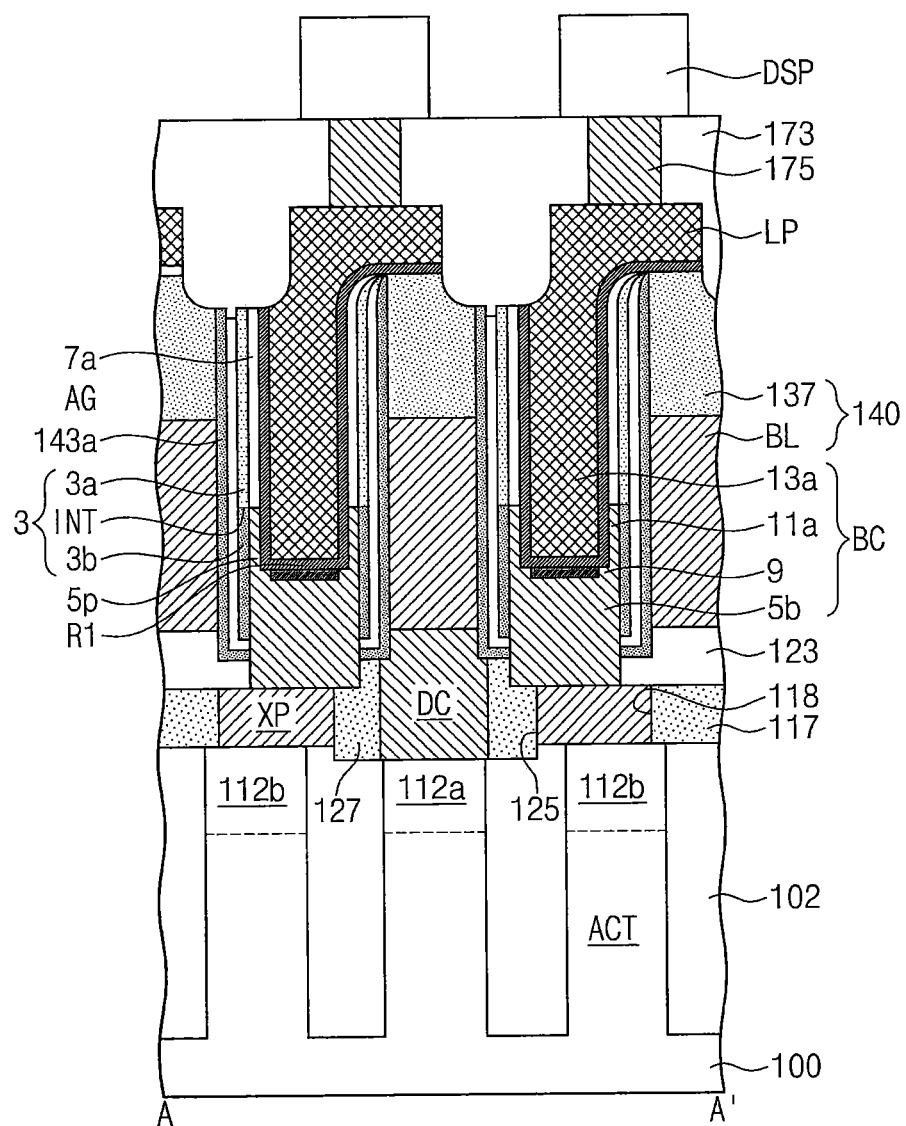
FIG. 20 is a cross-sectional view taken along a line A-A' of FIG. 1A to illustrate a semiconductor device according to a second embodiment of the inventive concepts.

FIG. 20 is a cross-sectional view taken along a line A-A' of FIG. 1A to illustrate a semiconductor device according to a second embodiment of the inventive concepts.

Referring to FIG. 20, a second portion 3b of a second spacer 3 is in contact with a protrusion 5p of a poly-silicon pattern 5b, not a diffusion barrier pattern 11a in a semiconductor device according to the present embodiment. A recess region R1 may exist in a top surface of the poly-silicon pattern 5b such that the poly-silicon pattern 5b may have a U-shaped cross section. A metal silicide layer 9 may be formed on a bottom surface of the recess region R1 of the poly-silicon pattern 5b. A width of the metal silicide layer 9 may be less than a width of the poly-silicon pattern 5b. Other elements of the semiconductor device according to the present embodiment may be the same as or similar to corresponding elements of the semiconductor device in the first embodiment.

Figure 21:
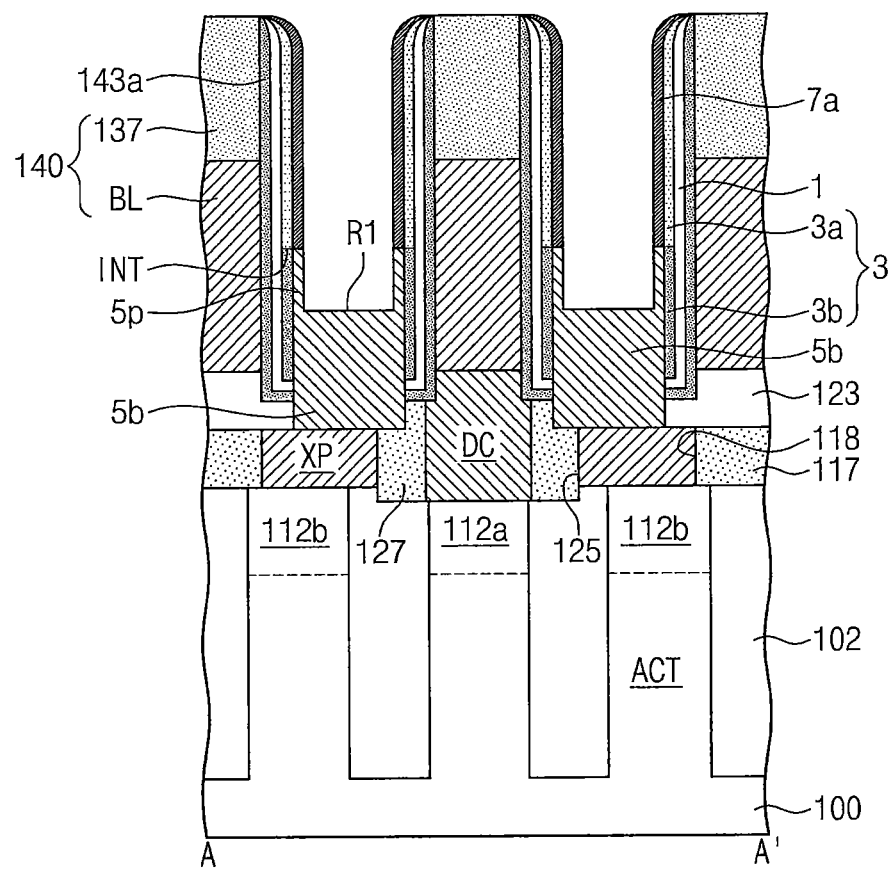
FIGS. 21 and 22 are cross-sectional views illustrating a method of manufacturing the semiconductor device of FIG. 20.
Figure 22:
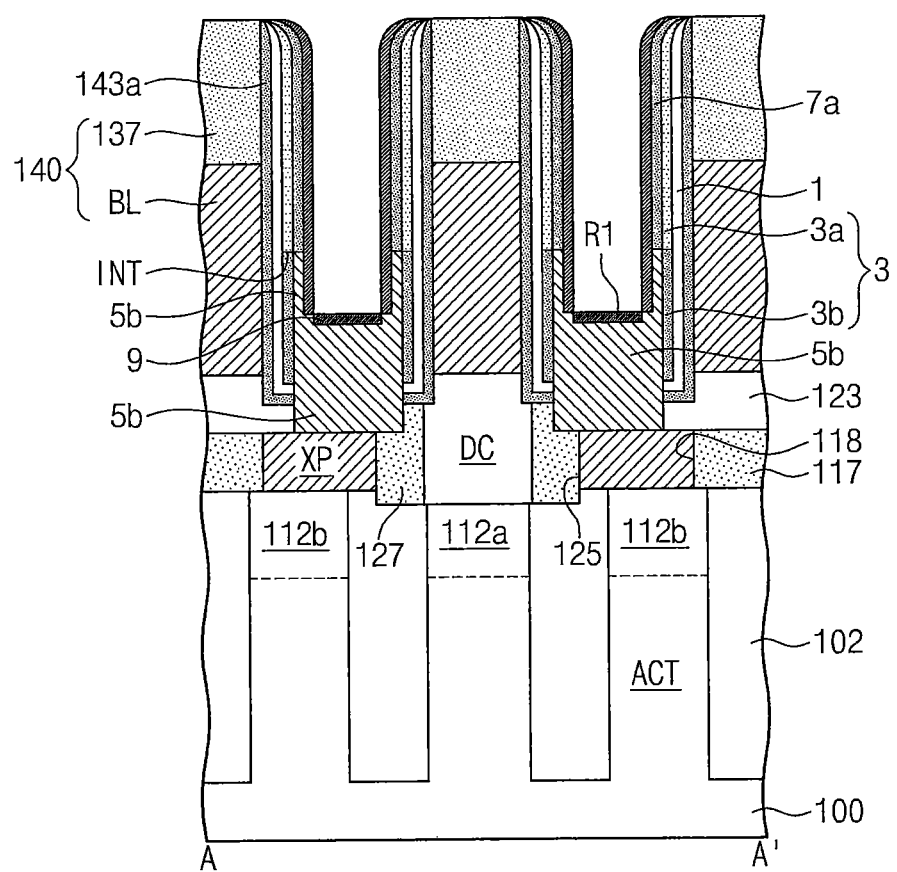

FIGS. 21 and 22 are cross-sectional views illustrating a method of manufacturing the semiconductor device of FIG. 20.

Referring to FIG. 21, a second etching process is performed on the poly-silicon pattern 5a in FIG. 15B to recess the poly-silicon pattern 5a. At this time, the second etching process may be an anisotropic etching process using the third spacer 7a as an etch mask. Thus, a recess region R1 may be formed in a top surface of a poly-silicon pattern 5b not covered by the third spacer 7a, and at the same time a portion 5p (or a protrusion 5p) of the poly-silicon pattern 5b may be formed to cover the sidewall of the second portion 3b of the second spacer 3.

Referring to FIG. 22, a fourth spacer 10 may be formed to cover a sidewall of the third spacer 7a and a sidewall of the protrusion 5p of the poly-silicon pattern 5b. A metal silicide layer 9 may be formed on a top surface of the poly-silicon pattern 5b (i.e., a bottom surface of the recess region R1), which is not covered by the fourth spacer 10.

Referring again to FIG. 20, the fourth spacer 10 may be removed. Thereafter, subsequent processes (e.g., a formation process of a diffusion barrier layer 11, etc.) may be the same as or similar to corresponding processes of the first embodiment.

Figure 23:
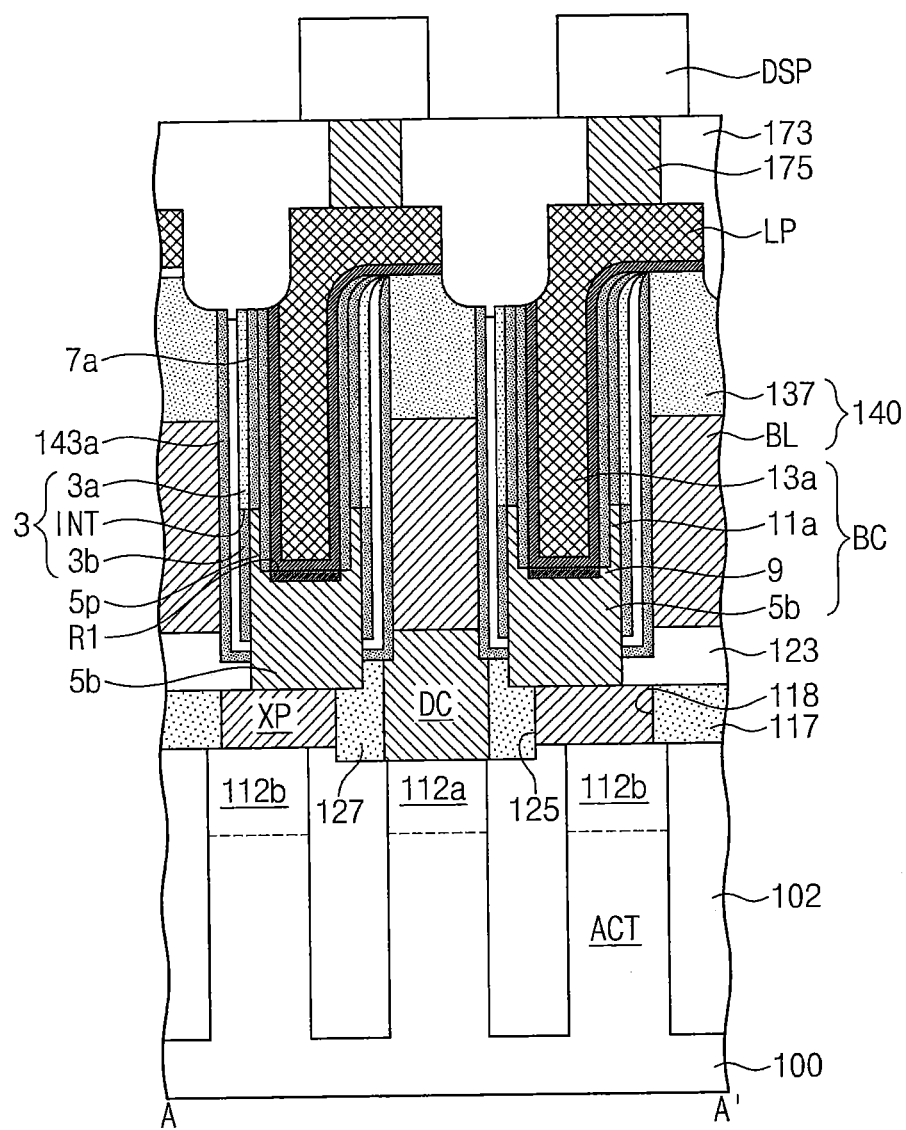
FIG. 23 is a cross-sectional view illustrating a modified example of the semiconductor device of FIG. 20.

FIG. 23 is a cross-sectional view illustrating a modified example of the semiconductor device of FIG. 20.

Referring to FIG. 23, the sidewall of the third spacer 7a and the sidewall of the protrusion 5p of the poly-silicon pattern 5b are covered by the fourth spacer 10 in a semiconductor device according to the present modified example. Other elements of the semiconductor device according to the present modified example may be the same as or similar to corresponding elements of the semiconductor device in the first embodiment. The fourth spacer 10 in FIG. 22 is not removed and then subsequent processes are performed to realize the semiconductor device of FIG. 23. The subsequent processes of the present modified example may be the same as or similar to corresponding processes of the first embodiment.

Third Embodiment

Figure 24:
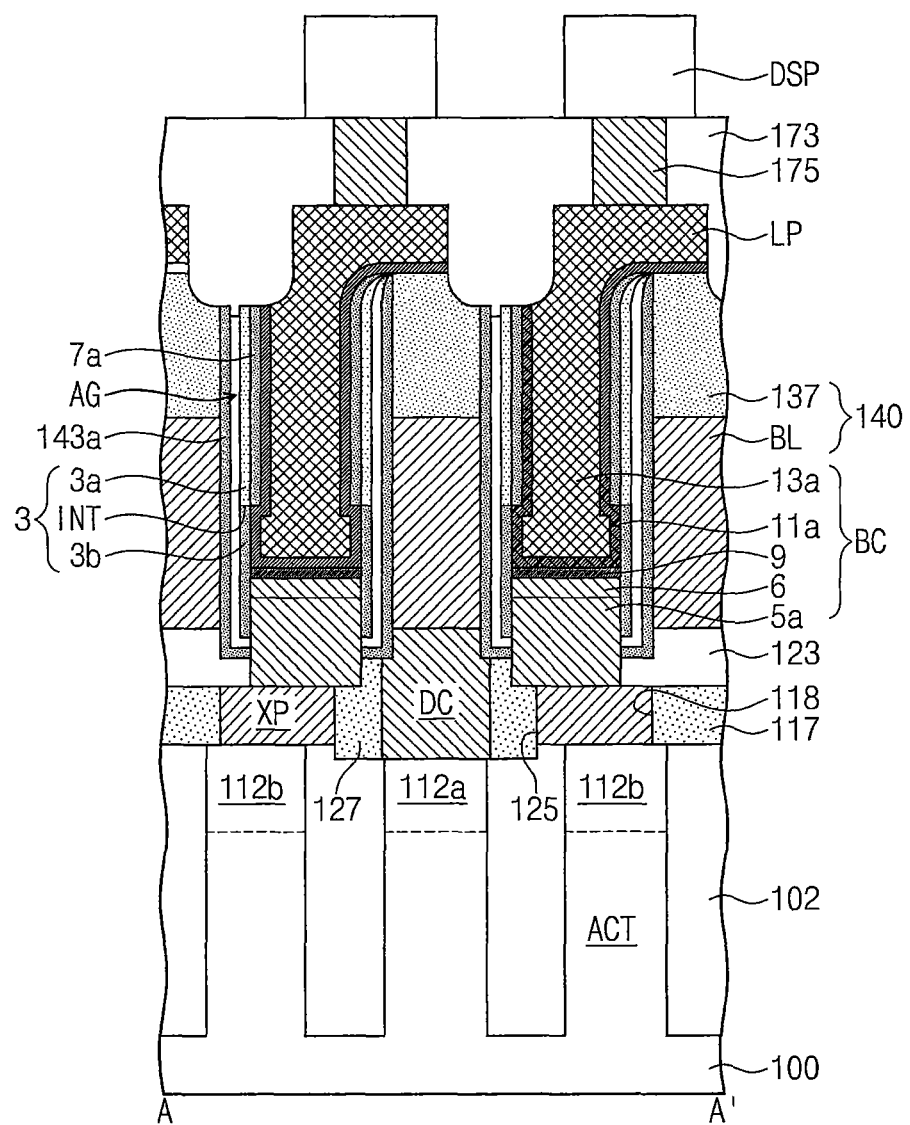
FIG. 24 is a cross-sectional view taken along a line A-A' of FIG. 1A to illustrate a semiconductor device according to a third embodiment of the inventive concepts.

FIG. 24 is a cross-sectional view taken along a line A-A' of FIG. 1A to illustrate a semiconductor device according to a third embodiment of the inventive concepts.

Referring to FIG. 24, a high-concentration dopant doped region 6 may exist in an upper portion of the poly-silicon pattern 5a, which is in contact with the metal silicide layer 9, in a semiconductor device according to the present embodiment. The high-concentration dopant doped region 6 may be doped with dopants of the same conductivity type as the poly-silicon pattern 5a. A dopant concentration of the high-concentration dopant doped region 6 may be higher than that of the poly-silicon pattern 5a. The high-concentration dopant doped region 6 may be added in the semiconductor device in order to improve a resistance of the bit line contact plug BC.

The high-concentration dopant doped region 6 may be formed before the formation of the metal silicide layer 9 and after the step illustrated in FIG. 16A.

Other elements and other manufacture processes of the semiconductor device according to the present embodiment may be the same as or similar to corresponding elements and corresponding processes of the first embodiment.

Fourth Embodiment

Figure 25:
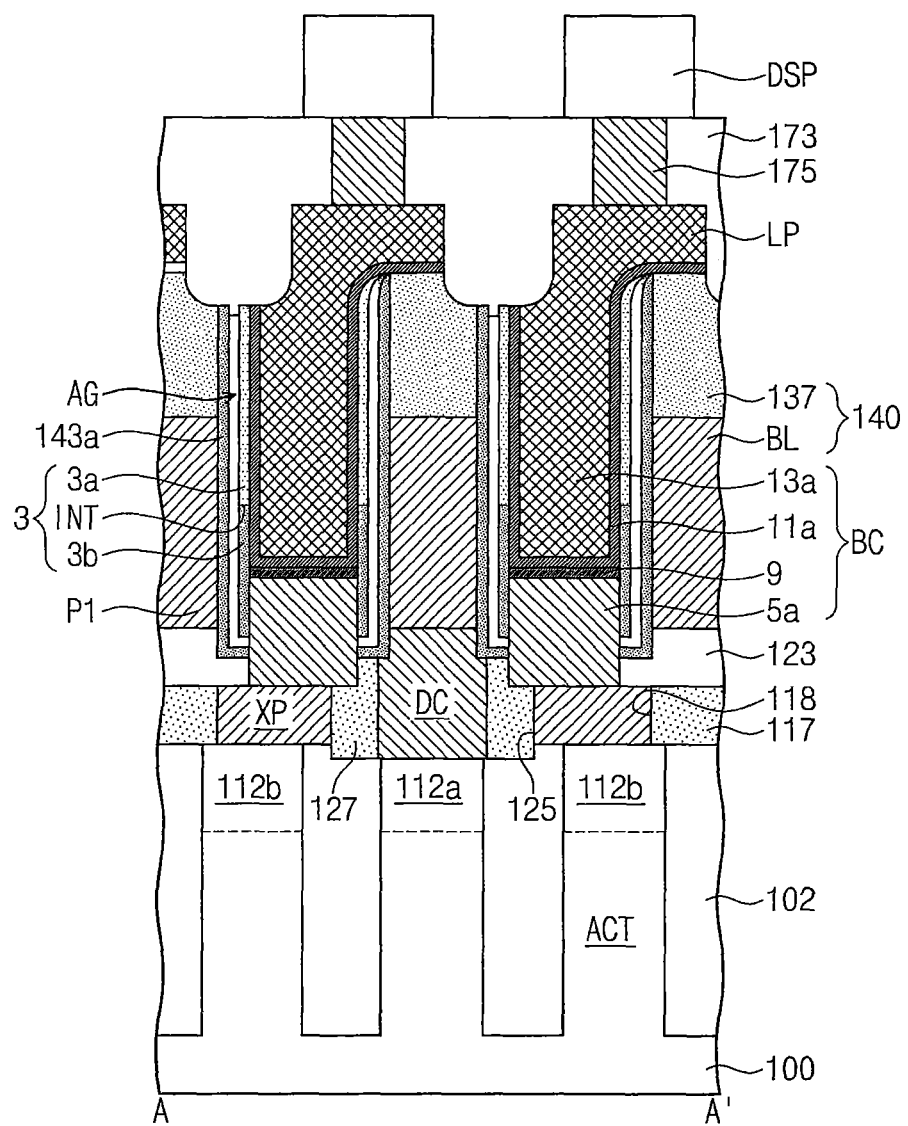
FIG. 25 is a cross-sectional view illustrating a semiconductor device according to a fourth embodiment of the inventive concepts.

FIG. 25 is a cross-sectional view illustrating a semiconductor device according to a fourth embodiment of the inventive concepts.

Referring to FIG. 25, a semiconductor device according to the present embodiment does not include the third spacer 7a. Sidewalls of the first portion 3a and a portion of the second portion 3b of the second spacer 3 may be in direct contact with the diffusion barrier pattern 11a. Other elements of the semiconductor device according to the present embodiment may be the same as or similar to corresponding elements of the semiconductor device in the first embodiment.

Figure 26:
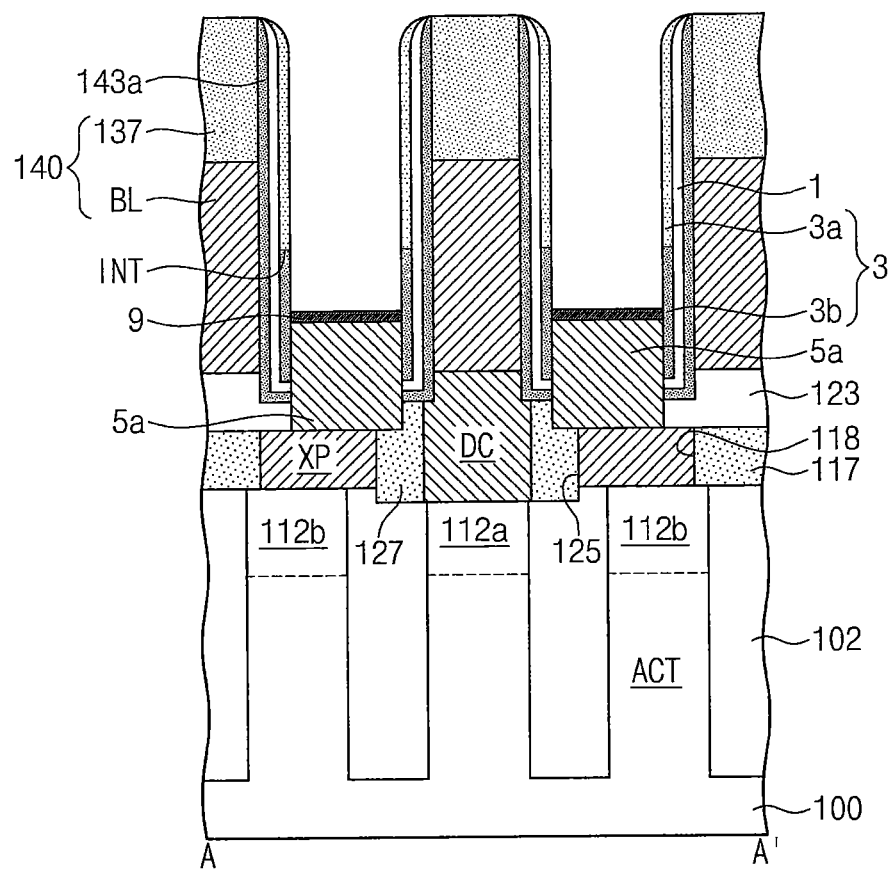
FIG. 26 is a cross-sectional view illustrating a method of manufacturing the semiconductor device of FIG. 25.

FIG. 26 is a cross-sectional view illustrating a method of manufacturing the semiconductor device of FIG. 25.

Figure 12A:
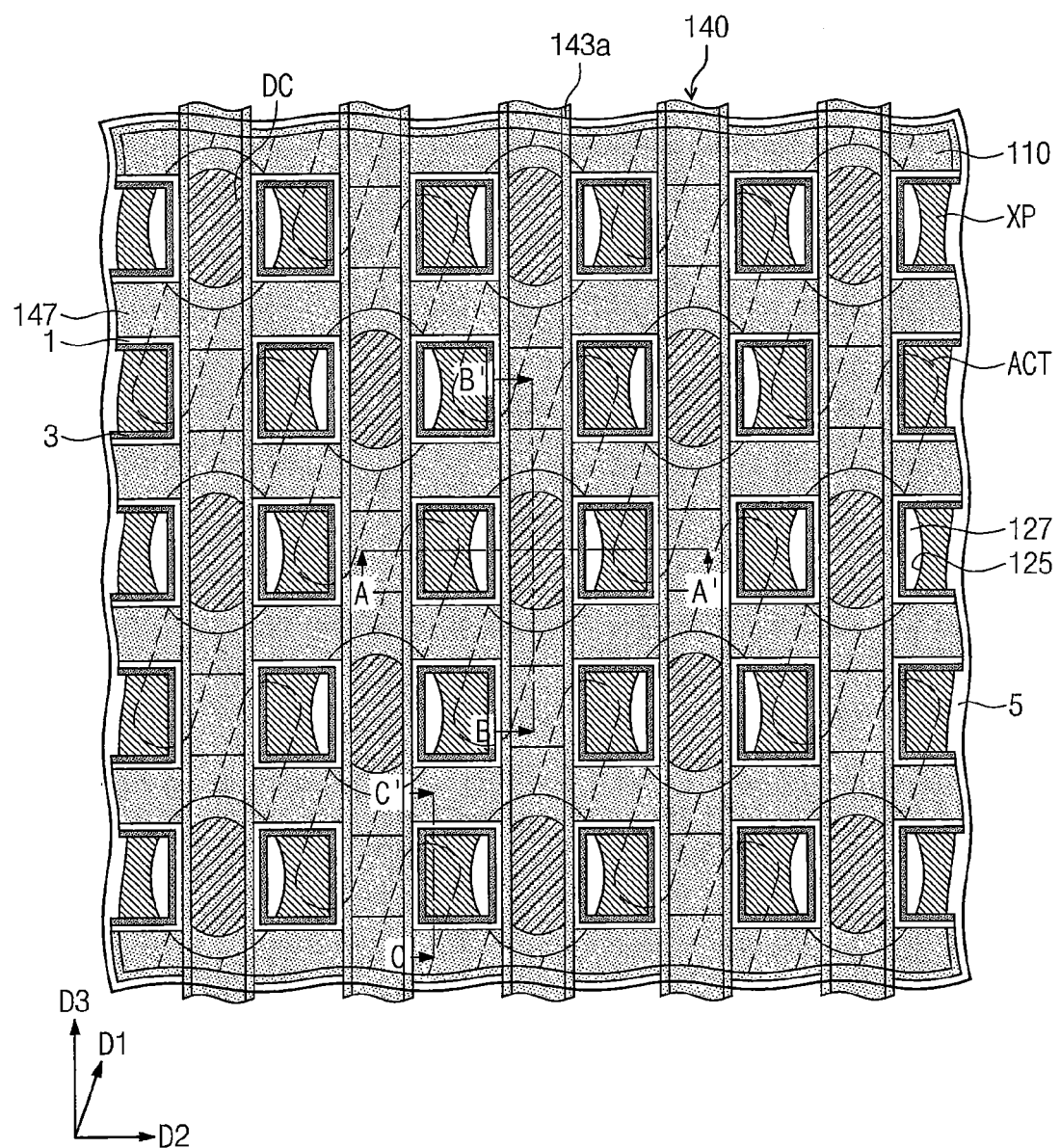
Figure 12B:
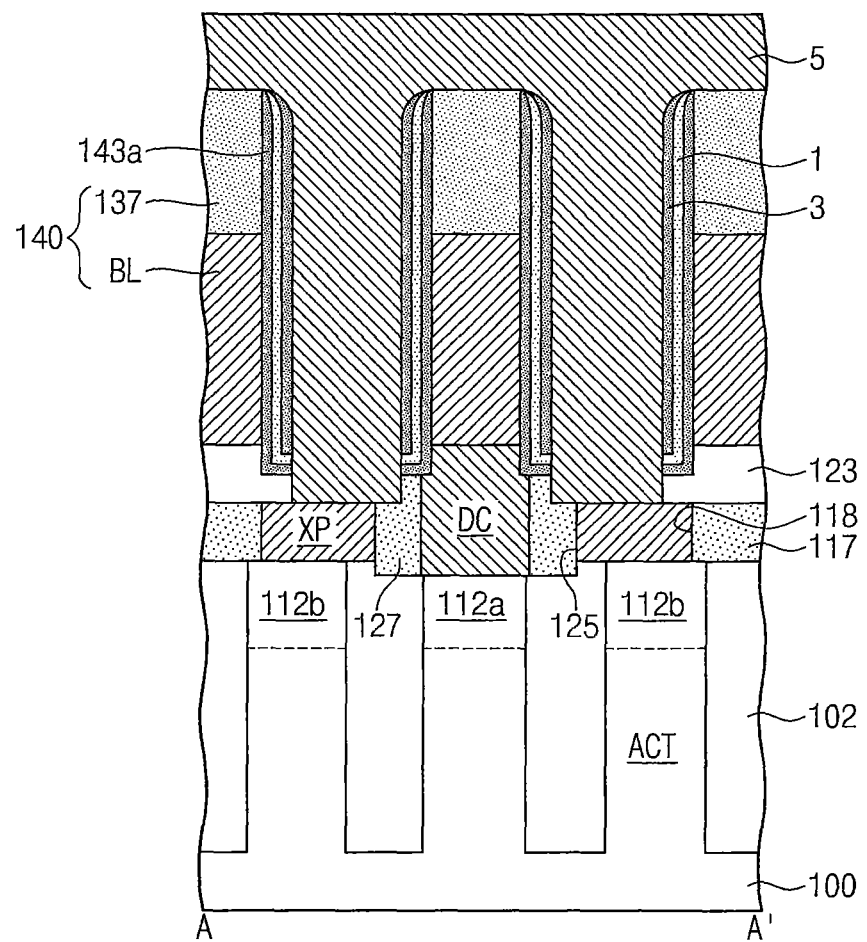
Figure 12C:
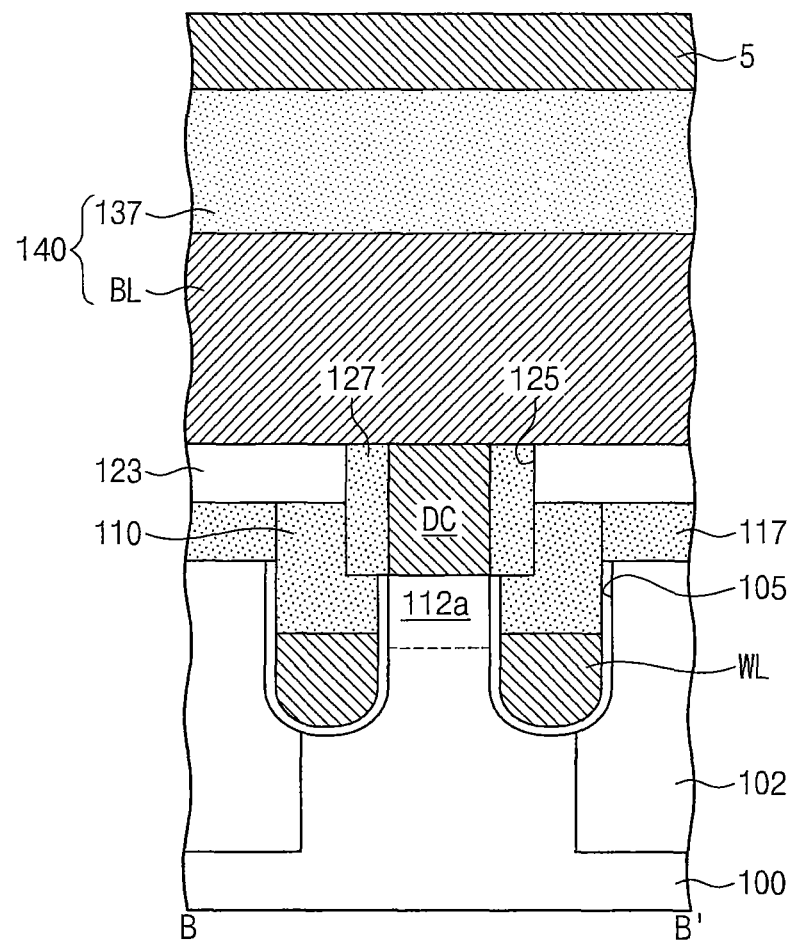
Figure 12D:
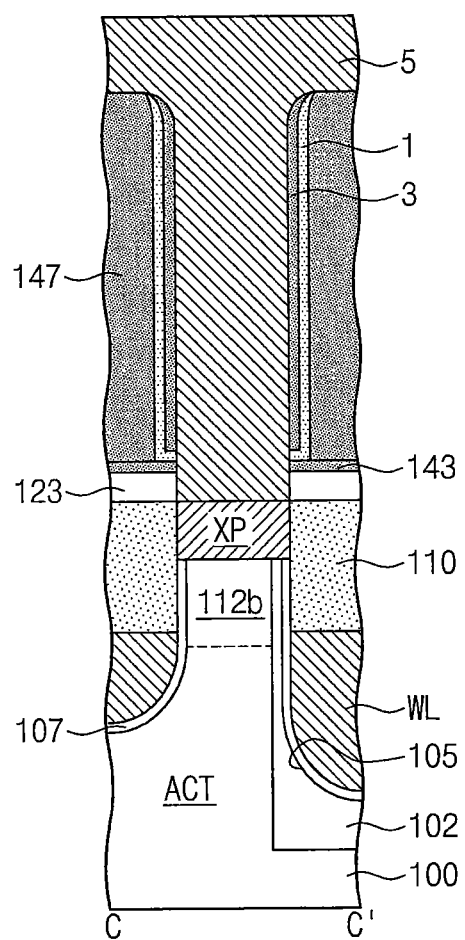
Figure 13E:
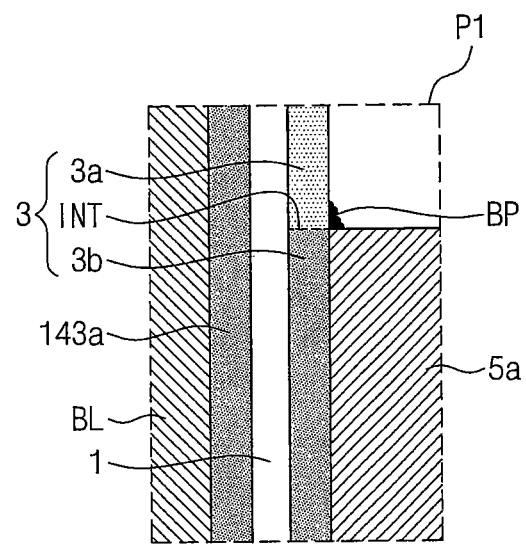
FIGS. 13E and 13F are enlarged views of a portion 'P1' of FIG. 13B according to embodiments of the inventive concepts.
Figure 13F:
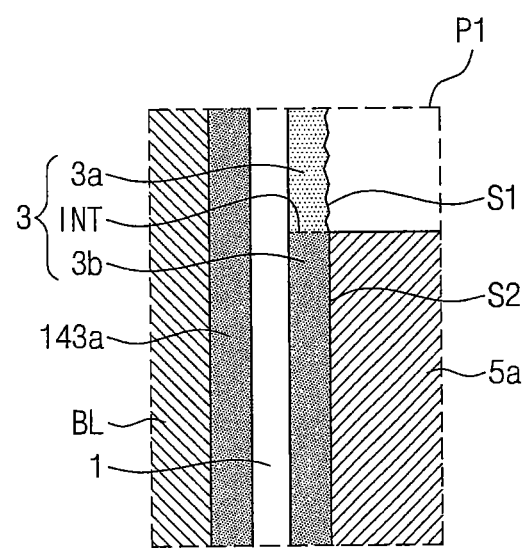
Figure 14A:
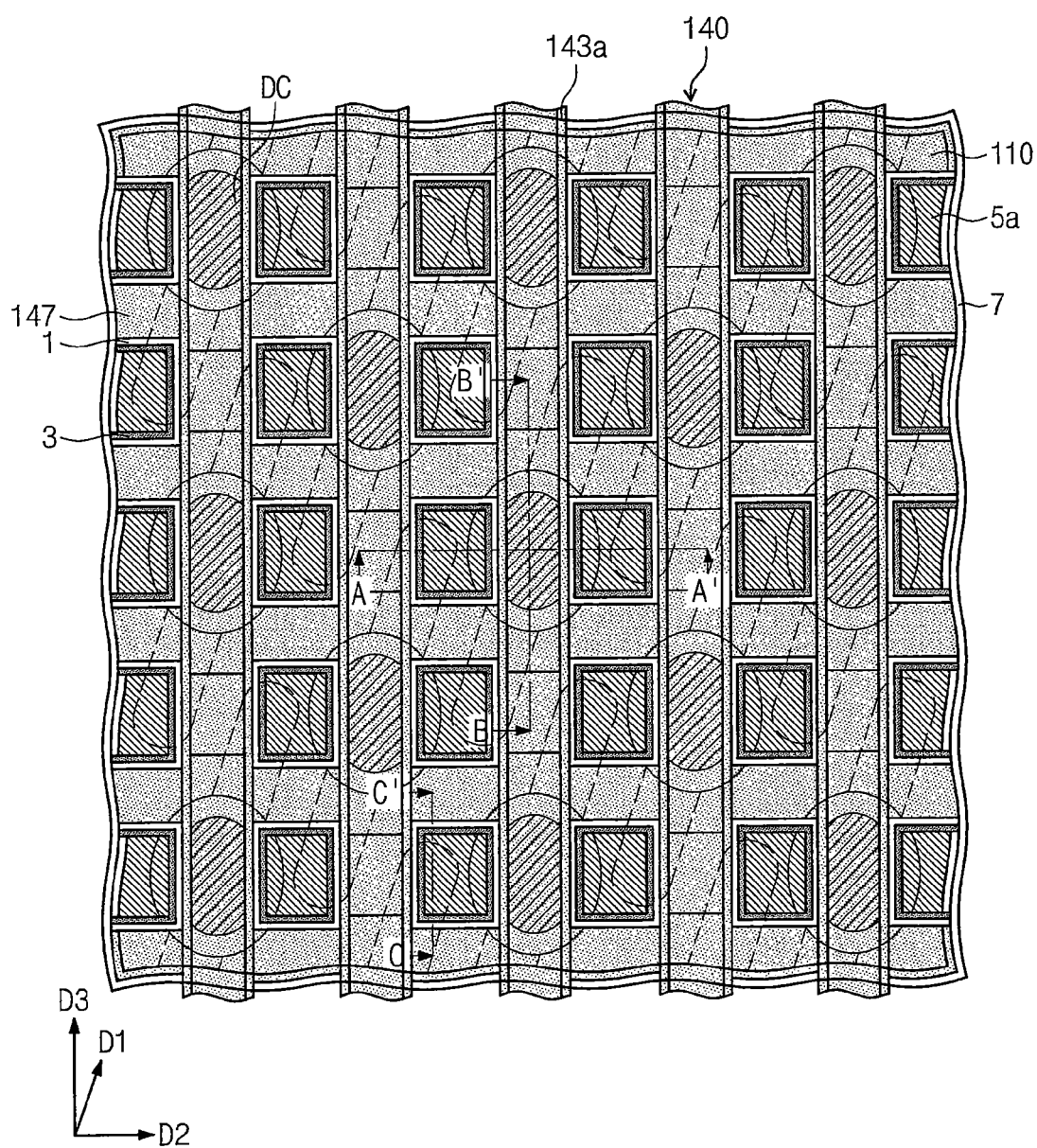
Figure 14B:
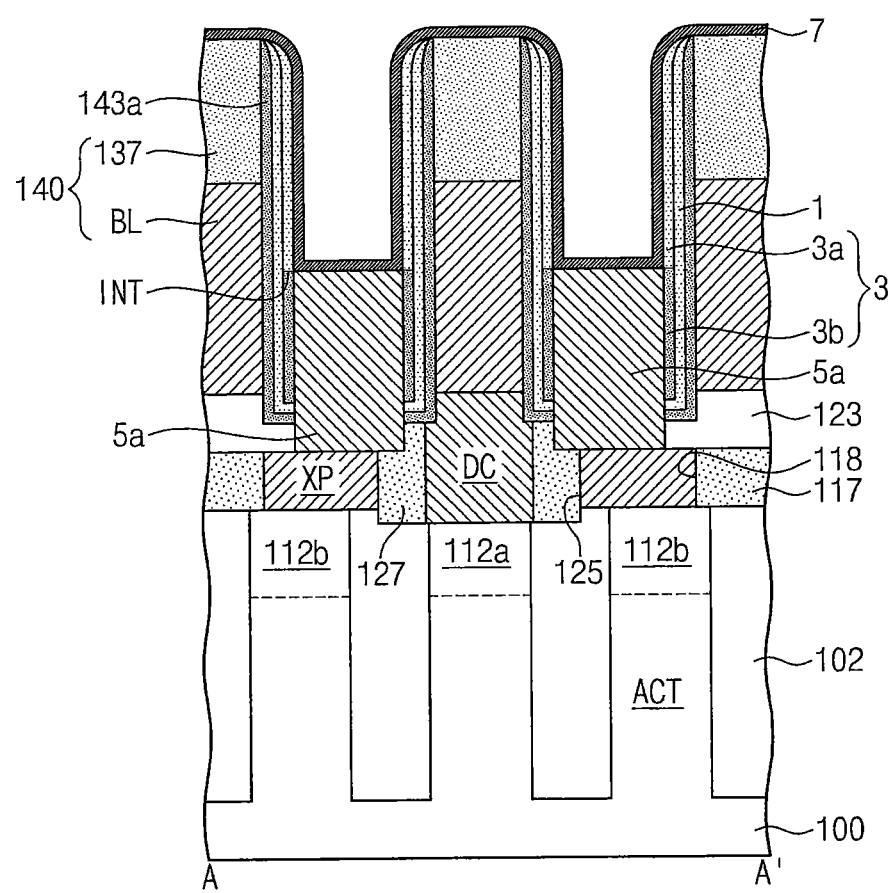
Figure 14C:
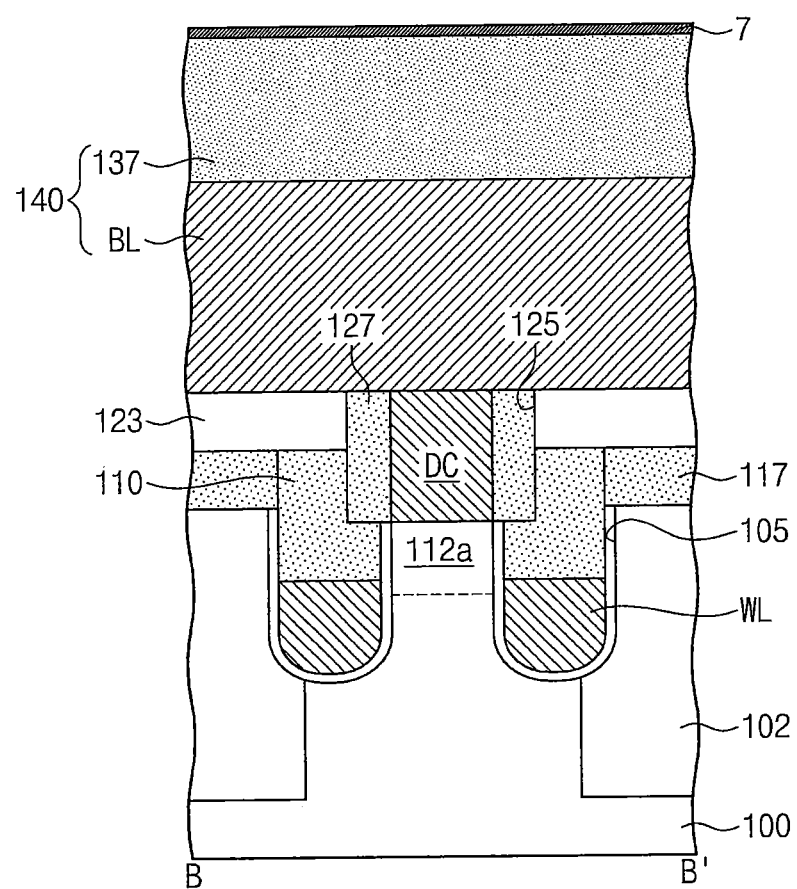
Figure 14D:
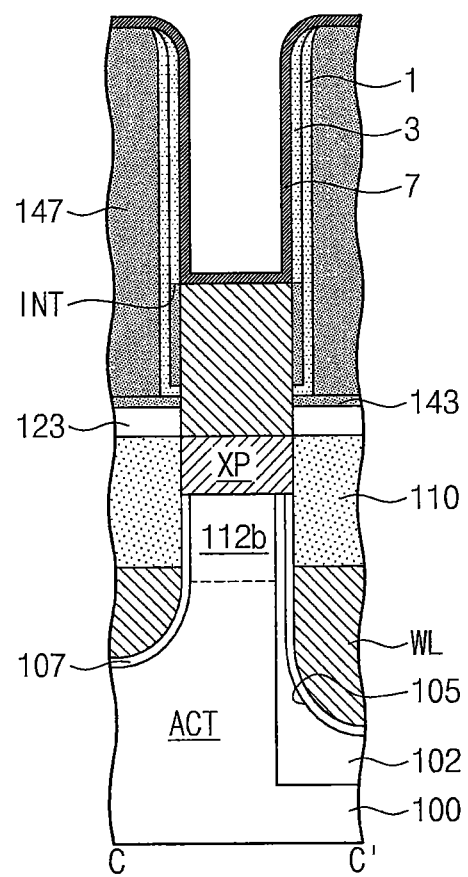

Referring to FIG. 26, first, the first etching process is performed on the poly-silicon layer 5 of FIG. 12B to form the poly-silicon pattern 5a of FIG. 13B. Thus, the second spacer 3 may be classified into the first portion 3a and the second portion 3b. A second etching process is performed to recess the poly-silicon pattern 5a without the formation of the third spacer 7a of the first embodiment. At this time, the second etching process may be an isotropic etching process. Subsequently, a metal silicide layer 9 is formed on the recessed poly-silicon pattern 5a. Subsequent processes of the present embodiment may be the same as or similar to corresponding processes of the first embodiment.

Fifth Embodiment

Figure 27:
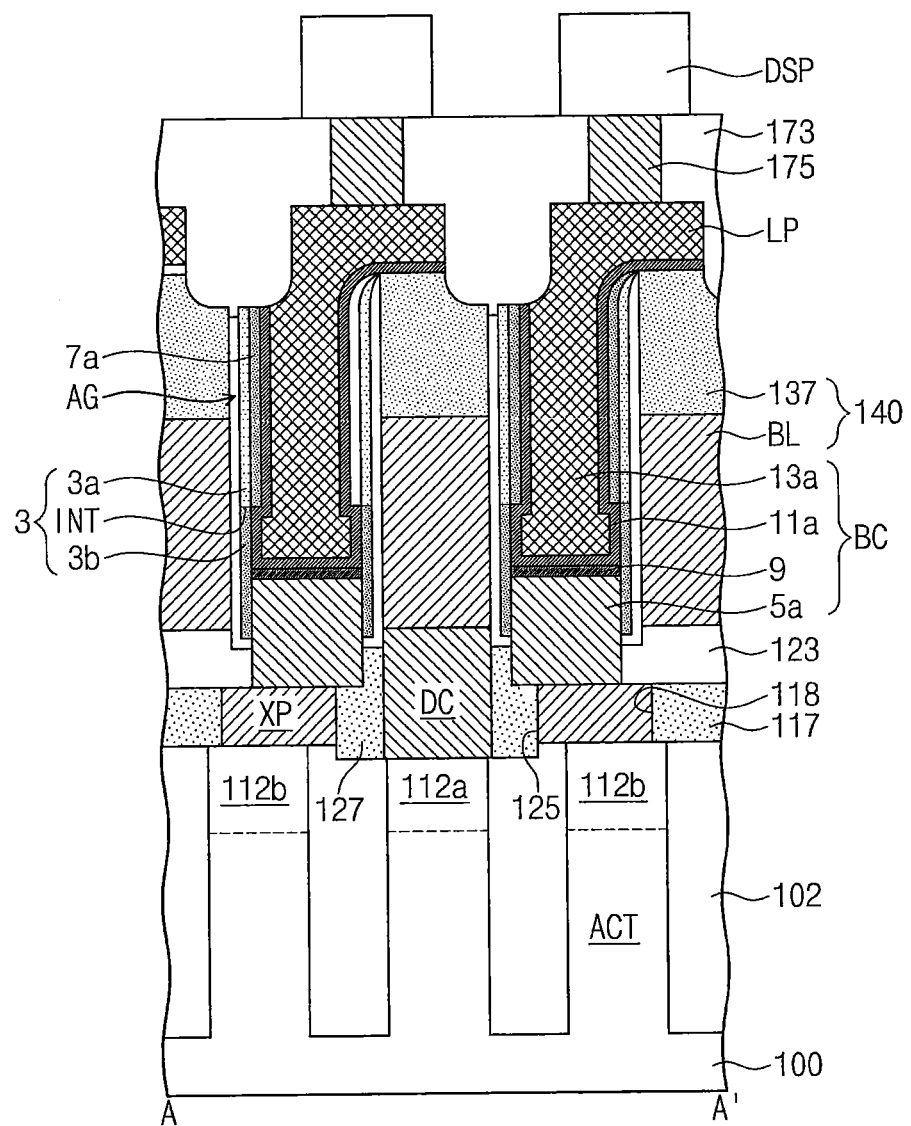
FIG. 27 is a cross-sectional view illustrating a semiconductor device according to a fifth embodiment of the inventive concepts.

FIG. 27 is a cross-sectional view illustrating a semiconductor device according to a fifth embodiment of the inventive concepts.

Referring to FIG. 27, a semiconductor device according to the present embodiment may not include the first spacer 143a and 143r and the sidewall of the bit line BL may be exposed by the air gap AG. Other elements of the semiconductor device according to the present embodiment may be the same as or similar to corresponding elements of the semiconductor device in the first embodiment.

The formation process of the first spacer layer 143 of FIGS. 10A to 10D may be omitted and then the sacrificial spacer 1 and the second spacer 3 may be directly formed to manufacturing the semiconductor device of FIG. 27. Other manufacturing processes of the present embodiment may be the same as or similar to corresponding processes of the first embodiment.

Sixth Embodiment

Figure 28:
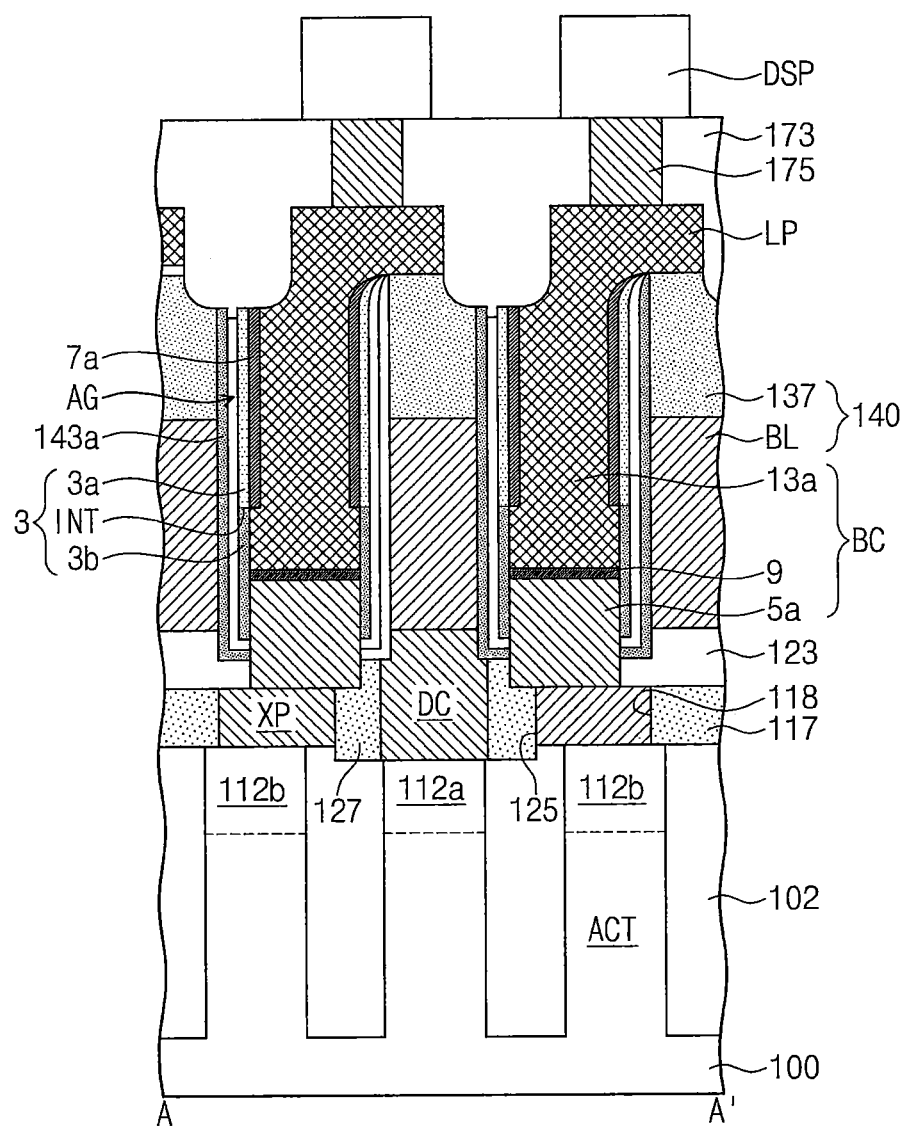
FIG. 28 is a cross-sectional view illustrating a semiconductor device according to a sixth embodiment of the inventive concepts.

FIG. 28 is a cross-sectional view illustrating a semiconductor device according to a sixth embodiment of the inventive concepts.

Referring to FIG. 28, a semiconductor device according to the present embodiment does not include the additional diffusion barrier pattern 11a. The metal-containing pattern 13a may be formed of a metal-containing material that does not need a diffusion barrier layer. For example, the metal-containing pattern 13a may be formed of an amorphous titanium nitride layer. Thus, the lateral end of the interface INT between the first and second portions 3a and 3b of the second spacer 3 may be in direct contact with the metal-containing pattern 13a. Other elements and manufacturing processes of the semiconductor device according to the present embodiment may be the same as or similar to corresponding elements and corresponding processes of the first embodiment.

The semiconductor devices according to the aforementioned embodiments may be realized as semiconductor memory devices. However, the inventive concepts are not limited thereto. Non-memory devices such as logic devices may be applied with the technical features relative to the line patterns, the contact plugs and the air gaps of the semiconductor devices according to the aforementioned embodiments of the inventive concepts.

The semiconductor devices described above may be encapsulated using various packaging techniques. For example, the semiconductor devices according to the aforementioned embodiments may be encapsulated using a package-on-package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and/or a wafer-level processed stack package (WSP) technique.

Figure 29:
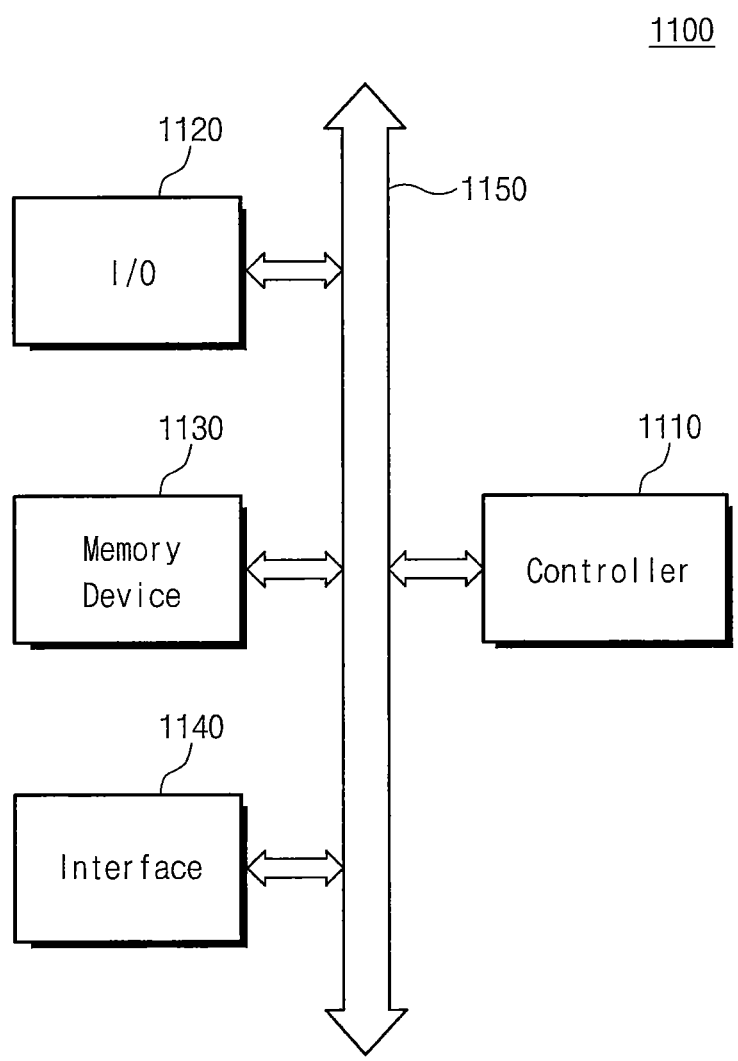
FIG. 29 is a schematic block diagram illustrating an example of electronic systems including semiconductor devices according to embodiments of the inventive concepts.

FIG. 29 is a schematic block diagram illustrating an example of electronic systems including semiconductor devices according to embodiments of the inventive concepts.

Referring to FIG. 29, an electronic system 1100 according to an embodiment of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The memory device 1130 may include at least one of the semiconductor devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless. Semiconductor devices according to embodiments of the inventive concepts may be included in Blocks 1110, 1120, 1130 and/or 1140 of FIG. 29.

Figure 30:
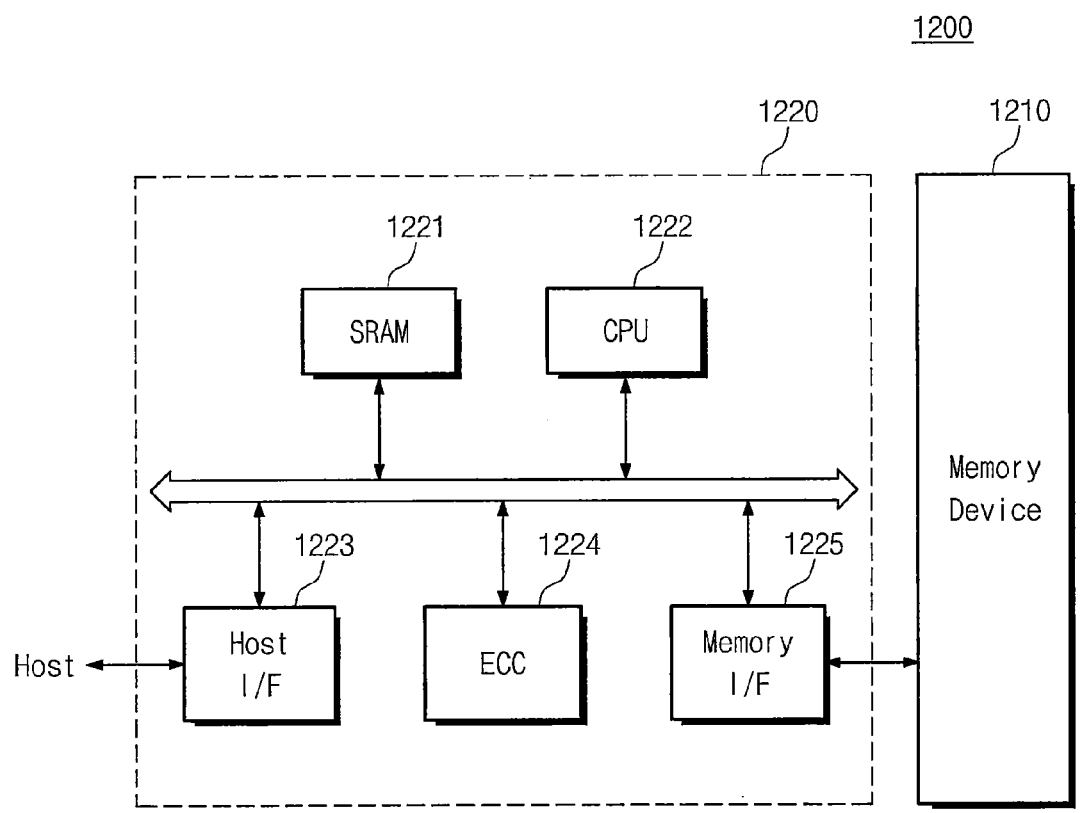
FIG. 30 is a schematic block diagram illustrating an example of memory cards including semiconductor devices according to embodiments of the inventive concepts.

FIG. 30 is a schematic block diagram illustrating an example of memory cards including semiconductor devices according to embodiments of the inventive concepts.

Referring to FIG. 30, a memory card 1200 according to an embodiment of the inventive concept may include a memory device 1210. The memory card 1200 may include at least one of the semiconductor devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

In the semiconductor device according to some embodiments of the inventive concepts, the metal silicide layer of the contact plug is spaced apart from the interface between the relatively more damaged first portion and the relatively less damaged second portion of the spacer. Thus, it is possible to prevent the metal silicide layer from being dissolved by the etchant for the removal of the sacrificial spacer through the interface. As a result, a resistance error may not occur in the contact plug such that the reliability of the semiconductor device may be improved.

Additionally, the air gap is disposed between the contact plug and the line patterns. Thus, the parasitic capacitance may be reduced to realize the highly integrated semiconductor device having excellent reliability.

Moreover, the landing pad covers the first portion of the air gap but does not cover the second portion of the air gap. Thus, the air gap may be easily formed to improve the productivity of the semiconductor device.

Furthermore, the first and second spacers may be disposed between the contact plug and the line pattern and the air gap may be disposed between the first and second spacers. The first and second spacers may protect the contact plug and the interconnection pattern from being damaged. Thus, the semiconductor device having excellent reliability may be realized.

The semiconductor device may further include the storage node pad disposed in the space confined by the gate capping insulating patterns protruding from the substrate and the lower insulating fences. A contact area of the storage node pad and the active portion of the substrate may become wider to reduce a contact resistance between the storage node pad and the substrate.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
    forming line patterns on a substrate;
    forming a sacrificial spacer and a first spacer that sequentially are on a sidewall of each of the line patterns;
    forming a poly-silicon layer in a space between line patterns;
    performing a first etching process on the poly-silicon layer to form a first-etched poly-silicon layer in the space between the line patterns and to expose a first portion of the first spacer, the first spacer further including a second portion not exposed under the first portion;
    performing a second etching process on the first-etched poly-silicon layer to form a poly-silicon pattern between the line patterns; and
    forming a metal silicide layer on a top surface of the poly-silicon pattern,
    wherein the metal silicide layer is formed to be spaced apart from an interface between the first portion and the second portion of the first spacer.

2. The method of claim 1, wherein the first etching process is an anisotropic etching process and the second etching process is an isotropic etching process, and
    wherein a sidewall of the second portion is partially exposed by the second etching process.

3. The method of claim 1, further comprising:
    forming a second spacer on the first portion before performing the second etching process.

4. The method of claim 3, wherein the second etching process is an anisotropic etching process,
    wherein the second etching process is performed using the second spacer as an etch mask, and
    wherein the poly-silicon pattern is formed on a sidewall of the second portion.

5. The method of claim 4, wherein a recess region is formed in a top surface of the poly-silicon pattern, which is not covered by the second spacer,
    the method further comprising:
    forming a third spacer on a sidewall of the second spacer and an inner sidewall of the recess region before the formation of the metal silicide layer.

6. The method of claim 5, further comprising:
    removing the third spacer after the formation of the metal silicide layer.

7. The method of claim 1, further comprising:
    forming a second spacer on the sidewall of each of the line patterns before the formation of the sacrificial spacer.

8. The method of claim 1, wherein a height difference between the interface and a top surface of the metal silicide layer is in the range of about 50 Å to about 500 Å.

9. The method of claim 1, further comprising:
    forming a metal-containing layer in the space between the line patterns; and
    removing the sacrificial spacer to form an air gap.

10. The method of claim 9, wherein the metal-containing layer is formed on the line patterns,
    the method further comprising:
    etching the metal-containing layer to form a landing pad and to expose a top end of the sacrificial spacer before removing the sacrificial spacer.

11. The method of claim 10, wherein each of the line patterns includes an interconnection pattern and a hardmask pattern which are sequentially stacked,
    wherein a height difference between a top surface of the hardmask pattern and a top surface of the first spacer is in the range of about 0 Å to about 500 Å.

12. A method of manufacturing a semiconductor device, the method comprising:
    forming a region on a substrate, the region including a sidewall;
    forming a first spacer extending on the sidewall, the first spacer including a sacrificial layer having a first end adjacent the substrate and a second end remote from the substrate;
    forming a contact on the first spacer, the contact having a first end adjacent the substrate and a second end that is between the first and second ends of the first spacer;
    forming a second spacer extending on the first spacer, the second spacer having a second end that is adjacent the second end of the first spacer and a first end that is adjacent the second end of the contact;
    recessing the second end of the contact so that it is spaced farther apart from the first end of the second spacer; and
    removing the sacrificial layer to create an air gap in the first spacer, the air gap having a first end adjacent the substrate and a second end remote from the substrate.

13. The method of claim 12 wherein the following is performed between the recessing and the removing:
   forming a metal silicide layer that extends on the second end of the contact.

14. The method of claim 13 wherein the metal silicide layer is spaced apart from the air gap throughout an extent of the metal silicide layer.

* * * * *